United States Patent
Kondo et al.

(10) Patent No.: US 6,556,725 B1
(45) Date of Patent: Apr. 29, 2003

(54) DATA PROCESSING DEVICE AND DATA ORDER CONVERTING METHOD

(75) Inventors: Tetsujiro Kondo, Tokyo (JP); Akihiro Okumura, Kanagawa (JP); Hiroshi Sato, Kanagawa (JP); Tsutomu Ichikawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/566,957

(22) Filed: May 8, 2000

Related U.S. Application Data

(63) Continuation of application No. PCT/JP99/04956, filed on Sep. 10, 1999.

(30) Foreign Application Priority Data

Sep. 11, 1998 (JP) ............................................. 10-257876
Sep. 11, 1998 (JP) ............................................. 10-257878
Oct. 7, 1998 (JP) ............................................. 10-285307

(51) Int. Cl.$^7$ .............................. G06K 9/32; G06K 9/36; G09G 5/00
(52) U.S. Cl. ...................... 382/305; 382/296; 382/289; 382/239; 382/236; 348/397.1; 348/395.1
(58) Field of Search ................................ 382/305, 304, 382/232, 233, 234, 236, 248, 249, 235, 251, 255, 289, 291, 295, 296, 297, 239; 708/203; 345/555, 649, 659, 689; 348/334.1, 395.1, 397.1, 440.1

(56) References Cited

U.S. PATENT DOCUMENTS

| | | | | |
|---|---|---|---|---|
| 4,837,844 A | * | 6/1989 | Urushibata | 382/232 |
| 5,068,904 A | * | 11/1991 | Yamazaki | 382/234 |
| 5,784,331 A | * | 7/1998 | Lysinger | 365/230.06 |
| 5,856,890 A | * | 1/1999 | Hamai et al. | 360/53 |
| 5,977,996 A | | 11/1999 | Kondo | 345/516 |
| 6,026,192 A | * | 2/2000 | Maeda | 382/232 |
| 6,067,383 A | * | 5/2000 | Taniguchi et al. | 382/240 |

FOREIGN PATENT DOCUMENTS

| | | | |
|---|---|---|---|
| EP | 0 895 188 A2 | 2/1999 | G06T/3/40 |
| EP | 0 895 216 A2 | 2/1999 | G09G/1/16 |
| JP | 63-229574 | 9/1988 | G06F/15/66 |
| JP | 4-263192 | 9/1992 | G11C/11/401 |
| JP | 5-109267 | 4/1993 | G11C/11/401 |
| JP | 7-44411 | 2/1995 | G06F/11/10 |

\* cited by examiner

*Primary Examiner*—Bhavesh Mehta
*Assistant Examiner*—Yosef Kassa
(74) *Attorney, Agent, or Firm*—Bell, Boyd & Lloyd LLC

(57) ABSTRACT

A column address is decoded by each column decoder, and an arrangement of pixels to be written to a memory cell array is rotated by a rotation circuit. The rotation result is written to the memory cell array in accordance with the decoding result of the column address. Then, the column address is decoded by each column decoder to a decoding result which is different from the decoding result of the column address at the time of writing. In accordance with the decoding result, pixels stored in the memory cell array are read. The arrangement of the read pixels is rotated by the rotation circuit and then outputted. Thus, rearrangement of pixels constituting an image can be carried out quickly while avoiding any increase in the size of the device.

21 Claims, 28 Drawing Sheets

DATA PROCESSING DEVICE AND DATA ORDER CONVERTING METHOD

This application is a continuation of international application number PCT JP/99/04956, filed Sep. 10, 1999, now pending.

TECHNICAL FIELD

This invention relates to a data processing device and a data order converting method, and particularly to a data processing device and a data order converting method which enable output, in a predetermined order, of pixels inputted in a line scan order.

BACKGROUND ART

In the case where, for example, digital image data is to be transmitted (communicated) via a satellite link, the Internet or any other communication network, and in the case where digital image data is to be recorded to a recording medium such as a digital VTR (video tape recorder) or DVD (digital versatile disc), shuffling or scrambling is often performed on the image data for the purpose of noise prevention, security on the network and protection of copyright and broadcasting right. Shuffling is carried out by rearranging pixels arranged in the line scan order constituting an image.

In motion detection in conformity to the MPEG (Moving Picture Experts Group), which is a standard for image coding/decoding, block matching is carried out between a block consisting of 8×8 pixels of a current frame as a processing target and a block of pixels within a search range of a temporally preceding (past) frame or a temporally succeeding (future) frame as a reference frame for the current frame. In such case, the search range must be detected from the reference frame, which is one frame. In the case where the search range is detected from one frame, when the image is supplied in the line scan order and stored into a memory, a number of pixels equal to the number of lateral pixels of the search range must be taken out by reading a number of lines equal to the number of longitudinal pixels of the search range from the memory and then cutting the read lines in the vertical direction. Therefore, the search range is detected by converting a plurality of lines of the reference frame constituted by pixels arrayed in the horizontal order to an image constituted by pixels arrayed in the vertical order, that is by rearranging the pixels arranged in the line scan order constituting the plurality of lines of the reference frame.

Moreover, rotation of an image by 90 degrees can be carried out by converting an image constituted by pixels arrayed in the horizontal order to an image constituted by pixels arrayed in the vertical order. Therefore, it can be carried out by rearranging the pixels arranged in the line scan order constituting the image.

Such technique of rearranging pixels constituting an image is used for various types of image processing.

FIG. 1 shows the structure of an example of a conventional image rearrangement device for converting an image constituted by pixels arrayed in the horizontal order to an image constituted by pixels arrayed in the vertical order.

In FIG. 1, digital image data to be a processing target is supplied to a parallel/serial conversion circuit 301 as parallel data of every four pixels as a unit in the line scan order. The parallel/serial conversion circuit 301 converts the parallel data supplied thereto of every four pixels as a unit to serial data and sequentially supplies the serial data to line memories 302 to 305 each having a storage capacity for one line.

The line memory 302 stores pixels from the parallel/serial conversion circuit 301. The pixels stored in the line memory 302 are shifted rightward every time pixels are newly supplied from the parallel/serial conversion circuit 301. Specifically, in the case where one pixel is noted, when pixels of one line are supplied after the noted pixel is supplied to the line memory 302, the noted pixel is outputted from the line memory 302 and supplied to the subsequent line memory 303.

Also, in the line memory 303, similar to the line memory 302, the pixels supplied from the line memory 302 are delayed by one line and supplied to the subsequent line memory 304. Similarly, the pixel data is delayed by one line in the line memories 304 and 305, respectively.

Therefore, in the case where certain four consecutive lines are noted, the pixels of the same column of the four lines are outputted in parallel from the line memories 302 to 305. Thus, in the rearrangement device of FIG. 1, four lines of an image constituted by pixels arrayed in the horizonal (row or lateral) direction is converted to an image constituted by pixels arrayed in the vertical (column or longitudinal) direction.

In the conventional technique, as described above, in the case where pixels constituting an image are to be rearranged, a number of line memories corresponding to the number of lines on which pixels are to be rearranged are required. Since each of the line memories need to have a storage capacity for one line constituting the processing target image, line memories having a large storage capacity are required in the case where the processing target image is a highly fine image used for HDTV (high definition television) or the like.

Moreover, the line memory is generally made up of an SRAM (static random access memory). Since an SRAM has a chip size approximately 10 to 20 times that of a DRAM (dynamic RAM) of the same capacity, the use of SRAMs for line memories causes an increase in the chip size in realizing LSI (large scale integration) of the device.

Meanwhile, as a technique for rearranging pixels constituting an image, other than the technique of rearranging pixels using line memories as buffers as shown in FIG. 1, there is a technique of preparing a frame memory for storing an image and then scrambling or shuffling either a write address used for writing the image to the frame memory or a read address used for reading the image stored in the frame memory. As a method for scrambling the write address or read address, a memory for address conversion having a scrambled address stored therein is prepared and the write address or read address is supplied to the memory for address conversion, thereby using the address outputted from the memory for address conversion as the scrambled address.

FIG. 2 shows the structure of an example of a conventional shuffling memory device for shuffling image data by scrambling a write address or read address.

The shuffling memory device is supplied with 8-bit image data, a write pulse, a read pulse and a write enable signal WE, which are shuffling targets. The image data is supplied to an I/O (input/output) selector 201. The write pulse is supplied to a write address counter 202. The read pulse is supplied to a read address counter 203. The write enable signal WE is supplied to the I/O selector 201, a selector 205 and a RAM (random access memory) 206.

In this shuffling memory device, the image data supplied to the I/O selector 201 is written to the RAM 206. After that, in reading the image data from the RAM 206, the read address is controlled. Thus, shuffling of the image is performed.

Specifically, at the time of writing the image data, the write enable signal WE is set at H-level indicating writing, of H (high)-level and L (low)-level, and is supplied to the I/O selector 201, selector 205 and RAM 206. On receiving the write enable signal WE of H-level, the I/O selector 201 selects image data to be a shuffling target and supplies the selected image data to an input/output terminal (I/O) of the RAM 206.

When the write enable signal WE is set at H-level, the write pulse starts to be supplied to the write address counter 202. In accordance with the write pulse, the write address counter 202 makes increment on the 8-bit count value by one. The 8-bit count value is outputted as a write address to the selector 205.

When receiving the write enable signal WE of H-level, the selector 205 selects the output from the write address counter 202 and supplies it to an address terminal (Address) of the RAM 206. Therefore, in this case, the write address outputted from the write address counter 202 is supplied to the RAM 206 via the selector 205.

In accordance with the write address supplied via the selector 205, the RAM 206 stores the image data supplied via the I/O selector 201. Thus, for example, in the case where the write address counter 202 generates a write address in accordance with the so-called line scan order, the RAM 206 stores the image data in the line scan order.

At the time of reading the image data thus stored in the RAM 206, the write enable signal WE is set at L-level indicating reading and is then sent to the I/O selector 201, selector 205 and RAM 206. On receiving the write enable signal WE of L-level, the I/O selector 201 selects the input/output terminal of the RAM 206.

When the write enable signal WE is set at L-level, the read pulse starts to be supplied to the read address counter 203. Similarly to the write address counter 202, the read address counter 203 makes increment on the 8-bit count value by one in accordance with the read pulse. The 8-bit count value is outputted as a read address to a RAM for address conversion 204.

The read address counter 203 outputs the read address which is the same as the write address outputted from the write address counter 202. Therefore, if this read address is supplied as it is to the RAM 206, the image data is read from the RAM 206 in the same order as in the case of writing to the RAM 206, that is, in the line scan order.

On receiving the read address from the read address counter 203, the address conversion RAM 204 outputs the 8-bit value stored at the address corresponding to the read address and thus converts the read address. Specifically, in the case where the read address which is the same as the write address is supplied from the read address counter 203, the address conversion RAM 204 converts the read address supplied from the read address counter 203 to a read address which is different from the write address. The read address after conversion outputted from the address conversion RAM 204 is supplied to the selector 205.

When receiving the write enable signal WE of L-level, the selector 205 selects the output from the address conversion RAM 204 and supplies the selected output to the address terminal of the RAM 206. Therefore, in this case, the read address after conversion outputted from the address conversion RAM 204 is supplied to the RAM 206 via the selector 205.

In accordance with the read address after conversion supplied via the selector 205, the RAM 206 reads the image data stored at the corresponding address. Since the read address after conversion is different from the write address, as described above, the image data is shuffled by reading the image data from the RAM 206 in accordance with the read address after conversion. This shuffled image data (hereinafter suitably referred to as shuffled data) is outputted to the I/O selector 201.

Since the I/O selector 201 selects the output of the RAM 206 as described above, the shuffled data read out from the RAM 206 is outputted via the I/O selector 201.

It should be noted that the address conversion RAM 204 can also be made up of a ROM (read-only memory) instead of a RAM.

In the case where the technique of preparing a frame memory for storing an image and then scrambling or shuffling either the write address used for writing the image to the frame memory or the read address used for reading the image stored in the frame memory is employed to rearrange the pixels constituting the image, and where the technique of preparing an address conversion memory having an scrambled address stored therein and then supplying the write address or read address to the address conversion memory so as to generate the scrambled address is employed as the method for scrambling the write address or read address, as described above, the time for accessing the address conversion memory is required in addition to the time for accessing the frame memory. Therefore, the processing is delayed.

Specifically, in the conventional shuffling memory device shown in FIG. 2, the address conversion RAM 204 for converting the read address to a read address which is different from the write address is necessary in addition to the RAM 206 as a buffer for temporarily storing image data. Therefore, the processing requires a longer time by the amount equal to the time for converting the read address in the address conversion RAM 204, that is, the time for accessing the address conversion RAM 204. Accordingly, the processing might result in breakdown in the case where an image is to be shuffled in real time.

As a method for reducing the time required for shuffling, a high-speed memory may be used for the RAM 206. For example, a synchronous DRAM (dynamic RAM) is known as a high-speed memory.

However, if a high-speed synchronous DRAM is used for reducing the time required for shuffling, reading/writing of data can only be carried out serially. Therefore, in the case where a synchronous DRAM is used in place of the RAM 206 of FIG. 2, it is necessary to shuffle the data to be serially written on the stage preceding the synchronous DRAM and then write the data to the synchronous DRAM. Accordingly, a buffer for temporarily storing the data is necessary on the stage preceding the synchronous DRAM. That is, while the RAM 206 in FIG. 2 is provided for shuffling the data, the use of the synchronous DRAM in place of the RAM 206 requires the buffer on the preceding stage, which is wasteful and therefore not preferred.

FIG. 3 shows an exemplary structure in the case where a DRAM chip is used for the shuffling memory device. In FIG. 3, a DRAM chip is shown in which data reading and writing are carried out at separate timings.

The DRAM chip shown in FIG. 3 is supplied with a row address and a column address as addresses for specifying a memory cell, a RAS (row address strobe) signal synchronized with the input timing of the row address, a CAS (column address strobe) signal synchronized with the input timing of the column address, voltages VDD and Vss used as a power source, and a write enable signal WE indicating which of reading and writing is to be carried out. In the example of FIG. 3, the write enable signal WE is set at H-level in carrying out writing.

The RAS signal is supplied to a buffer 1R. In synchronization with the RAS signal, the buffer 1R outputs a synchronizing signal for latching a part of the address supplied to the DRAM chip as the row address, to a row address latch circuit 2R. In addition, the buffer 1R generates an EQYE signal based on the RAS signal and supplies the EQYE signal to one input terminal of an AND gate 9. That is, the RAS signal has a nature of a so-called chip enable signal, and on the basis of the chip enable signal, the buffer 1R generates the EQYE signal which is at H (high)-level when the DRAM chip is inactive and which is at L (low)-level when the DRAM chip is active.

The CAS signal is supplies to a buffer 1C. In synchronization with the CAS signal, the buffer 1C outputs a synchronizing signal for latching a part of the address supplied to the DRAM chip as the column address, to a column address latch circuit 2C. In addition, the buffer 1C generates a Dout control signal based on the CAS signal and supplies the Dout control signal to an output buffer 11. That is, the CAS signal has a nature of a so-called output enable signal, and on the basis of the output enable signal, the buffer 1C generates the Dout control signal for controlling the latch of data in the output buffer 11.

The row address latch circuit 2R latches a part of the address supplied to the DRAM chip as the row address in synchronization with the synchronizing signal from the buffer 1R, and supplies the row address to a row decoder 3R. On completion of the latch of the row address, the row address latch circuit 2R supplies a latch completion signal LCH indicating the completion to the column address latch circuit 2C.

The column address latch circuit 2C latches a part of the address supplied to the DRAM chip as the column address in synchronization with the synchronizing signal from the buffer 1C and the latch completion signal LCH from the row address latch circuit 2R, and supplies the column address to a column decoder 3C and an ATD (address transit detector) circuit 8.

The row decoder 3R decodes the row address from the row address latch circuit 2R and controls a row driver 4R on the basis of the decoding result. The column decoder 3C decodes the column address from the column address latch circuit 2C and controls a column driver 4C on the basis of the decoding result.

Under the control of the row decoder 3R, the row driver 4R drives a word line WL arranged in the row direction in a memory cell array 5 and thus designates a memory cell (storage unit) of the target row for reading/writing data.

Under the control of the column decoder 3C, the column driver 4C controls a column switch $7_i$, thereby connecting a bit line BL arranged in the column direction in the memory cell array 5 to a data bus D and connecting a bit line !BL to a data bus 'D via an SA (sense amplifier) $6_i$. Thus, data reading from/writing to the memory cell is made possible.

In the drawings such as FIG. 3, "BL" with an upper line () represents an inversion signal of each "BL" without an upper line (). In this specification, however, "BL" with "!" added thereto, that is, "!BL", is used as a symbol representing "BL" with an upper line () in the respective drawings.

The memory cell array 5 is constituted by a plurality of memory cells arrayed in the row direction and in the column direction. Specifically, the memory cell array 5 is constituted by, for example, arranging N memory cells in the row direction and M memory cells in the column direction. The memory cell array 5 also has M word lines WL in the row direction and N (sets of) bit lines BL and !BL in the column direction. The word lines WL are connected to the row driver 4R. The bit lines BL are connected to the data bus D via the column switch $7_i$ set in the conductive state by the column driver 4C. The bit lines !BL are connected to the data bus !D via the column switch $7_i$ set in the conductive state by the column driver 4C.

The position of each memory cell in the row direction is specified by the row address, and the position in the column direction is specified by the column address. That is, memory cells corresponding to points of intersection between the word line WL driven by the row driver 4R and the bit lines BL and !BL connected to the data buses D and !D by the column driver 4C are used as targets of data reading/writing.

A sense amplifier group 6 includes SAs $6_1$ to $6_N$ of the same number as the number of memory cells (number of memory cell columns) arrayed in the row direction of the memory cell array 5. The SA $6_i$ (i=1, 2, ..., N) amplifies and latches the data read from the memory cell as the reading target, and outputs the data to the data buses D and !D via the column switch $7_i$ set in the conductive state by the column driver 4C.

The number of column switches $7_i$ (i=1, 2, ..., N) is the same as the number of SAs $6_i$, and the ON/OFF-state of these column switches is controlled by the column driver 4C. Specifically, the ON/OFF-state of the column switch $7_i$ is controlled by a driving signal outputted from the column driver 4C on the basis of the decoding result of the column address in the column decoder 3C. When the column switch $7_i$ is in the ON-state, it electrically connects the bit line BL connected to the sense amplifier $6_i$ to the data bus D, and electrically connects the bit line !BL connected to the sense amplifier 6i to the data bus !D. Thus, the memory cells on the bit lines BL and !BL are set in a state such that reading/writing of data is possible.

In the DRAM chip of FIG. 3, N sense amplifiers $6_1$ to $6_N$ and N column switches $7_1$ to $7_N$ are actually provided. However, to avoid complication of the drawing, only one SA $6_i$ and one column switch $7_i$ are shown in FIG. 3.

The ATD (address transient detector) circuit 8 generates an ATD signal which is at H-level during the transition (switching) of the column address and which is at L-level otherwise, on the basis of the output from the column address latch circuit 2C, and supplies the ATD signal to the other input terminal of the AND gate 9.

The AND gate 9 calculates AND of the EQYE signal from the buffer 1R and the ATD signal from the ATD circuit 8, and supplies a short signal CY for generating a short circuit of the data buses D and !D to the column driver 4C.

As described above, the EQYE signal is at H-level only when the DRAM chip is inactive, and the ATD signal is at H-level only at the time of transition of the column address. Therefore, the short signal CY is at H-level only when the DRAM chip is inactive and at the time of transition of the column address. Otherwise, the short signal CY is at L-level otherwise. The column driver 4C generates a short circuit of the data buses D and !D when the short signal CY is at H-level, thereby erasing the data on the data buses D and !D. By doing so, it is possible to realize high-speed data reading/writing with respect to the memory cell array 5.

A main amplifier (MA) 10 is connected to the data buses D and !D. It amplifies data which is read from the memory cell array 5 and outputted on the data buses D and !D, and supplies the amplified data to the output buffer 11. The output buffer 11 latches the parallel data from the MA 10 in accordance with the Dout control signal from the buffer 1C, and outputs the latched data as serial data from an output terminal Dout.

An input buffer 12 is connected to an input terminal Din. It latches serial data as a writing target, inputted from the input terminal Din, and supplies the latched data as parallel data to a recording amplifier 13. The recording amplifier 13 amplifies the data from the input buffer 12 and outputs the amplified data onto the data buses D and !D.

The operation of the DRAM chip shown in FIG. 3 is as follows.

An address for specifying a memory cell for reading/writing data, a RAS signal and a CAS signal are entered to the DRAM chip shown in FIG. 3. The address is supplied to the row address latch circuit 2R and the column address latch circuit 2C. The RAS signal is supplied to the buffer 1R and the CAS signal is supplied to the buffer 1C.

The buffer 1R generates a synchronizing signal based on the RAS signal and supplies the synchronizing signal to the row address latch circuit 2R. The buffer 1C generates a synchronizing signal based on the CAS signal and supplies the synchronizing signal to the column address latch circuit 2C. The row address latch circuit 2R latches the address supplied thereto as a row address synchronously with the synchronizing signal from the buffer 1R, and outputs the latched address to the row decoder 3R. The column address latch circuit 2C latches the address supplied thereto as a column address synchronously with the synchronizing signal from the buffer 1C, and supplies the latched address to the column decoder 3C and the ATD circuit 8.

The column address supplied to the ATD circuit 8 is caused to be an ATD signal as described above and then passed through the AND gate 9, thereby providing a short signal CY. This short signal CY is provided as a signal which indicates the timing for forming a short circuit of the data buses D and !D to the column driver 4C, as described above.

At the time of data reading, data is read from the memory cell specified by the row address supplied from the row decoder 3R and the column address from the column decoder 3C in the above-described manner, and the data is outputted onto the data buses D and !D. However, the inversion data of the data read from the memory cell is outputted onto the data bus !D.

The data outputted on the data buses D and !D are amplified by the MA 10 and supplied to the output buffer 11. The output buffer 11 is also supplied with a Dout control signal generated by the buffer 1C, as described above. The output buffer 11 latches the data from the MA 10 in accordance with the Dout control signal and outputs the latched data from the output terminal Dout.

On the other hand, at the time of data writing, data as a writing target is entered to the input terminal Din and the writing target data is latched by the input buffer 12. The data latched by the input buffer 12 is amplified by the recording amplifier 13 and outputted onto the data buses D and !D. Then, the data on the data buses D and !D are written to the memory cell specified by the row address supplied from the row decoder 3R and the column address supplied from the column decoder 3C in the above-described manner.

In the DRAM chip shown in FIG. 3, since only one memory cell (or a memory cell group consisting of a plurality of memory cells on a certain word line) can be designated at a time by one set of the row address supplied from the row decoder 3R and the column address supplied from the column decoder 3C, as described above, data reading and writing can be carried out only at separate timing. That is, data reading and writing cannot be carried out at the same time.

In view of the foregoing status of the art, it is an object of the present invention to provide a data processing device and a data order converting method which enable high-speed rearrangement, that is, shuffling, of image data or the like while avoiding an increase in the size of the device as much as possible.

Disclosure of the Invention

A data processing device according to the present invention includes: a first decoding section for decoding a first address; a plurality of second decoding sections for decoding a second address; and a storage section having a plurality of storage units, one of which is specified by a pair consisting of a decoding result of the first decoding section and a decoding result of one of the plurality of second decoding sections. A first decoding result, which is a decoding result of one of the plurality of second decoding sections with respect to the second address, and a second decoding result, which is a decoding result of another one of the second decoding sections with respect to the second address, are different from each other.

At least one of the plurality of second decoding sections has a changeable decoding result with respect to the second address.

At least one of the plurality of second decoding sections is a content-addressable memory.

The data processing device according to the present invention also has a write control section for writing data to a storage unit of the storage section specified in accordance with the first decoding result, and a read control section for reading data from a storage unit of the storage section specified in accordance with the second decoding result.

The data processing device according to the present invention further includes a first switching section for switching the order of the data of the first unit, and a second switching section for switching the order of the data of the second unit. The write control section writes the data outputted from the first switching section to the storage section on the basis of the first decoding result, and the read control section reads the data stored in the storage section on the basis of the second decoding result and supplies the data to the second switching section.

The first switching section switches the order of the data of the first unit by rotating the data of the first unit, and the second switching section switches the order of the second unit by rotating the data of the second unit.

The first unit and the second unit are equal to each other.

The first switching section and the second switching section have opposite rotating directions.

The data of the first unit is supplied to the first switching section as parallel data, and the data of the second unit is supplied from the second switching section as parallel data.

The data is image data.

The first address is a vertical address and the second address is a horizontal address.

The first decoding section, the second decoding section and the storage section are provided within one semiconductor chip.

The plurality of second decoding sections are operable at the same time.

Also, in the data processing device according to the present invention, each of the plurality of the second decoding sections includes a plurality of decoders, and the plurality of decoders output the decoding result when a preset address and the second address coincide with each other.

A data order converting method according to the present invention includes: a first change step of sequentially changing the order of a plurality of data supplied every first unit; a first decoding step of decoding a first address which is changed every time the order of the plurality of data of every first unit is changed; a write step of writing the data to a storage position in a storage section determined on the basis of a decoding result of the first address; a second decoding step of decoding a second address; a read step of reading the data every second unit from a storage position in the storage section determined on the basis of a decoding result of the second address; and a second change step of changing the order of the data of every second unit read from the storage section every time the second address is decoded.

The first change step includes switching of the order of the data of the first unit by rotating the data of the first unit, and the second change step includes switching of the data of the second unit by rotating the data of the second unit.

The first unit and the second unit are equal to each other.

The first change step and the second change step have opposite rotating directions.

Also, in the data order converting method according to the present invention, at the first change step, the data of the first unit is supplied as parallel data, and at the second change step, the data of the second unit is outputted as parallel data.

The data is image data.

The first address is a vertical address and the second address is a horizontal address.

BEST MODE FOR CARRYING OUT THE INVENTION

Preferred embodiments of the present invention will now be described with reference to the drawings.

Figure 3:
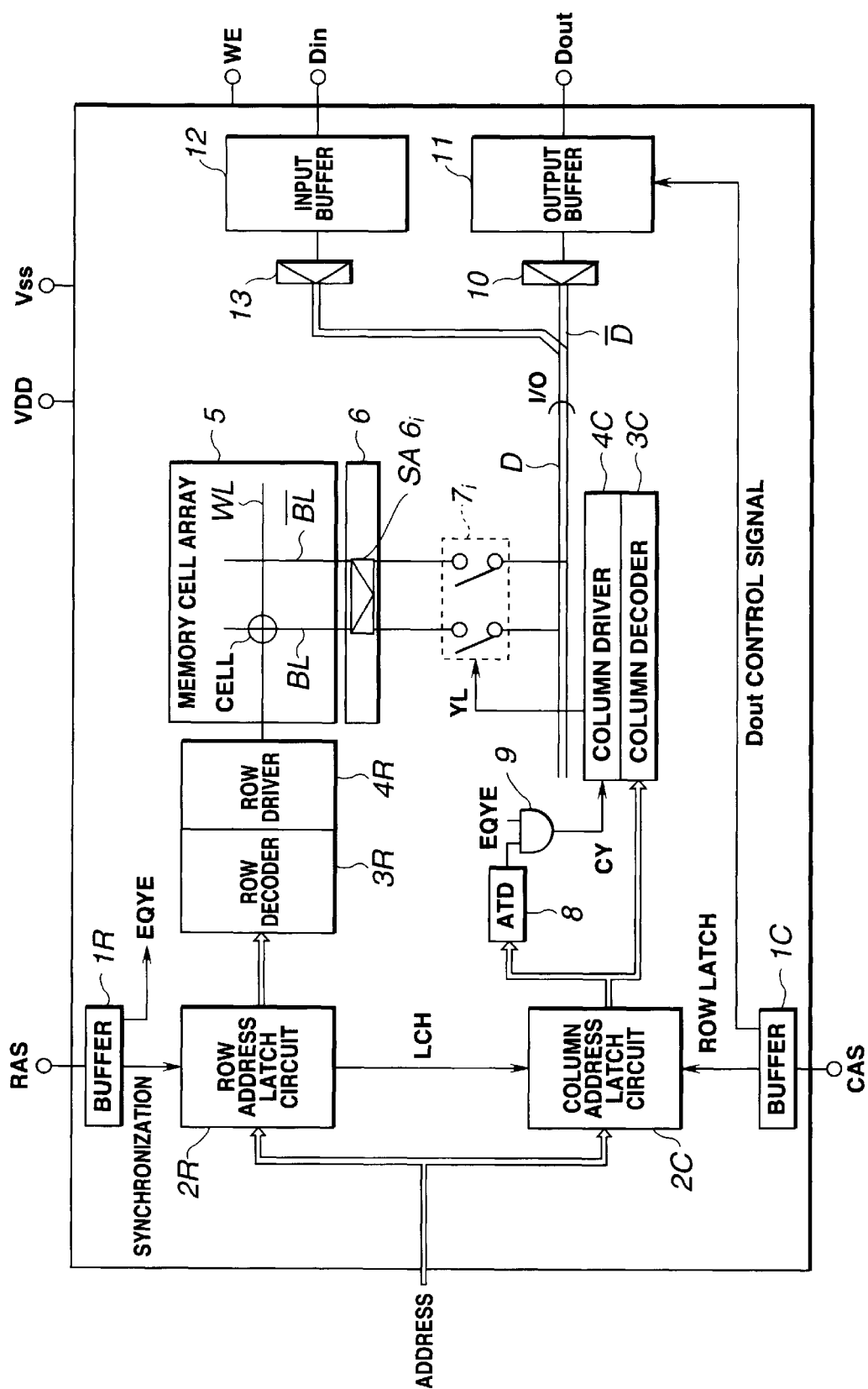
FIG. 3 is a block diagram showing an exemplary structure of a DRAM chip in which data reading and writing are carried out at separate timing.
Figure 4:
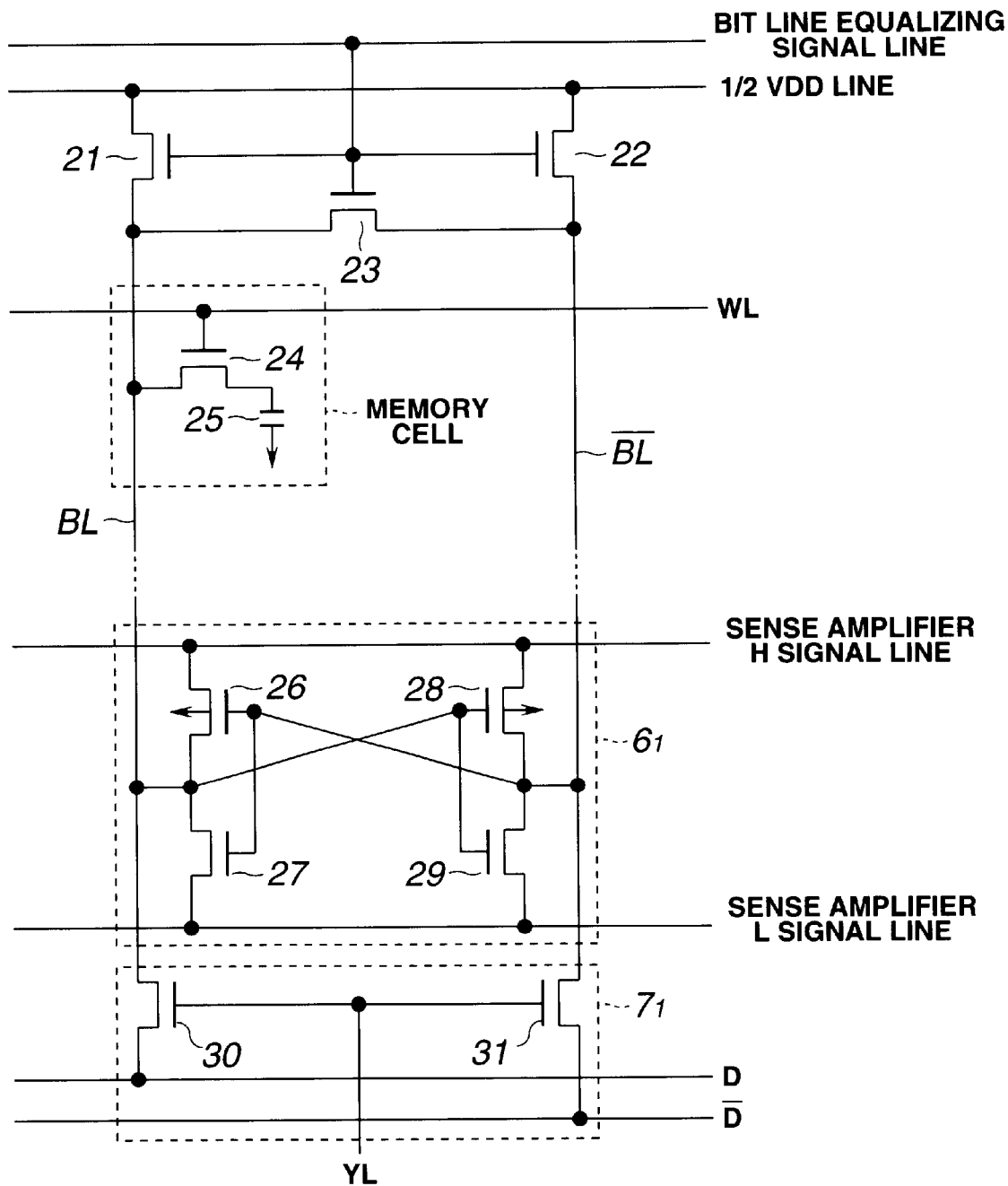
FIG. 4 is a circuit diagram showing an exemplary structure of a memory cell array 5, an SA $6_i$ and a column switch $7_i$.

FIG. 4 shows an exemplary structure which is applicable to a memory cell array 5, an SA $6_i$ and a column switch $7_i$ of a DRAM chip as shown in FIG. 3.

A bit line equalizing signal line is supplied with a bit line equalizing signal, which is set at L (low)-level when carrying out reading/writing of data from/to the memory cell array 5 and otherwise set at H-level. This bit line equalizing signal line is connected with the gates of FETs (N-channel field-effect transistors) 21 to 23. The drain of the FET 21 is connected to a 1/2 VDD line, which is supplied with a 1/2-voltage of a voltage VDD. The source of the FET 21 is connected to the drain of the FET 23. The drain of the FET 22 is connected to the 1/2 VDD line, which is supplied with a 1/2-voltage of a voltage VDD. The source of the FET 22 is connected to the source of the FET 23. The connection point between the source of the FET 21 and the drain of the FET 23 is connected to one end of a bit line BL. The connection point between the source of the FET 22 and the source of the FET 23 is connected to one end of a bit line !BL.

The bit line equalizing signal line and the 1/2 VDD line are laid out in the row direction in the memory cell array 5. As for the circuit consisting of the three FETs 21 to 23, the same number of circuits as the number of memory cells in the row direction constituting the memory cell array 5 are provided.

The bit line BL is further connected with the drain of an FET (N-channel FET) 24. The source of the FET 24 is connected to the other end of a capacitor 25, which has its one end grounded. The gate of the FET 24 is connected to a word line WL. These FET 24 and capacitor 25 constitute one memory cell. In the memory cell array 5, M units of such memory cells are provided in the column direction and N units of such memory cells are provided in the row direction. The memory cell constituted by the FET 24 and the capacitor 25 has a structure similar to that of a typical DRAM memory cell.

The bit line BL is also connected with the drain of an FET (P-channel FET) 26. The connection point between the bit line BL and the drain of the FET 26 is connected to the drain of an FET (N-channel FET) 27 and the gate of an FET (P-channel FET) 28. The gate of the FET 27 is connected to the gate of the FET 26.

The drain of the FET 28 is connected to the bit line !BL, the drain of an FET (N-channel FET) 29, and the connection point between the gate of the FET 26 and the gate of the FET 27. Moreover, the gates of the FETs 28 and 29 are connected to each other, and the connection point between these gates is connected to the connection point between the drains of the FETs 26 and 27. The sources of the FETs 26 and 28 are connected to a sense amplifier H signal line, and the sources of the FETs 27 and 29 are connected to a sense amplifier L signal line.

The above-described FETs 26 to 29 constitute one SA $6_i$. The SAs $6_i$ thus constituted of the same number as the number of memory cells in the row direction constituting the memory cell array 5 are provided.

The sense amplifier H signal line and the sense amplifier L signal line are laid out in parallel to the row direction in the memory cell array 5. The sense amplifier H signa line and the sense amplifier L signal line are supplied with a sense amplifier H signal of H-level and a sense amplifier L signal of L-level for driving the SA $6_i$, respectively.

The other end of the bit line BL is connected with the drain of an FET (N-channel FET) 30, and the other end of the bit line !BL is connected with the drain of an FET (N-channel FET) 31. The source of the FET 30 is connected to a data bus D. The source of the FET 31 is connected to a data bus !D. The gates of the FETs 30 and 31 are connected to each other, and its connection point is connected to a column decoding line YL.

The foregoing FETs 30 and 31 constitute one column switch $7_i$. The column switches $7_i$ thus constituted of the same number as the number of memory cells in the row direction constituting the memory cell array 5 are provided.

The column decoding line YL is driven by a column driver 4C. When H-level is applied from the column driver 4C to the gates of the FETs 30 and 31 as the column switch $7_i$, the FETs 30 and 31 are turned on, and an electric connection state is formed between the bit lines BL, !BL and the data buses D, !D. On the other hand, when L-level is applied from the column driver 4C, the FETs 30 and 31 are turned off, and an electrically non-conductive state is formed between the bit lines BL, !BL and the data buses D, !D.

Referring to the timing charts of FIGS. 5A to 5I, the operation of the memory cell array 5, SA $6_i$ and column $7_i$ of FIG. 4 will now be described. In this description, it is assumed that data reading/writing is carried out with respect to the memory cell constituted by the FET 24 and the capacitor 25 of FIG. 4.

At the time of data reading and at the time of data writing, the bit line equalizing signal line is switched from H-level to L-level, as shown in FIG. 5A. Thus, the FETs 21 to 23 are turned from ON-state to OFF-state and the bit lines BL and !BL are electrically separated from the 1/2 VDD line which supplies a 1/2-voltage of the voltage VDD.

After that, when the row address of the memory cell constituted by the FET 24 and the capacitor 25 is supplied to a row decoder 3R, the row decoder 3R decodes the row address and then switches the word line WL of the decoded row of the memory cell constituted by the FET 24 and the capacitor 25, that is, one of the word lines WL connected to the gate of the FET 24, from L-level to H-level, as shown in FIG. 5B, in accordance with the decoding result. Thus, the FET 24 is turned from OFF-state to ON-state and the capacitor 25 connected to the source of the FET 24 is electrically connected to the bit line BL.

Moreover, the sense amplifier H signal is switched from L-level to H-level, as shown in FIG. 5C, and the sense amplifier L signal is switched from H-level to L-level, as shown in FIG. 5D, at the same timing as the switching of the sense amplifier H signal. Thus, the SA $6_i$ is set in the operating state.

The SA $6_i$, when in the operating state, differentially amplifies to latch the voltage of the capacitor 25 appearing on the bit line BL. As a result, the voltage of the bit line BL is switched from VDD/2 to one of H-level and L-level, and the voltage of the bit line !BL is switched from VDD/2 to the other of H-level and L-level, as shown in FIG. 5E.

Specifically, when the bit line equalizing signal is at H-level, the FETs 21 to 23 are in ON-state and therefore the electric potentials of the bit lines BL and !BL are equal to the voltage VDD/2 on the 1/2 VDD line. When the bit line equalizing signal is switched from H-level to L-level, the FETs 21 to 23 are switched from ON-state to OFF-state and the bit lines BL and !BL are separated from the 1/2 VDD line. However, the electric potentials of the bit lines BL and !BL are held at the electric potential of VDD/2 for the time being because of the capacitance of the bit lines BL and !BL. When the word line WL is switched from L-level to H-level, the bit line BL is connected to the capacitor 25, and the electric potential of the bit line BL changes by the amount of electric charges charged to the capacitor 25 from the voltage VDD/2. When the SA $6_i$ is set in the operating state, the amount of change in the electric potential of the bit line BL is differentially amplified by the SA $6_i$. That is, the SA $6_i$ differentially amplifies the voltage of the capacitor 25 using the voltage VDD/2 as a reference voltage.

After that, when the column address of the memory cell constituted by the FET 24 and the capacitor 25 is supplied to a column decoder 3C, the column decoder 3C decodes the column address, and in accordance with the decoding result (in this case, the column address is assumed to be i), controls the column driver 4C to switch the column switch $7_i$ of the column of the memory cell constituted by the FET 24 and the capacitor 25 from OFF-state to ON-state, as shown in FIG. 5F. In accordance with this control, the column driver 4C switches the column decoding line YL connected to the column switch $7_i$ from L-level to H-level, as shown in FIG. 5G.

The H-level on the column decoding line YL is applied to gates of the FETs 30 and 31 as the column switch $7_i$. Thus, the FETs 30 and 31 are switched from OFF-state to ON-state. The bit line BL is electrically connected to the data bus D and the bit line !BL is electrically connected to the data bus !D.

In data reading, as the bit line BL and the data bus D are connected and the bit line !BL and the data bus !D are connected as described above, the voltage of the capacitor 25 differentially amplified by the SA $6_i$, that is, the data stored in the memory cell constituted by the FET 24 and the capacitor 25, is outputted onto the data buses D and !D, as shown in FIG. 5H. In short, the data stored in the memory cell is outputted on the data bus D and an inversion value of the data stored in the memory cell is outputted on data bus !D.

On the other hand, in writing, after the bit line BL and the data bus D are connected and the bit line !BL and the data bus !D are connected as described above, the data as a writing target is outputted on the data bus D, as shown in FIG. 5I. Then, electric charges corresponding to the writing target data are charged to the capacitor 25 via the bit line BL and the FET 24, thereby storing the writing target data to the memory cell constituted by the FET 24 and the capacitor 25.

Figure 6:
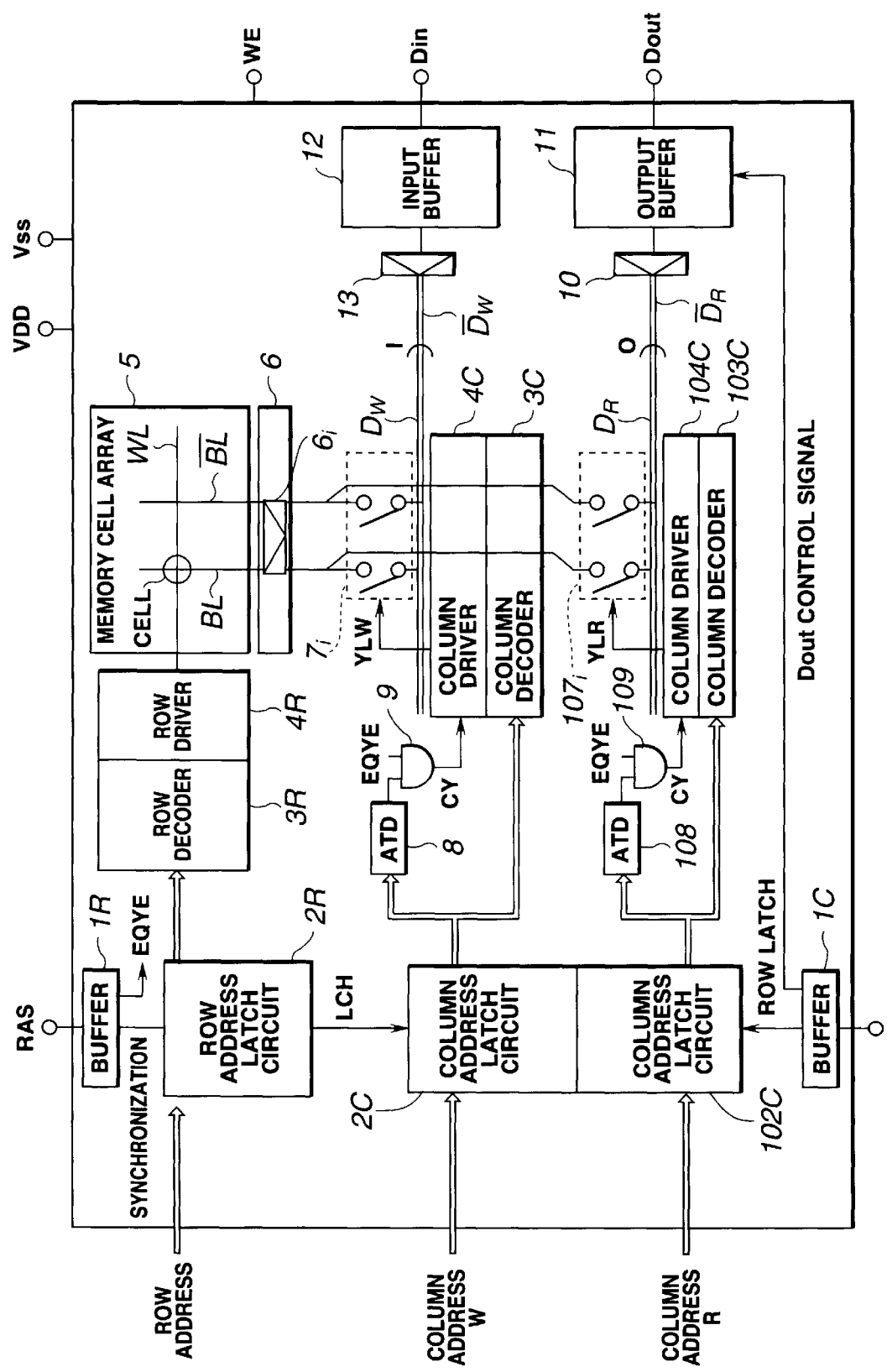
FIG. 6 is a block diagram showing an exemplary structure of a DRAM chip related to the present invention which is capable of carrying out data reading and writing at the same time.

FIG. 6 shows an exemplary structure of an embodiment of a DRAM chip related to the present invention which is capable of carrying out data writing and reading at the same time. In FIG. 6, parts corresponding to those of FIG. 3 are denoted by the same numerals and symbols and will not be described further in detail. The DRAM chip shown in FIG. 6 is disclosed in the Japanese Patent Application No. Hei 10-242773 which is not laid open at the time of filing of the priority Japanese application of the present application, and the corresponding U.S. application.

In the DRAM chip of FIG. 6, a column address latch circuit 102C, a column decoder 103C, a column driver 104C, a column switch $107_i$, an ATD circuit 108, and an AND gate 109 are provided in parallel to a column address latch circuit 2C, a column decoder 3C, a column driver 4C, a column switch $107_i$, an ATD circuit 8, and an AND gate 9. The column address latch circuit 102C, the column decoder 103C, the column driver 104C, the column switch $107_i$, the ATD circuit 108, and the AND gate 109 are constituted similarly to the column address latch circuit 2C, the column decoder 3C, the column driver 4C, the column switch $7_i$, the ATD circuit 8, and the AND gate 9, respectively.

Therefore, in the embodiment of FIG. 6, two column address latch circuits, column decoders, column drivers, column switches, ATD circuits and AND gates are provided, respectively. Accordingly, data buses $D_R$ and $!D_R$ connected to the column switch $107_i$ are provided in addition to data buses $D_W$ and $!D_W$ connected to the column switch $7_i$.

The data buses $D_W$ and $!D_W$ of FIG. 6 correspond to the data buses D and !D of FIG. 3. However, they are described as the data buses $D_W$ and $!D_W$ in order to distinguish them from the data buses $D_R$ and $!D_R$.

In the DRAM chip of FIG. 6, by using the column address latch circuit 2C, the column decoder 3C, the column driver 4C, the column switch $7_i$, the ATD circuit 8, and the AND gate 9 for data writing, and by using the column address latch circuit 102C, the column decoder 103C, the column driver 104C, the column switch $107_i$, the ATD circuit 108, and the AND gate 109 for data reading, data reading and writing can be carried out at the same time with respect to memory cells of different columns of one row (or one memory cell group consisting of a plurality of memory cells of one row and another memory cell group).

Specifically, the row address of the row of memory cells where data reading and writing are carried out at the same time is supplied to the row address latch circuit 2R, where the row address is latched. The row address latched by the row address latch circuit 2R is supplied to the row decoder 3R.

The column address W of the column of the memory cell where data writing is carried out is supplied to the column address latch circuit 2C, where the column address W is latched synchronously with a synchronizing signal from the buffer 1C and a latch completion signal LCH from the row address latch circuit 2R. Moreover, the row address R of the row of the memory cell where data reading is carried out is supplied to the column address latch circuit 102C, where the column address R is latched synchronously with the synchronizing signal from the buffer 1C and the latch completion signal from the row address latch circuit 2R. The column address W latched by the column address latch circuit 2C is supplied to the column decoder 3C, and the column address R latched by the column address latch circuit 102C is supplied to the column decoder 103C.

The column address W latched by the column address latch circuit 2C is also supplied to the ATD circuit 8 and supplied as a signal indicating the timing for forming a short circuit of the data buses $D_W$ and $!D_W$, to the column driver 4C, similarly to the case of FIG. 3. Similarly, the column address R latched by the column address latch circuit 102C is also supplied to the ATD circuit 108 and supplied as a signal indicating the timing for forming a short circuit of the data buses $D_R$ and $!D_R$ to the column driver 104C.

Meanwhile, the writing target data is entered to the input terminal Din and is latched by the input buffer 12. The data latched by the input buffer 12 is amplified by the recording amplifier 13 and outputted onto the data buses $D_W$ and $!D_W$. The data on the data buses $D_W$ and $!D_W$ are written to the memory cell specified by the row address supplied from the row decoder 3R and the column address W supplied from the column decoder 3C, in the manner described with reference to FIG. 5.

Figure 5:
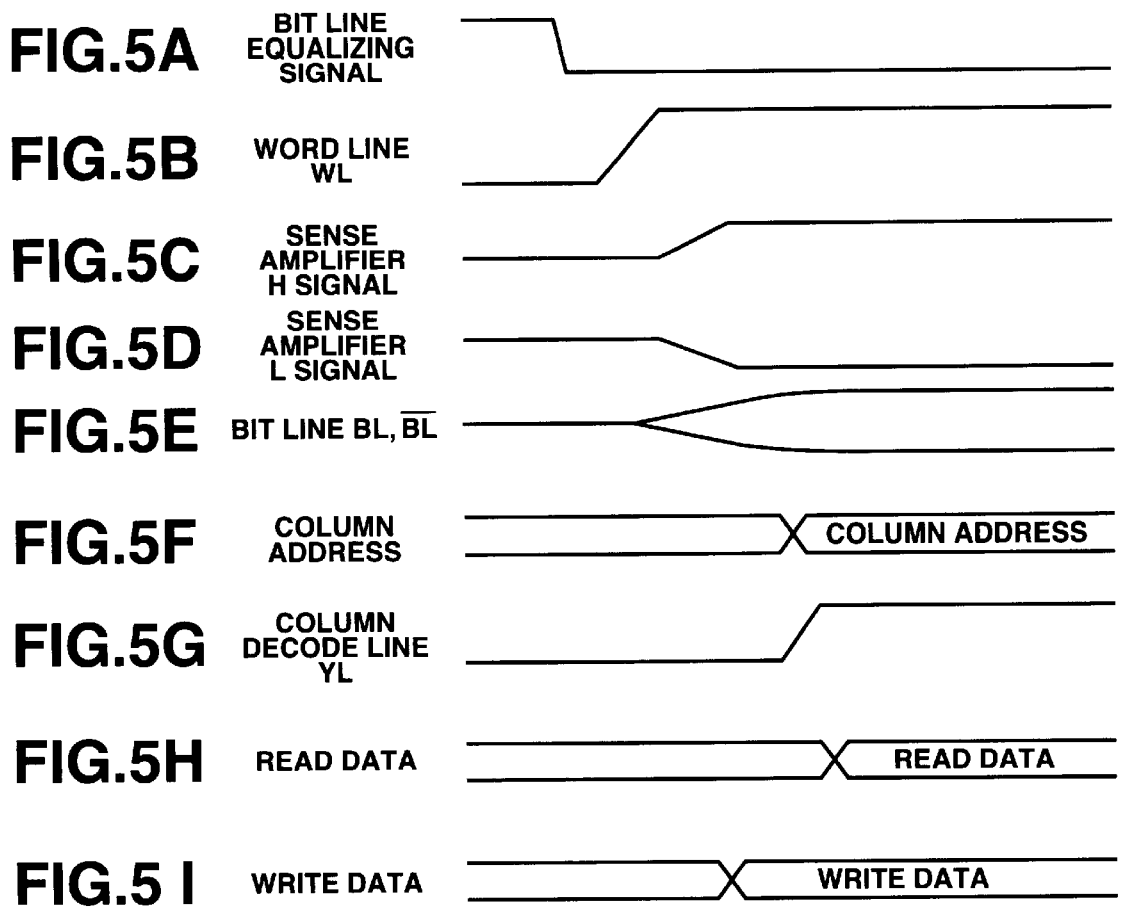
FIGS. 5A to 5I are timing charts for explaining the operation of the memory cell array 5, the SA $6_i$ and the column switch $7_i$ of the structure of FIG. 4.

From the memory cell specified by the row address supplied from the row decoder 3R and the column address R supplied from the column decoder 103C, the data is read and outputted onto the data buses $D_R$ and $!D_R$, similarly to the case of FIG. 5. However, the inversion data of the data read from the memory cell is outputted on the data bus $!D_R$.

The data outputted on the data buses $D_R$ and $!D_R$ are amplified by the MA 10 and supplied to the output buffer 11. The output buffer 11 is supplied with a Dout control signal generated by the buffer 1C. The output buffer 11 latches the data from the MA 10 in accordance with the Dout control signal and outputs the latched data from the output terminal Dout.

In the structure of FIG. 6, data writing to a memory cell specified by a row address and the column address W and data reading from a memory cell specified by the row address and the other column address R are carried out simultaneously in the above-described manner.

Figure 7:
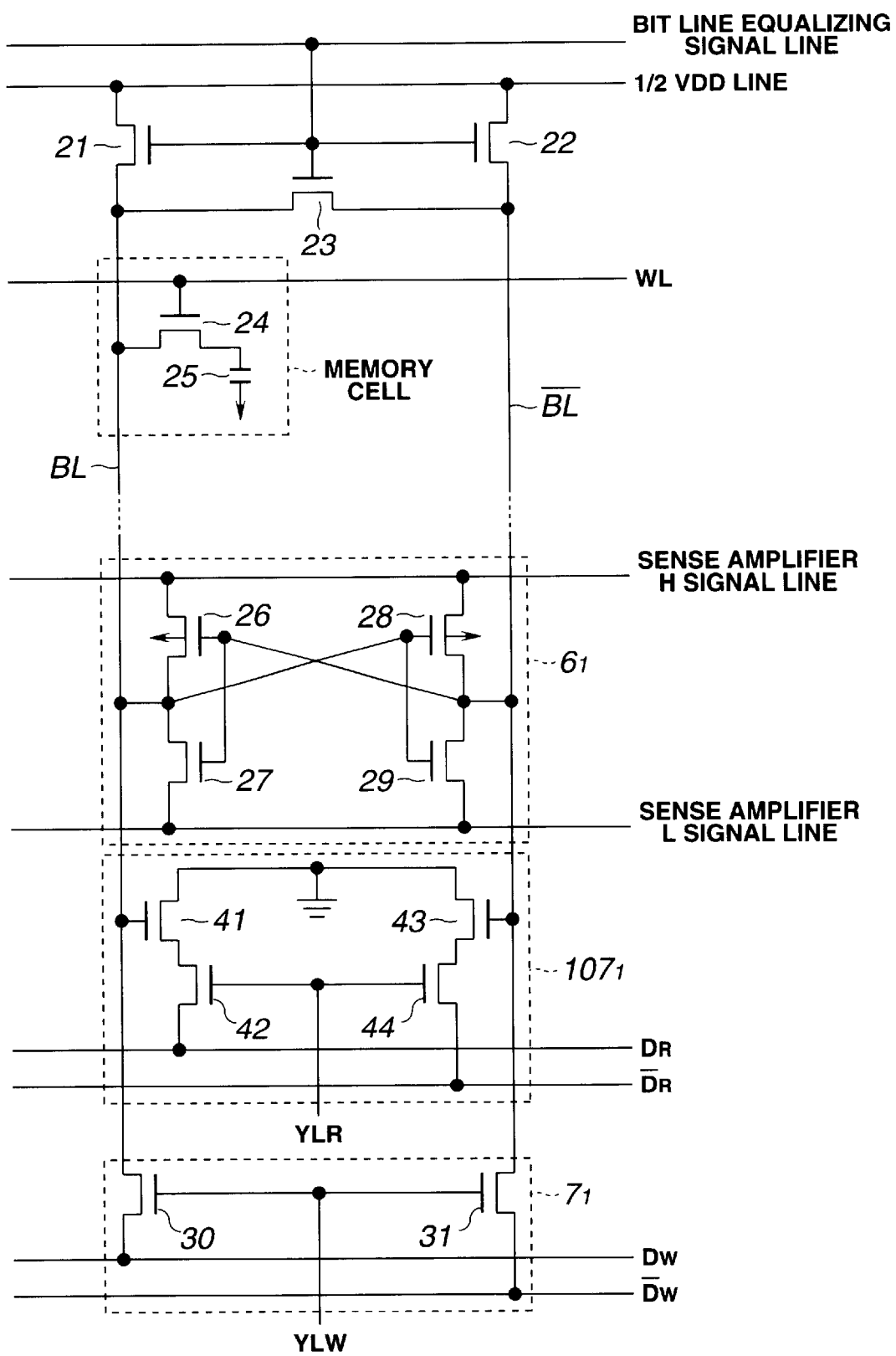
FIG. 7 is a circuit diagram showing an exemplary structure of a memory cell array 5, an SA $6_i$ and column switches $7_1$ and $107_i$ of FIG. 6.

FIG. 7 shows an exemplary structure of the memory cell array 5, SA $6_i$, column switch $7_i$ and column switch $107_i$ of FIG. 6. In FIG. 7, portions corresponding to those in FIG. 4 are denoted by the same numerals. That is, the circuit of FIG. 7 is constituted similarly to that of FIG. 4 except that the column switch $107_i$ is additionally provided.

The column switch $107_i$ is provided in parallel to the column switch $7_i$.

Specifically, the column switch $107_i$ is constituted by FETs (N-channel FETs) 41 to 44. The gate of the FET 41 is connected to a bit line BL, and its source of the FET 41 is connected to the drain of the FET 42. The source of the FET 42 is connected to a data bus $D_R$, and its gate is connected to the gate of the FET 44. The drain of the FET 41 is connected to the drain of the FET 43, and the connection point between the drains is grounded. Moreover, the gate of the FET 43 is connected to a bit line !BL, and its source is connected to the drain of the FET 44. The source of the FET 44 is connected to a data bus !$D_R$. The connection point between the gates of the FETs 42 and 44 is connected to a column decoding line YLR.

The column decoding line YLR is driven by the column driver 104C. The FETs 42 and 44 constituting the column switch 107$_i$ are turned on when the column decoding line YLR is switched to H-level. On the other hand, the FETs 42 and 44 are turned off when the column decoding line YLR is switched to L-level. In the state where the FETs are in the ON-state, a voltage on the bit line BL, that is, a voltage obtained by differentially amplifying and latching the voltage of the capacitor 25 by the SA 6$_i$, is outputted to the data bus $D_R$ through the FETs 41 and 42, and a voltage on the bit line !BL is outputted to the data bus !$D_R$ through the FETs 43 and 44.

In FIG. 7, the column decoding line YLW is described in place of the column decoding line YL of FIG. 4.

The operation with respect to the structure of FIG. 7 will now be described.

It is now assumed that the row address m of a memory cell in the m-th row of the memory cell array 5 is supplied to the row decoder 3R, and that the column address n1 and n2 of memory cells in the n1-th and n2-th columns of the memory cell array 5 are supplied to the column decoders 3C and 103C, respectively. However, m is an integer within a range of 1 to M, and n1 and n2 are integers within a range of 1 to N and are in the relation of n1≠n2.

In this case, similar to the case described with reference to FIG. 5, the bit line equalizing signal is switched from H-level to L-level as shown in FIG. 5A, and the word line WL of the m-th row is switched from L-level to H-level (that is, the memory cell in the m-th row is designated) by the row driver 4R as shown in FIG. 5B. Moreover, the sense amplifier H signal is switched from L-level to H-level as shown in FIG. 5C and the sense amplifier L signal is switched from H-level to L-level as shown in FIG. 5D. Thus, the SA 6$_1$ to 6$_N$ are set in the operating state.

When in the operating state, the SA 6$_1$ to 6$_N$ differentially amplify and latch the voltage of the capacitor 25 constituting the memory cell in the m-th row that is designated by the row address m appearing on the bit line BL. As a result, as shown in FIG. 5E, the voltage on the bit line BL changes from VDD/2 to one of H-level and L-level, and the voltage on the bit line !BL changes from VDD/2 to the other.

The column driver 4C switches the column decoding line YLW connected to the column switch 7$_{n1}$ of the n-th column, from L-level to H-level as shown in FIG. 5G. Thus, the column switch 7$_{n1}$ of the n1-th column is switched from OFF-state to ON-state. Therefore, the bit line BL of the n1-th column is electrically connected to the data bus $D_W$, and the bit line !BL of the n1-th column is electrically connected to the data bus !$D_W$.

After that, as the writing target data is outputted onto the data buses $D_W$ and !$D_W$ through the input buffer 12 and the recording amplifier 13, electric charges corresponding to the writing target data are charged to the capacitor 25 through the bit line BL and FET 24 of the n1-th column, thus storing the writing target data to the memory cell in the m-th row and the n1-th column, consisting of the FET 24 and capacitor 25.

On the other hand, the column driver 104C switches the column decoding line YLR connected to the column switch 107$_{n2}$ of the n2-th column, from L-level to H-level as shown in FIG. 5G. Thus, the column switch 107$_{n2}$ of the n2-th column is switched from OFF-state to ON-state. Therefore, the bit line BL of the n2-th column is electrically connected to the data bus $D_R$, and the bit line !BL of the n2-th column is electrically connected to the data bus !$D_R$.

As the bit line BL of the n2-th column is connected with the data bus $D_R$ while the bit line !BL of the n2-th column is connected with the data bus !$D_R$ as described above, the voltage of the capacitor 25 which is differentially amplified by the SA 6$_{n2}$ of the n2-th column, that is, the data stored in the memory cell in the m-th row and the n2-th column constituted by the FET 24 and capacitor 25, is outputted onto the data buses $D_R$ and !$D_R$. In short, the data outputted in the memory cell is outputted on the data bus $D_R$, and the inversion of the data stored in the memory cell is outputted on the data bus !$D_R$. The data on the data buses $D_R$ and !$D_R$ are outputted through the MA 10 and the output buffer 11.

As described above, with the DRAM chip of FIG. 6 having the structure of FIG. 7, data writing to the memory cell in the m-th row and the n1-th column and data reading from the memory cell in the m-th row and the n2-th column are simultaneously carried out.

Specifically, in the DRAM chip of FIG. 6, since two column switches 7$_i$ and 107$_i$ for enabling data reading from/writing to the memory cells in the m-th row and n-th column are arranged in parallel, it is possible to carry out data writing to either one of the memory cells in the n1-th and n2-th columns, of the memory cells in the m-th row, while carrying out data reading from the other memory cell.

Also, in the DRAM chip of FIG. 6, since the column decoder 3C and the column driver 4C for turning on/off the column switch 7$_i$ and the column decoder 103C and the column driver 104C for turning on/off the column switch 107$_i$ are provided, data shuffling in the DRAM chip can be carried out by utilizing the column decoders and column drivers.

Figure 8:
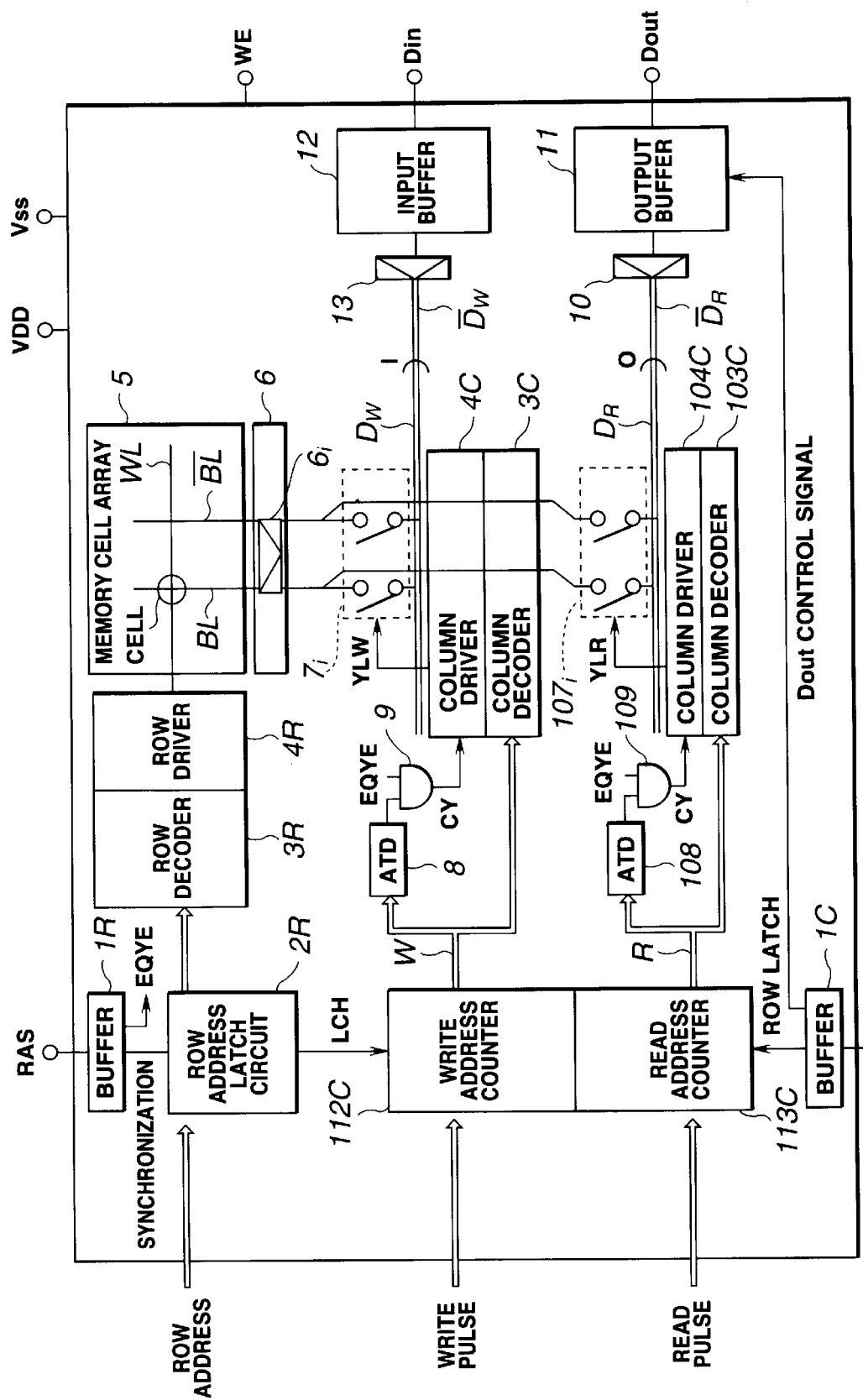
FIG. 8 is a block diagram showing an exemplary structure of an embodiment of a DRAM chip related to the present invention which is applicable to data shuffling.

FIG. 8 shows an exemplary structure of an embodiment of a DRAM chip which can be applied to a shuffling device for shuffling data. In FIG. 8, portions corresponding to those of FIG. 6 are denoted by the same numerals. That is, the DRAM chip of FIG. 8 is constituted similarly to that of FIG. 6, except that a write address counter 112C is provided in place of the column address latch circuit 2C of FIG. 6 and that a read address counter 113C is provided in place of the column address latch circuit 102C of FIG. 6. In addition, while the column address W is supplied to the column address latch circuit 2C and the column address R is supplied to the column address latch circuit 102C in the example of FIG. 6, a write pulse is supplied to the write address counter 112C and a read pulse is supplied to the read address counter 113C in the example of FIG. 8.

A write pulse is supplied to the write address counter 112C. The write address counter 112C counts the write pulse synchronously with a column latch signal from a buffer 1C and a latch completion signal LCH from a row address latch circuit 2R, thereby making increment of the 8-bit count value by 1. Then, the write address counter 112C outputs the 8-bit count value as a column address W, which is a write address.

A read pulse is supplied to the read address counter 113C. The read address counter 113C counts the read pulse synchronously with a synchronizing signal from the buffer 1C and the latch completion signal LCH from the row address latch circuit 2R, thereby making increment of the 8-bit count value by 1. Then, the read address counter 113C outputs the 8-bit count value as a column address R, which is a read address.

As described above, the column address is supplied to a column decoder 3C and the column address R is supplied to a column decoder 103C. In the case where, for example, the column decoders 3C and 103C have perfectly the same structure and thus generate the same decoding result, a DRAM chip capable of data writing and reading as described in FIG. 6 can be realized.

On the other hand, in the DRAM chip of FIG. 8, the column decoders 3C and 103C generate different decoding results.

Figure 9A:
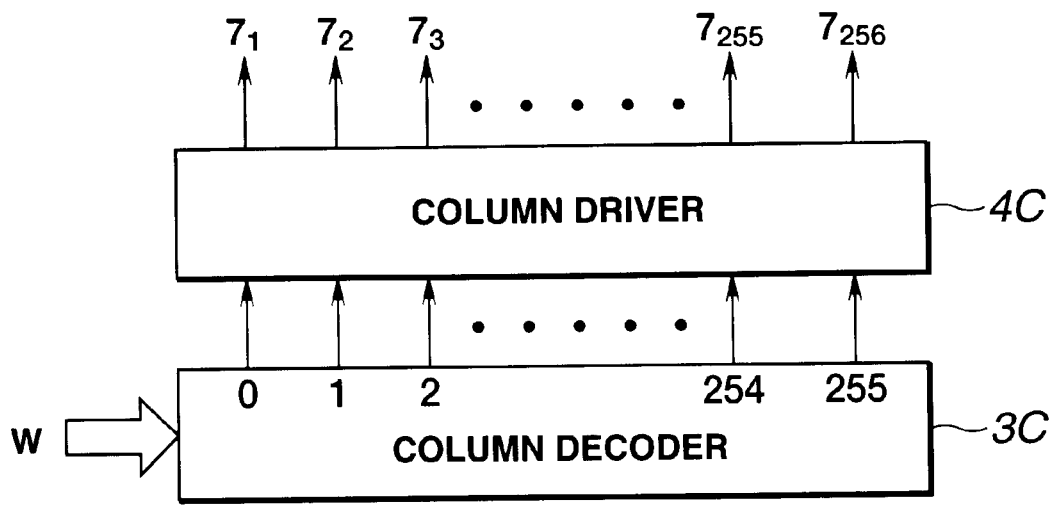
FIG. 9A is a view for explaining decode processing of a column decoder 3C of FIG. 8.
Figure 9B:
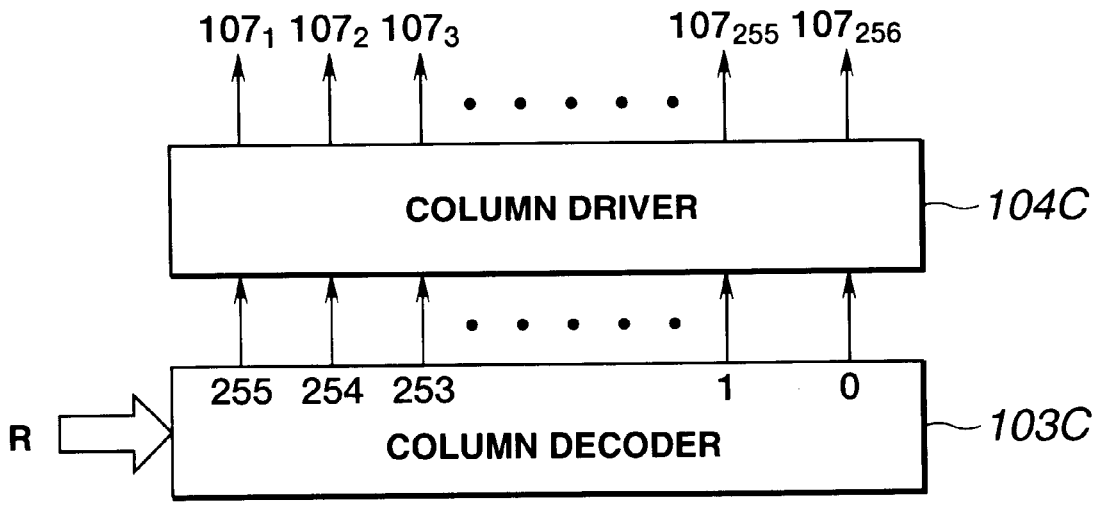
FIG. 9B is a view for explaining decode processing of a column decoder 103C of FIG. 8.

For example, it is now assumed that the column addresses W and R consist of 8 bits, respectively. If one column address is assumed to correspond to memory cells of one column so as to simplify the explanation, the number of columns N in the memory cell array is 256 ($=2^8$). In this case, when the column addresses W are 0, 1, 2, ..., 255 ($=2^8-1$) as shown in FIG. 9A, the column decoder 3C outputs decoding results to the column driver 4C such that the column switches $7_1, 7_2, 7_3, \ldots, 7_{256}$ are turned on. When the column addresses R are 0, 1, 2, ..., 255 as shown in FIG. 9B, the column decoder 103C outputs decoding results to the column driver 104C such that the column switches $107_{256}, 107_{255}, 107_{254}, \ldots, 107_0$ are turned on.

It suffices that the decoding results generated by the column decoders 3C and 103C are different at least for a part of the address expressed by 8 bits. The decoding results need not be different for the entire 8-bit address. That is, it suffices that the decoding results of the column decoders 3C and 103C may be the same when a certain 8-bit address A is entered and that they are different when another address B is entered.

As described above, as a result of the different decoding results generated by the column decoders 3C and 103C, high-speed shuffling can be carried out in the DRAM chip of FIG. 8.

Figure 10:
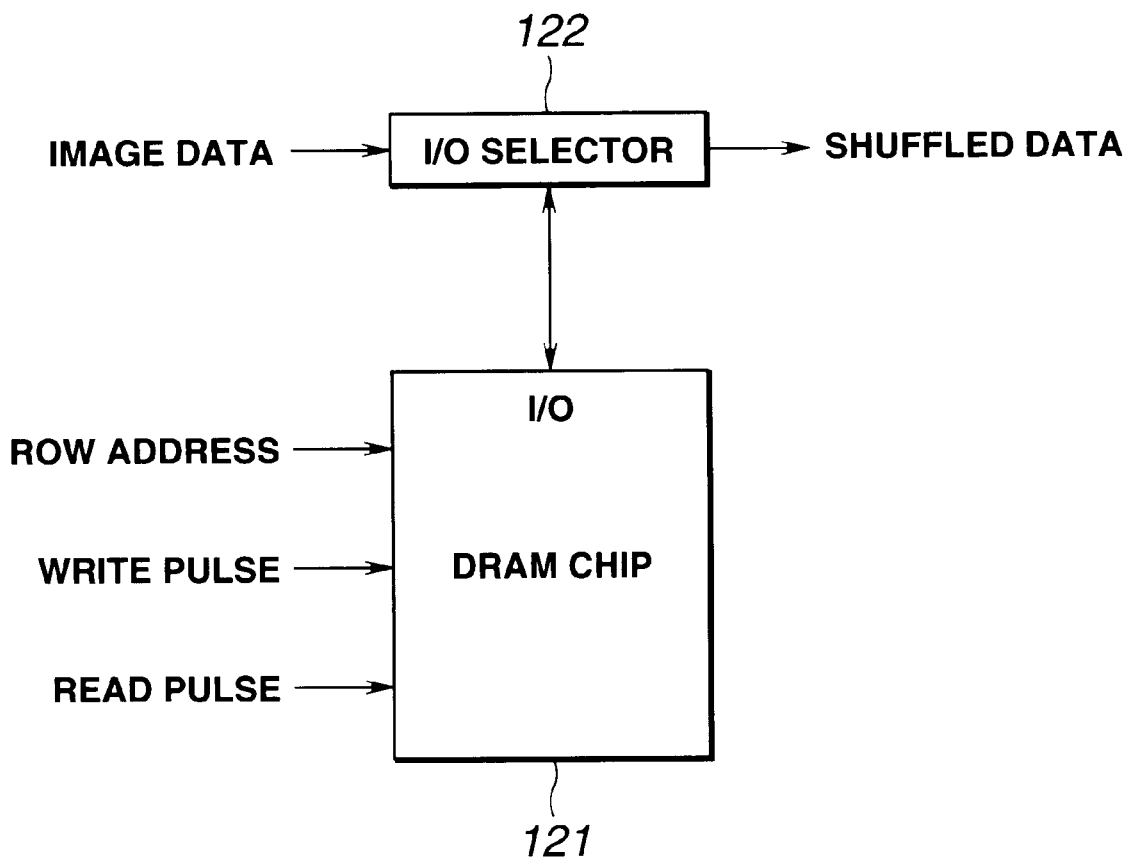
FIG. 10 is a block diagram showing an exemplary structure of an embodiment of a shuffling device using the DRAM chip of FIG. 8.

FIG. 10 shows an exemplary structure of an embodiment of a shuffling device utilizing the DRAM chip of FIG. 8.

A DRAM chip 121 is constituted similarly to the DRAM chip of FIG. 8 and is supplied with a row address and write and read pulses. The input/output terminal (I/O) of the DRAM chip 121 of FIG. 10 corresponds to the input terminal Din and the output terminal Dout shown in FIG. 8.

An I/O selector 122 supplies digital image data inputted thereto as a shuffling target to the input/output (I/O) of the DRAM chip 121, and outputs the shuffled data (image data that is shuffled) supplied from the input/output terminal of the DRAM chip 121.

In the shuffling device constituted as described above, a write address control signal is supplied to the DRAM chip 121 and the shuffling target image data is supplied to the I/O selector 122.

The I/O selector 122 sequentially outputs the image data supplied thereto to the input/output terminal of the DRAM chip 121. The DRAM chip 121 outputs the image data from the I/O selector 122 through the input terminal Din, the input buffer 12 and the recording amplifier 13 onto the data bus $D_W$.

In the DRAM chip 121 constituted as shown in FIG. 8, the row address is supplied to the row address latch circuit 2R and the write pulse is supplied to the write address counter 112C.

The row address latch circuit 2R latches the row address supplied thereto and outputs the latched row address to the row decoder 3R. The row decoder 3R decodes the row address from the row address latch circuit 2R and controls the row driver 4R in accordance with its decoding result. Thus, the word line WL of the corresponding row, shown in FIG. 7, of the memory cell array is switched to H-level.

Meanwhile, the write address counter 112C counts the write pulse and outputs the count value as a column address W to the column decoder 3C. The column decoder 3C decodes the column address W from the write address counter 112C and controls the column driver 4C in accordance with its decoding result. Thus, the corresponding column switch $7_i$ shown in FIG. 7 is turned on. The bit line BL of the corresponding column of the memory cell array 5 is connected to the data bus $D_W$, and the bit line !BL is connected to the data bus $!D_W$.

Consequently, the image data outputted on the data bus $D_W$ is written to memory cells in the columns of the bit line BL connected to the data bus $D_W$ and the bit line !BL connected to the data bus $!D_W$, of the row of the word line WL switched to H-level.

On completion of writing of image data of, for example, one frame (or one field), a read address control signal is supplied to the DRAM chip 121.

In the DRAM chip 121 constituted as shown in FIG. 8, the row address is supplied to the row address latch circuit 2R and the read pulse is supplied to the read address counter 113C.

The row address latch circuit 2R, the row decoder 3R and the row driver 4R carry out processing similar to the processing in the case of writing image data to the memory cell array 5, thereby switching the word line WL of the corresponding row shown in FIG. 7 to H-level. The row address included in the read address control signal may be different from or may be the same as the row address included in the write address control signal.

Meanwhile, the read address counter 113C counts the read pulse and outputs the count value as a column address R to the column decoder 103C. The column decoder 103C decodes the column address R from the read address counter 113C and controls the column driver 104C in accordance with its decoding result. Thus, the corresponding column switch $107_i$ is turned on. The bit line BL of the corresponding column of the memory cell array 5 is connected to the data bus $D_R$, and the bit line !BL is connected to the data bus $!D_R$.

Consequently, the image data stored in the memory cell in the column of the bit line BL connected to the data bus $D_R$, of the row of the word line WL switched to H-level, is read and outputted onto the data bus $D_R$, and the image data stored in the memory cell in the column of the bit line !BL connected to the data bus $!D_R$ is read and outputted onto the data bus $!D_R$.

The image data outputted on the data buses $D_R$ and $!D_R$ are supplied through the MA 10, output buffer 11 and output terminal Dout to the I/O selector 122. The I/O selector 122 outputs the image data thus supplied from the DRAM chip 121.

Reading of image data of one frame stored in the memory cell array 5 is carried out, for example, within a vertical interval time code. When image data of the next frame starts to be supplied, the above-described writing of image data to the DRAM chip 121 is carried out again.

Figure 2:
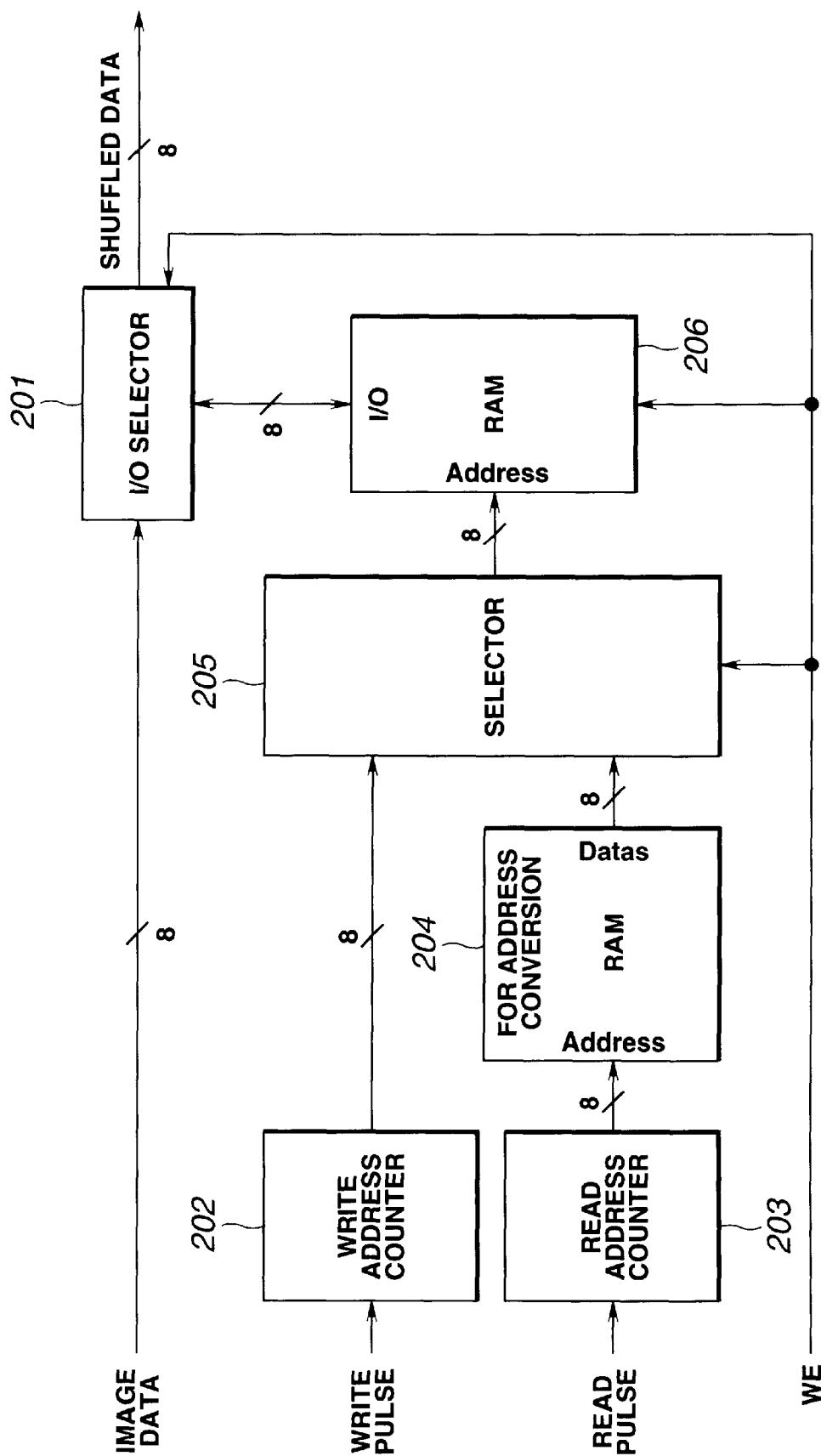
FIG. 2 is a block diagram showing the structure of an example of a conventional shuffling memory device.

As described above, according to the shuffling memory device of FIG. 10 having the DRAM chip 121 of FIG. 8, since the column decoders 3C and 103C have different decoding results, the order of addresses at which image data is written to the DRAM chip 121 and the order of addresses at which image data is read from the DRAM chip are different. As a result, shuffled image data (shuffled data) is outputted from the I/O selector 122 without providing the address conversion memory as shown in FIG. 2. Therefore, the shuffling memory device of FIG. 10 enables high-speed shuffling of image data because it has no processing delay due to access to the address conversion memory as described with reference to FIG. 2.

Figure 1:
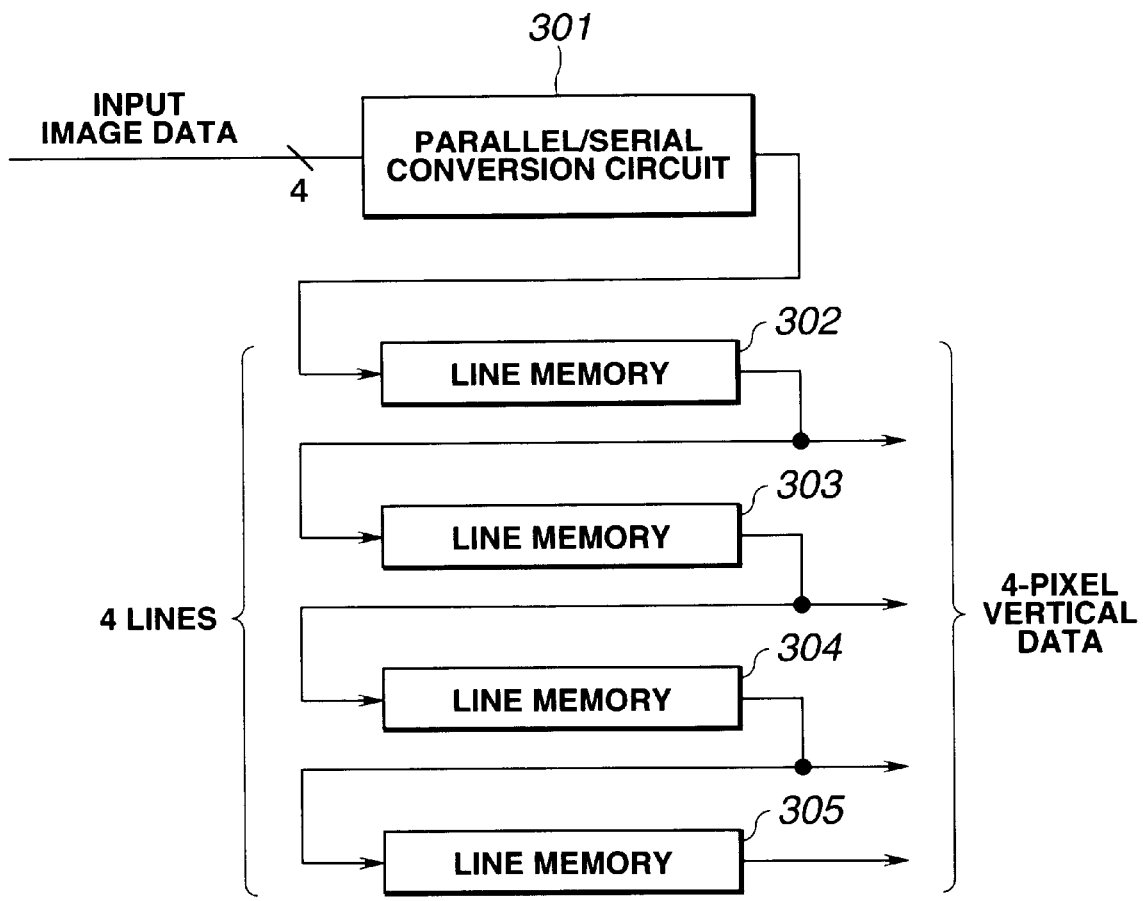
FIG. 1 is a block diagram showing the structure of an example of a conventional rearrangement device for rearranging pixels.

Moreover, in the DRAM chip 121 of FIG. 8 constituting the shuffling device of FIG. 10, the column decoder 103C and the column driver 104C are necessary in addition to the column decoder 3C and the column driver 4C, in comparison with the DRAM chip shown in FIG. 3. However, since it does not need the line memory as shown in FIG. 1, the chip size can be reduced in comparison with the case of FIG. 1 when realizing large-scale integration (LSI) of the shuffling device.

Shuffling of image data may be any processing for causing the order of addresses for image data writing and the order of addresses for image data reading to be different from each other, and is not particularly restricted otherwise. Therefore, at the time of image data writing, it is not necessary to write the image data at addresses corresponding to the line scan order.

Generating different decoding results of the column decoders 3C and 103C can be realized, for example, by causing the contact (connection) between the column decoder 3C and the column driver 4C and the contact between the column decoder 103C and the column driver 104C to be different from each other.

In the case where different decoding results of the column decoders 3C and 103C are generated by causing the contact between the column decoder 3C and the column driver 4C and the contact between the column decoder 103C and the column driver 104C to be different from each other, it is necessary to change the contact between the column decoder 3C and the column driver 4C and the contact between the column decoder 103C and the column driver 104C when changing the shuffling pattern.

Figure 11:
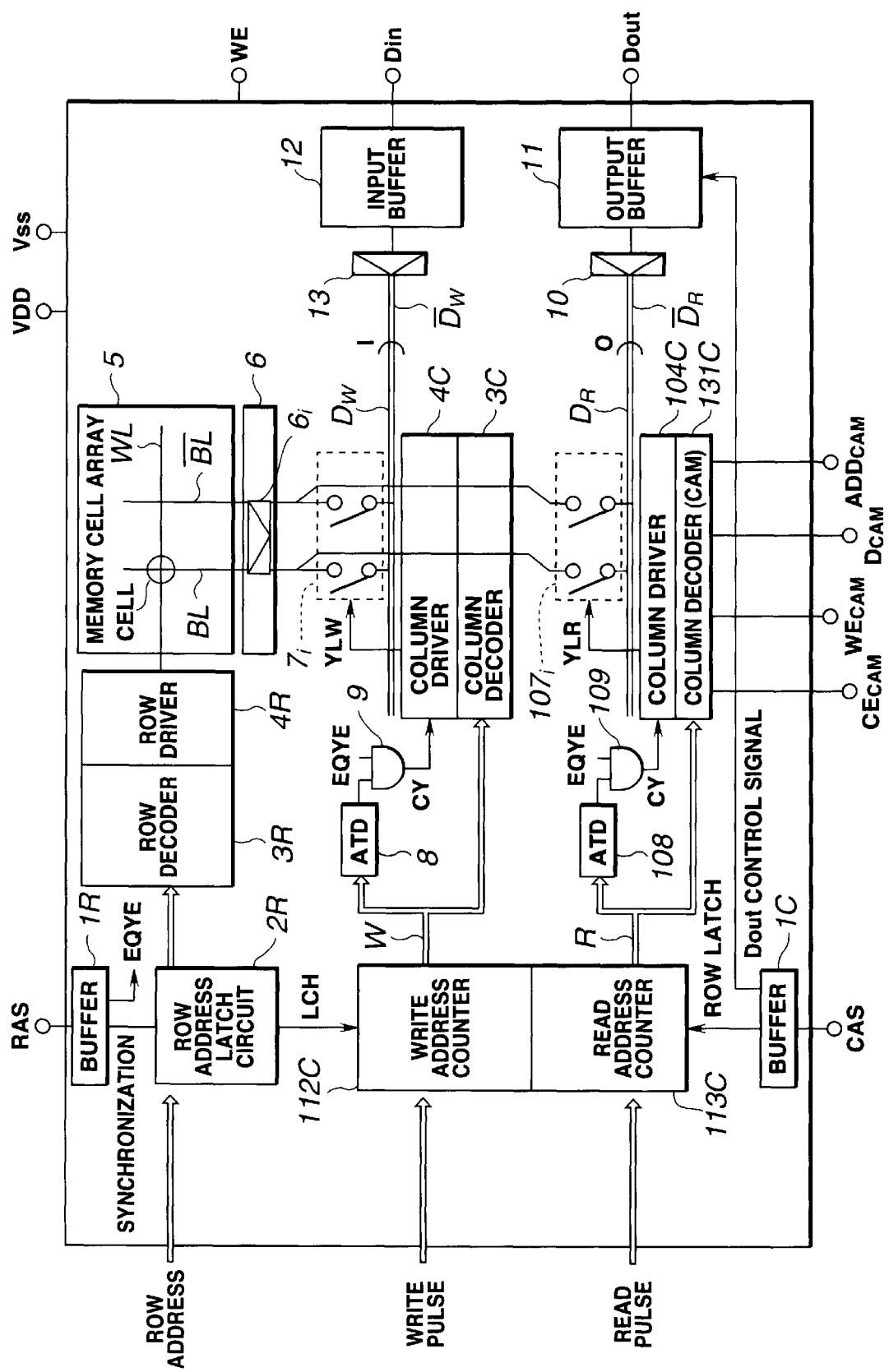
FIG. 11 is a block diagram showing an exemplary structure of another embodiment of a DRAM chip related to the present invention which is applicable to data shuffling.

Thus, FIG. 11 shows an exemplary structure of another embodiment of a DRAM chip which can be applied to the shuffling device for data shuffling. In FIG. 11, portions corresponding to those of FIG. 8 are denoted by the same numerals. The DRAM chip of FIG. 11 is constituted similarly to that of FIG. 8, except that a column decoder 131C is provided in place of the column decoder 103C of FIG. 8.

The column decoder 131C can programmably change its decoding result and is constituted by, for example, a CAM (content-addressable memory) capable of carrying out retrieval operation for reading the storage contents in accordance with the storage contents. Specifically, in the case where $2^K$ is equal to the number of columns N of the memory cell array 5, the column addresses W and R are provided by K bits, respectively. However, it is considered that memory cells of one column correspond to one column address. In this case, the column decoder 131C is constituted by arranging N ($=2^K$) units of CAM cells in the row direction and K units of CAM cells in the column direction. In FIG. 11, the column decoder 131C is provided with terminals $CE_{CAM}$, $WE_{CAM}$, $D_{CAM}$, and $ADD_{CAM}$. The terminal $CE_{CAM}$ is a terminal for supplying a chip enable signal to the CAM constituting the column decoder 131C. The terminal $WE_{CAM}$ is a terminal for supplying a write enable signal to the CAM constituting the column decoder 131C. The terminal $D_{CAM}$ is a terminal for supplying data to be written to the CAM constituting the column decoder 131C. The terminal $ADD_{CAM}$ is a terminal for supplying an address for writing the data supplied from the terminal $D_{CAM}$.

Figure 12:
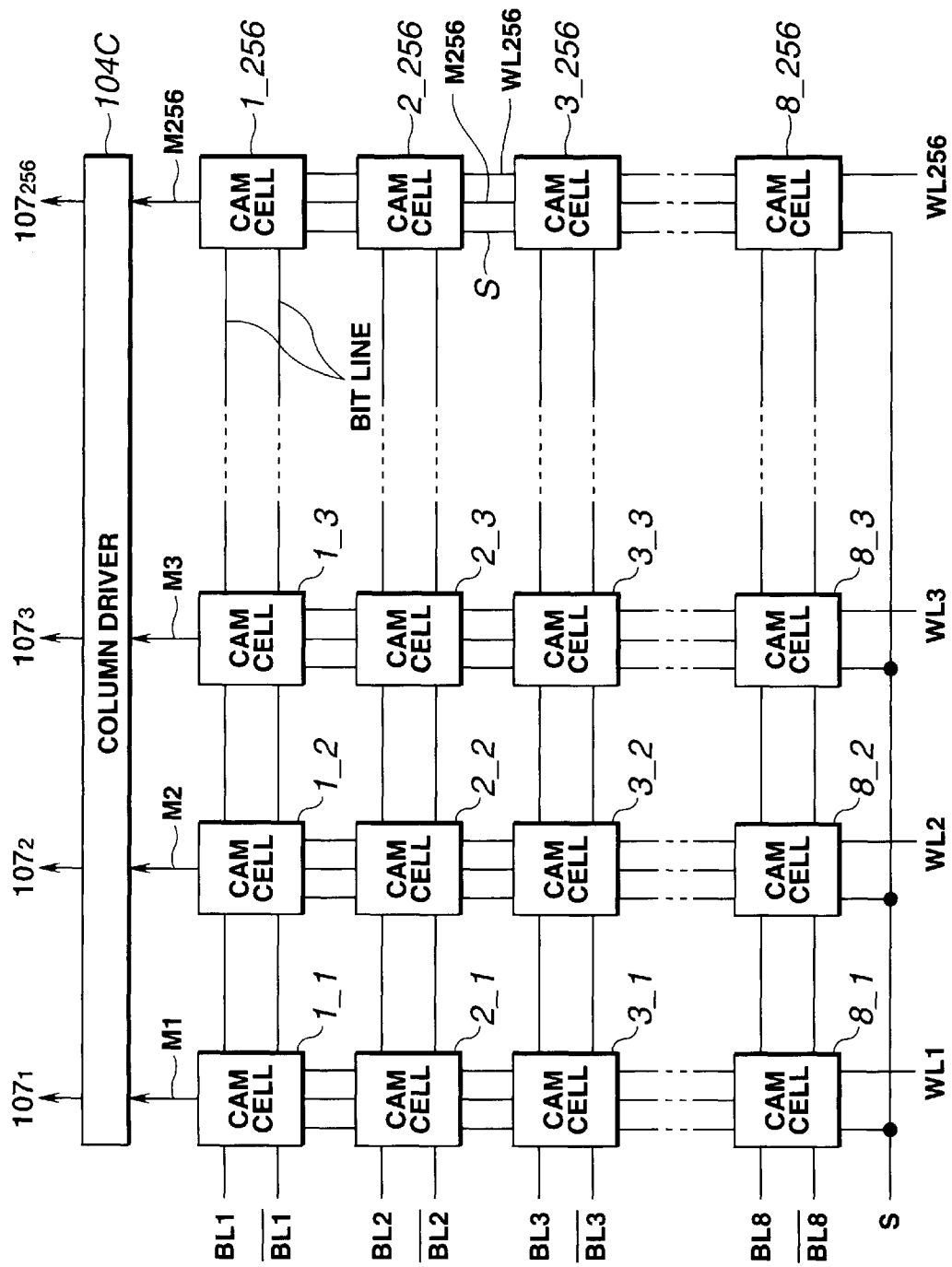
FIG. 12 is a block diagram showing an exemplary structure of a column decoder 131 of FIG. 11.

FIG. 12 shows an exemplary structure of the column decoder 131C in the case where K is equal to 8, that is, the column addresses W and R are provided by 8 bits, respectively.

As shown in FIG. 12, the column decoder 131C is constituted by arranging 256 ($=2^8$) CAM cells in the row direction and 8 CAM cells in the column direction.

In FIG. 12, the matching line, word line and retrieval enable line of a CAM cell i_j located in the i-th row and j-th column are connected to the matching line, word line and retrieval enable line of a CAM cell i−1_j located above the CAM cell i_j, and is also connected to the matching line, word line and retrieval enable line of a CAM cell i+1_j located below the CAM cell i_j. In this case, i=1, 2, . . . , K and j=1, 2, . . . , N.

The matching lines M#j of CAM cells 1_j located in the first row and j-th column are connected to a section for controlling on/off switching of column switches 107$_j$, that is, a section corresponding to the column decoding line YLR shown in FIG. 7. The retrieval enable lines of CAM cells 8_j located in the eighth row and j-th column are connected to one another, thus forming a retrieval enable line S. Moreover, the word lines of the CAM cells 8_j located in the eighth row and j-th column are expressed as word lines WL#j.

The bit line of a CAM cell i_j located in the i-th row and j-th column is connected to the bit line of a CAM cell i_j−1 located on the left side of the CAM cell i_j, and is also connected to the bit line of a CAM cell i_j+1 located on the right side of the CAM cell i_j. The bit line of positive logic of the CAM cell i,1 located in the i-th row and first column is expressed as the bit line BL#i, and the bit line of negative logic is expressed as the bit line !BL#i.

Figure 13:
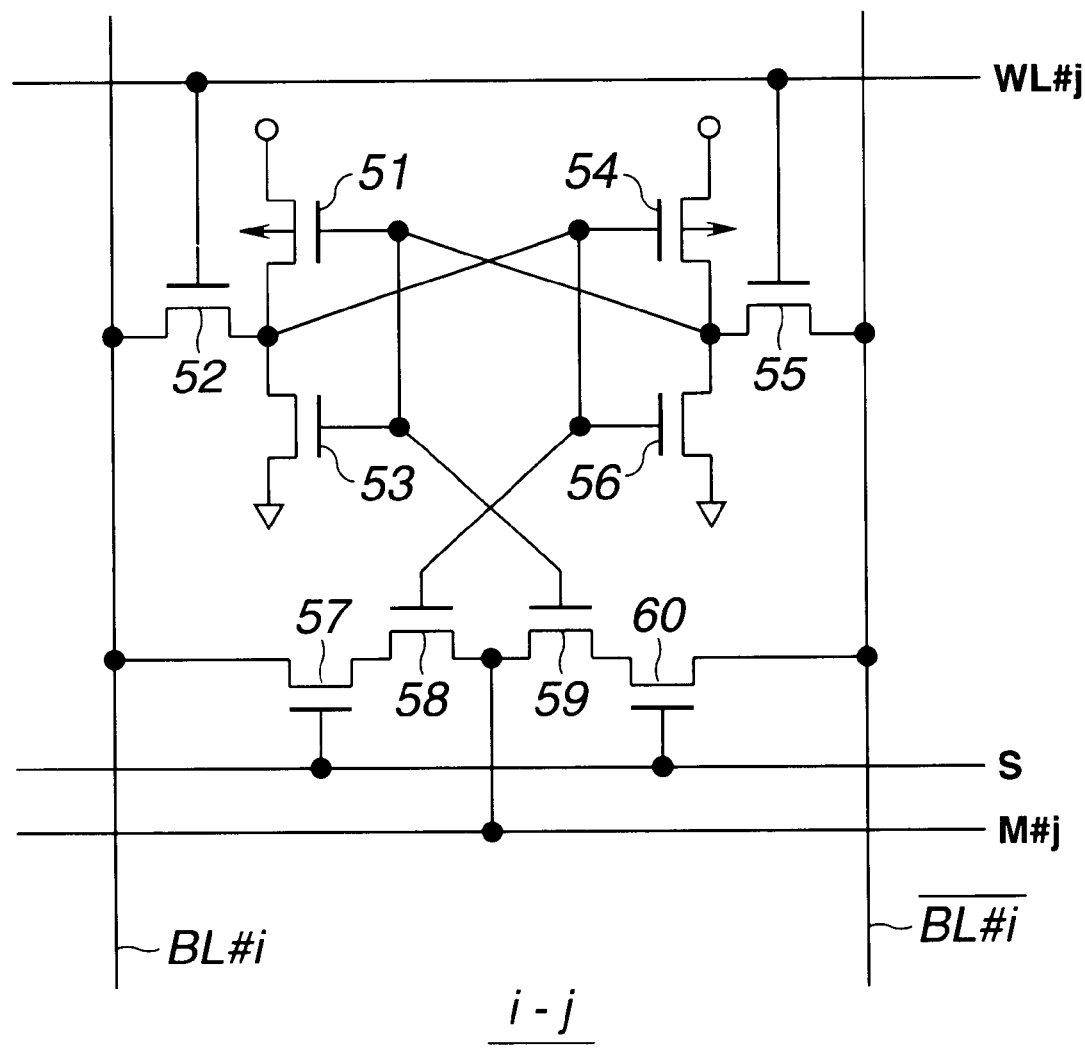
FIG. 13 is a circuit diagram showing an exemplary structure of a CAM cell i_j of FIG. 12.

FIG. 13 shows an exemplary structure of the CAM cell i_j of FIG. 12.

H-level is applied to the source of an FET (P-channel FET) 51, and its gate is connected to the gate of an FET (N-channel FET) 53. The drain of the FET 51 is connected to the source of an FET (N-channel FET) 52. The gate of the FET 52 is connected to the word line WL#j and its drain is connected to the bit line BL#i.

The drain of the FET 53 is connected to the connection point between the drain of the FET 51 and the source of the FET 52, and L-level is applied to the source of the FET 53.

The source of an (P-channel) FET 54 is supplied with H-level and its gate is connected to the connection point between the drain of the FET 51 and the source of the FET 52. The drain of the FET 54 is connected to the connection point between the gates of the FETs 51 and 53. The drain of the FET 54 is also connected to the source of an FET (N-channel FET) 55 and the drain of an FET (N-channel FET) 56.

The gate of the FET 55 is connected to the word line WL#j and its drain is connected to the bit line !BL#i. The gate of the FET 56 is connected to the gate of the FET 54 and L-level is applied to the source of the FET 56.

The above-mentioned FETs 51 to 56 constitute a typical memory cell, which has basically the same structure as a so-called 6-transistor CMOS (complementary metal oxide semiconductor) SRAM (static RAM) memory cell.

The source of an FET (N-channel FET) 57 is connected to the bit line BL#i and its gate is connected to the retrieval enable line S. The drain of the FET 57 is connected to the source of an FET (N-channel FET) 58. The gate of the FET 58 is connected to the gate of the FET 56, and the drain of the FET 58 is connected to the drain of an FET (N-channel FET) 59. The connection point between the drains of the FETs 58 and 59 is connected to the matching line M#j.

The gate of the FET 59 is connected to the gate of the FET 53, and the source of the FET 59 is connected to the drain of an FET (N-channel FET) 60. The gate of the FET 60 is connected to the retrieval enable line S and its source is connected to the bit line !BL#i.

The operation thereof will now be described.

At the time of data writing, the word line WL#j is switched from L-level to H-level. Thus, H-level is applied to the gates of the FETs 52 and 55, which are thus set in ON-state. Then, as the FET 52 is set in ON-state, the bit line BL#i is connected (electrically connected) to the gate of the FET 54. As the FET 55 is set in ON-state, the bit line !BL#i is connected (electrically connected) to the gate of the FET 51.

If H-level of "1" as writing target data is outputted onto the bit line BL#i, L-level of "0", which is the inversion of the writing target data, is outputted onto the bit line !BL#i.

When H-level on the bit line BL#i is applied to the gate of the FET 54 through the FET 52 in ON-state, the FET 54 is set in OFF-state. Since the gate of the FET 54 is connected to the gate of the FET 56, H-level on the bit line BL#i is also applied to the gate of the FET 56. Thus, the FET 56 is set in ON-state.

On the other hand, when L-level on the bit line !BL#i is applied to the gate of the FET 51 through the FET 55 in ON-state, the FET 51 is set in ON-state. Since the gate of the FET 51 is connected to the gate of the FET 53, L-level on the bit line !BL#i is also applied to the gate of the FET 53. Thus, the FET 53 is set in OFF-state.

After that, when the word line WL#j is switched from H-level to L-level, L-level is applied to the FETs 52 and 55, which are thus set in OFF-state. As the FET 52 is in OFF-state, the gates of the FETs 54 and 56 are disconnected from the bit line BL#i. As the FET 55 is in OFF-state, the gates of the FETs 51 and 53 are disconnected from the bit line !BL#i.

At this point, the FET 51 is in ON-state, the FET 53 is in OFF-state, the FET 54 is in OFF-state, and the FET 56 is in ON-state, as described above. Therefore, the connection point between the drains of the FETs 51 and 53 is at H-level and the connection point between the drains of the FETs 54 and 56 is at L-level. H-level is applied to the gates of the FETs 51 and 53 connected to the connection point between the drains of 51 and 53, and L-level is applied to the gates of the FETs 54 and 56. Therefore, in the case where the writing target data is "1", the FET 51 is maintained in ON-state, the FET 53 is maintained in OFF-state, the FET 54 is maintained in OFF-state, and the FET 56 is maintained in ON-state. Thus, the writing target data "1" is stored.

On the contrary, in the case where the writing target data is "0", that is, in the case where L-level of "0" as the writing target data is outputted on the bit line BL#i, H-level is applied to the gates of the FETs 51 and 53 and L-level is applied to the gates of the FETs 54 and 56. Thus, the FET 51 is maintained in OFF-state, the FET 53 is maintained in ON-state, the FET 54 is maintained in ON-state, and the FET 56 is maintained in OFF-state. The writing target data "0" is stored.

Data reading will now be described. In this case, too, the word line WL#j is switched from L-level to H-level. Thus, H-level is applied to the gates of the FETs 52 and 55, which are thus set in ON-state. Then, as the FET 52 is set in ON-state, the bit line BL#i is electrically connected to the gate of the FET 54. As the FET 55 is set in ON-state, the bit line !BL#i is electrically connected to the gate of the FET 51.

In the case where the written data is "1", H-level is applied to the gate of the FET 54 as described above and therefore this H-level is outputted as read data on the bit line BL#i. That is, L-level applied to the FET 51 is outputted on the bit line !BL#i. On the other hand, in the case where the written data is "0", L-level is applied to the gate of the FET 54 as described above and therefore this L-level is outputted as read data on the bit line BL#i. That is, H-level applied to the FET 51 is outputted on the bit line !BL#i.

The retrieval operation will now be described.

In the retrieval operation, the word line WL#j is left at L-level and the retrieval enable line S and the matching line M#j are switched from L-level to H-level.

The bit lines BL#i and !BL#i are switched to a level corresponding to the data to be retrieved. Specifically, in the case where "1" (H-level) is to be retrieved, the bit line BL#i is set at H-level and the bit line !BL#i is set at L-level. In the case where "0" (L-level) is to be retrieved, the bit line BL#i is set at L-level and the bit line !BL#i is set at H-level.

In the case where no retrieval is to be carried out, the bit line BL#i and !BL#i of the CAM cell are both set at H-level.

It is now assumed that "1" is stored in the CAM cell i_j. The gate of the FET 53 is at L-level and the gate of the FET 56 is at H-level, as described above. Therefore, L-level is applied to the gate of the FET 59 connected to the gate of the FET 53, and the FET 59 is thus set in OFF-state. H-level is applied to the gate of the FET 58 connected to the gate of the FET 56, and the FET 58 is thus set in ON-state.

Since the retrieval enable line S is set at H-level, H-level is applied to the gates of the FETs 57 and 60. The FETs 57 and 60 are thus set in ON-state. Therefore, in the case where "1" is stored in the CAM cell, the FETs 57, 58 and 60, of the FETs 57 to 60, are set in ON-state and the FET 59 is set in OFF-state, thereby connecting the matching line M#j to the bit line BL#i through the FETs 58 and 57 in ON-state.

In the case where the data to be retrieved is, for example, "1", the bit line BL#i is set at H-level as described above. Therefore, no current flows between the bit line BL#i at H-level and the matching line M#j at H-level, and the matching line M#j is consequently maintained at H-level.

In the case where the data to be retrieved is, for example, "0", the bit line BL#i is set at L-level as described above. Therefore, a current flows between the bit line BL#i at L-level and the matching line M#j at H-level, and the matching line M#j is consequently lowered to L-level, which is the level of the bit line BL#i.

It is now assumed that "0" is stored in the CAM cell i_j. The gate of the FET 53 is at H-level and the gate of the FET 56 is at L-level, as described above. Therefore, H-level is applied to the gate of the FET 59 connected to the gate of the FET 53, and the FET 59 is thus set in ON-state. L-level is applied to the gate of the FET 58 connected to the gate of the FET 56, and the FET 58 is thus set in OFF-state.

Since the retrieval enable line S is set at H-level, H-level is applied to the gates of the FETs 57 and 60. The FETs 57 and 60 are thus set in ON-state. Therefore, in the case where "0" is stored in the CAM cell, the FETs 57, 59 and 60, of the FETs 57 to 60, are set in ON-state and the FET 58 is set in OFF-state, thereby connecting the matching line M#j to the bit line !BL#i through the FETs 59 and 60 in ON-state.

In the case where the data to be retrieved is, for example, "1", the bit line !BL#i is set at L-level as described above. Therefore, a current flows between the bit line !BL#i at L-level and the matching line M#j at H-level, and the matching line M#j is consequently lowered to L-level, which the level of the bit line !BL#i.

In the case where the data to be retrieved is, for example, "0", the bit line !BL#i is set at H-level as described above. Therefore, no current flows between the bit line !BL#i at H-level and the matching line M#j at H-level, and the matching line M#j is consequently maintained at H-level.

Thus, the matching line M#j is maintained at H-level in the case where the data to be retrieved is coincident with the data stored in the CAM cell i_j. The matching line M#j is switched from H-level to L-level in the case where the data to be retrieved in not coincident with the data stored in the CAM cell i_j.

As a result, in the case where the J-th column in FIG. 12 is taken up, since the matching lines M#J of CAM cells i_J located in the J-th column are connected to one another, the level of the matching lines M#J is maintained at H-level only when the storage values of all the CAM cells 1_J to 8_J located in the J-th column are coincident with the data inputted to the bit lines BL1 to BL8, respectively. When even only one of the combinations between the storage values of the CAM cells 1_J to 8_J and the data inputted to the bit lines BL1 to BL8 does not realize the coincidence, the level of the matching lines M#J is switched from H-level to L-level.

Thus, in the column decoder 131C of FIG. 12, by storing predetermined values in the CAM cells 1_J to 8_J, respectively, it is possible to set the column switches $107_J$ in ON-state as the decoding result only when the column address R coincident with 8bits consisting of the 8storage values are supplied onto the bit lines BL1 to BL8. That is, the decoding result of the column address R can be programmably changed by the values stored in the CAM cells 1_J to 8_J. Accordingly, in the example of FIG. 12, the shuffling pattern can be easily changed.

The operation of the column decoder 131C of FIG. 12 will now be described.

In the case where shuffling of image data or the like is to be carried out for the first time using the DRAM chip of FIG. 11, or in the case where the shuffling pattern is to be changed, programming of the CAM cells 1_1 to 8_256 constituting the column decoder 131C is carried out. That is, data is stored to each of the CAM cells 1_1 to 8_256, or each storage value is changed.

Specifically, in the case where shuffling of image data or the like is to be carried out for the first time, or in the case where the shuffling pattern is to be changed, first, the bit lines BL1 and !BL1 to BL8 and !BL8, the retrieval enable line S, and the word lines WL1 to WL256 are set at L-level.

Then, of the word lines WL1 to WL256, for example, only the word line WL1 is switched from L-level to H-level, and the bit lines BL1 to BL8 are set at levels corresponding to the column address R which is inputted in turning on the column switch $107_1$. For example, if the column address R which is inputted in turning on the column switch $107_1$ is expressed by B1, B2, B3, B4, B5, B6, B7, B8 from the least significant bit, the bit lines BL1 to BL8 are set at levels corresponding to the bits B1 to B8, respectively. Thus, the bits B1 to B8 are stored in the CAM cells 1_1 to 8_1 in the above-described manner.

Next, of the word lines WL1 to WL256, for example, only the word line WL2 is switched from L-level to H-level, and the bit lines BL1 to BL8 are set at levels corresponding to the column address R which is inputted in turning on the column switch $107_2$. For example, if the column address R which is inputted in turning on the column switch $107_2$ is expressed by B1', B2', B3', B4', B5', B6', B7', B8' from the least significant bit, the bit lines BL1 to BL8 are set at levels corresponding to the bits B1' to B8', respectively. Thus, the bits B1' to B8' are stored in the CAM cells 1_1 to 8_1 in the above-described manner.

Then, similar processing is carried out with respect to the other word lines WL3 to WL 256, which are thus sequentially switched from L-level to H-level so that data is stored in the CAM cells of each column.

In the case where two arbitrary columns are considered, the 8-bit data to be stored in the CAM cells of each column need to be of different values for the following reason. That is, if there are columns in which perfectly coincident 8-bit data is stored, multiple selection of the memory cells constituting the memory cell array 5 might cause an operation error.

After the data are stored in the CAM cells 1_1 to 8_256 as described above, decoding processing of the column address R can be carries out as follows.

Specifically, in carrying out decoding processing, the retrieval enable line S, the matching lines M1 to M256, and the word lines WL1 to WL8 are set at H-level. Then, the respective bits from the least significant bit to the most significant bit constituting the column address R supplied from the read address counter 113C shown in FIG. 11 are supplied to the bit lines BL1 to BL8, respectively. The processing for setting the matching lines M1 to M256 is carried out, for example, by the column driver 104C.

For example, it is now assumed that the column address R supplied from the read address counter 113C is expressed by b1, b2, b3, b4, b5, b6, b7, b8 from the least significant bit, and that data coincident with the data b1, b2, b3, b4, b5, b6, b7, b8 are stored in the CAM cells 1_J to 8_J of the J-th column while data not coincident with b1 to b8 are stored in the CAM cells of the other columns. Then, only the matching line M#J is maintained at H-level and the other matching lines are switched to L-level. Thus, in the column driver 104C, only the column switch $107_J$ is turned on and the data is read from the memory cells of the J-th column constituting the memory cell array 5 of FIG. 11.

The DRAM chip of FIG. 8 has the two column decoders 3C and 103C which generate different decoding results. By utilizing this structure, it is possible to arbitrarily rearrange the order of pixels constituting an image, that is, to carry out shuffling.

Figure 14:
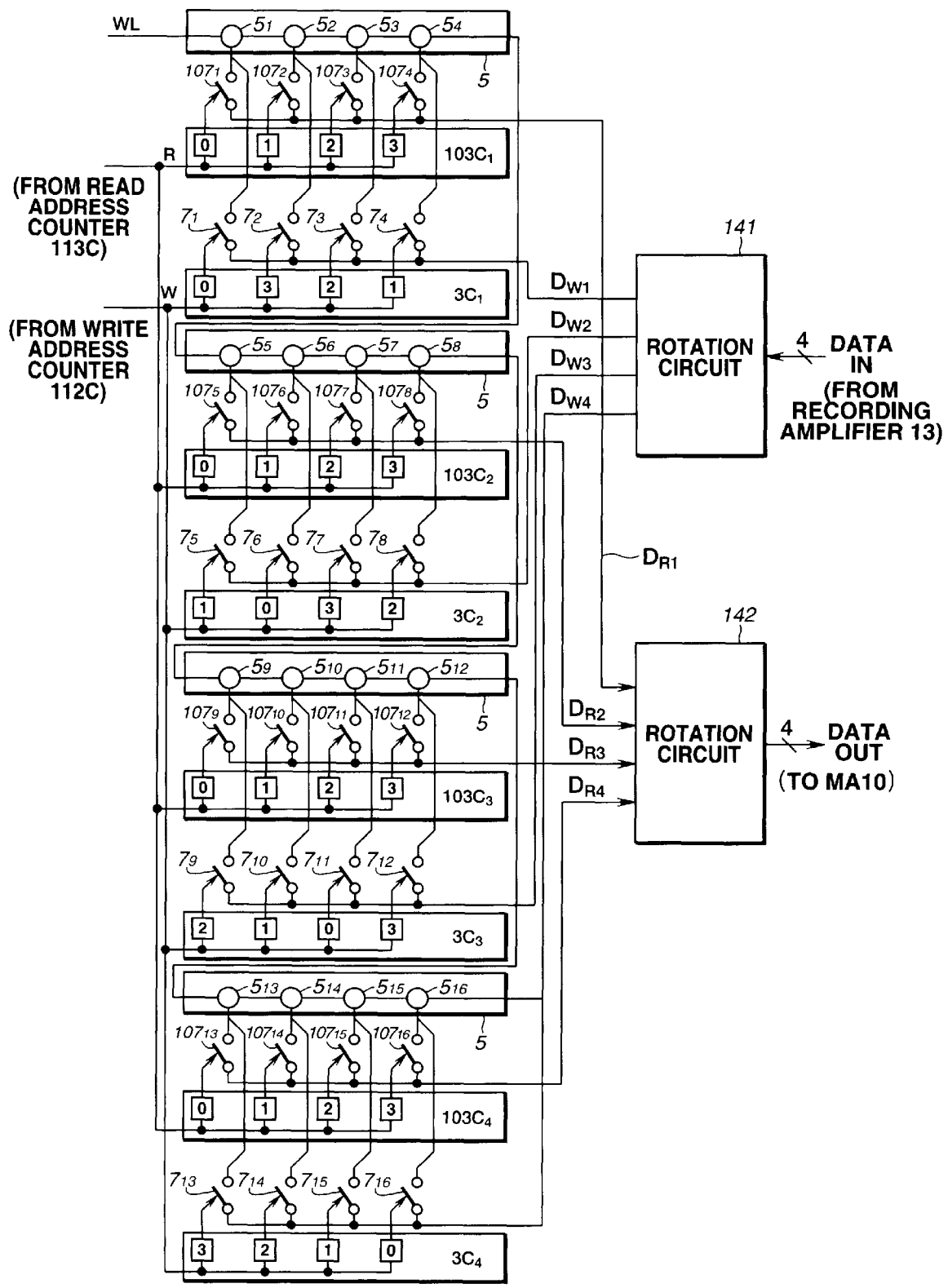
FIG. 14 is a block diagram showing an exemplary structure of a first embodiment of a DRAM chip to which the present invention is applied.

FIG. 14 shows an exemplary structure of an embodiment of a DRAM chip which can be applied to a rearrangement device for rearranging the order of pixels constituting an image to an arbitrary order. In FIG. 14, portions corresponding to those of FIG. 8 are denoted by the same numerals. That is, the DRAM chip of FIG. 14 is constituted basically similarly to the DRAM chip of FIG. 8, except that rotation circuits 141 and 142 are additionally provided.

In FIG. 14, however, buffers 1R and 1C, a row address latch circuit 2R, a row decoder 3R, a row driver 4R, a column driver 4C, a sense amplifier group 6, an ATD circuit 8, an AND gate 9, a MA 10, an output buffer 11, an input buffer 12, a recording amplifier 13, a column driver 104C, an ATD circuit 108, an AND gate 109, a write address counter 112C and a read address counter 113C are not shown.

In FIG. 14, four write buses $D_{W1}$, $DW_2$, $D_{W3}$ and $D_{W4}$ are shown in place of the data bus $D_W$ of FIG. 8, and four read buses $D_{R1}$, $D_{R2}$, $D_{R3}$ and $D_{R4}$ are shown in place of the data bus $D_R$ of FIG. 8. One end of the write bus $D_{W1}$ is connected to column switches $7_1$ to $7_4$. One end of the write bus $D_{W2}$ is connected to column switches $7_5$ to $7_8$. One end of the write bus $D_{W3}$ is connected to column switches $7_9$ to $7_{12}$. One end of the write bus $D_{W4}$ is connected to column switches $7_{13}$ to $7_{16}$. The other ends of these write buses are connected to the rotation circuit 141. On the other hand, one end of the read bus $D_{R1}$ is connected to column switches $107_1$ to $107_4$. One end of the read bus $D_{R2}$ is connected to column switches $107_5$ to $107_8$. One end of the read bus $D_{R3}$ is connected to column switches $107_9$ to $107_{12}$. One end of the read bus $D_{R4}$ is connected to column switches $107_{13}$ to $107_{16}$. The other ends of these read buses are connected to the rotation circuit 142.

Moreover, in FIG. 14, four column decoders $3C_1$, $3C_2$, $3C_3$ and $3C_4$ are shown in place of the column decoder 3C of FIG. 8, and four column decoders $103C_1$, $103C_2$, $103C_3$ and $103C_4$ are shown in place of the column decoder 103C of FIG. 8. The column decoder $3C_1$ controls the column switches $7_1$ to $7_4$. The column decoder $3C_2$ controls the column switches $7_5$ to $7_8$. The column decoder $3C_3$ controls the column switches $7_9$ to $7_{12}$. The column decoder $3C_4$ controls the column switches $7_{13}$ to $7_{16}$ The column decoder $103C_1$ controls the column switches $107_1$ to $107_4$. The column decoder $103C_2$ controls the column switches $107_5$ to $107_8$. The column decoder $103C_3$ controls the column switches $107_9$ to $107_{12}$. The column decoder $103C_4$ controls the column switches $107_{13}$ to $107_{16}$.

Specifically, the column decoder $3C_1$ turns on the column switches $7_1$ to $7_4$ to connect the write bus $D_{W1}$ and memory cells $5_1$ to $5_4$ of the memory cell array 5, only when 0, 3, 2, 1 is supplied as the column address W to the column decoder $3C_1$.

In FIG. 14, 16 memory cells $5_1$ to $5_{16}$ are shown and one memory cell $5_i$ represents a memory cell necessary for storing one pixel. To simplify the explanation, it is assumed that one bit is allocated to one pixel and therefore that one memory cell $5_i$ is equal to one memory cell. In FIG. 14, the 16 memory cells $5_1$ to $5_{16}$ are provided, for example, on the same word line WL. Therefore, in the case where data reading/writing is to be carried out with respect to the memory cells $5_1$ to $5_{16}$, since the row address is constant, the row address will not be explained further in the following description.

The column decoder $3C_2$ turns on the column switches $7_5$ to $7_8$ to connect the write bus $D_{W2}$ and memory cells $5_5$ to $5_8$ of the memory cell array 5, only when 1, 0, 3, 2 is supplied as the column address W to the column decoder $3C_2$. The column decoder $3C_3$ turns on the column switches $7_9$ to $7_{12}$ to connect the write bus $D_{W3}$ and memory cells $5_9$ to $5_{12}$ of the memory cell array 5, only when 2, 1, 0, 3 is supplied as the column address W to the column decoder $3C_3$. The column decoder $3C_4$ turns on the column switches $7_{13}$ to $7_{16}$ to connect the write bus $D_{W4}$ and memory cells $5_{13}$ to $5_{16}$ of the memory cell array 5, only when 3, 2, 1, 0 is supplied as the column address W to the column decoder $3C_4$.

The column decoder $103C_1$ turns on the column switches $107_1$ to $107_4$ to connect the read bus $D_{R1}$ and the memory cells $5_1$ to $5_4$ of the memory cell array 5, only when 0 to 3 is supplied as the column address R to the column decoder $103C_1$. The column decoder $103C_2$ turns on the column switches $107_5$ to $107_8$ to connect the read bus $D_{R2}$ and the memory cells $5_5$ to $5_8$ of the memory cell array 5, only when 0 to 3 is supplied as the column address R to the column decoder $103C_2$. The column decoder $103C_3$ turns on the column switches $107_9$ to $107_{12}$ to connect the read bus $D_{R3}$ and the memory cells $5_9$ to $5_{12}$ of the memory cell array 5, only when 0 to 3 is supplied as the column address R to the column decoder $103C_3$. The column decoder $103C_4$ turns on the column switches $107_{13}$ to $107_{16}$ to connect the read bus $D_{R4}$ and the memory cells $5_{13}$ to $5_{16}$ of the memory cell array 5, only when 0 to 3 is supplied as the column address R to the column decoder $103C_4$.

The rotation circuit 141 rotates four pixels as parallel data supplied from the recording amplifier 13 (not shown in FIG. 14) by a predetermined number of pixels and outputs the rotated four pixels to the write buses $D_{W1}$ to $D_{W4}$, respectively.

The rotation circuit 142 rotates a total of four pixels from the read buses $D_{R1}$ to $D_{R4}$ by a predetermined number of pixels and outputs the rotated four pixels to the MA 10 (not shown in FIG. 14).

Figure 15:
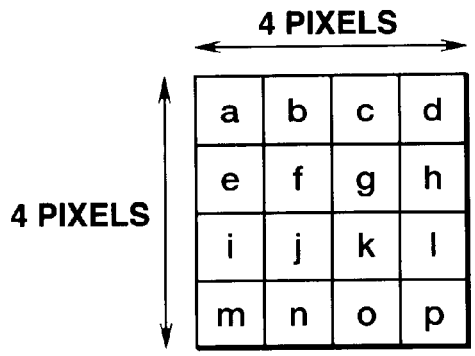
FIG. 15 is a view showing an image as a target of pixel rearrangement.

The operation of the DRAM chip of FIG. 14 will now be described. To simplify the description, it is now assumed that an image constituted by 4×4 (horizontal×vertical) pixels as shown in FIG. 15 is supplied as an image of one frame. It is also assumed that the pixels constituting the image of FIG. 15 are supplied every four pixels as a unit in the so-called line scan order. Specifically, the DRAM chip of FIG. 14 is first supplied with pixels a, b, c, d, then supplied with pixels e, f, g, h, then supplied with pixels i, j, k, l, and finally supplied with pixels m, n, o, p.

Figure 16:
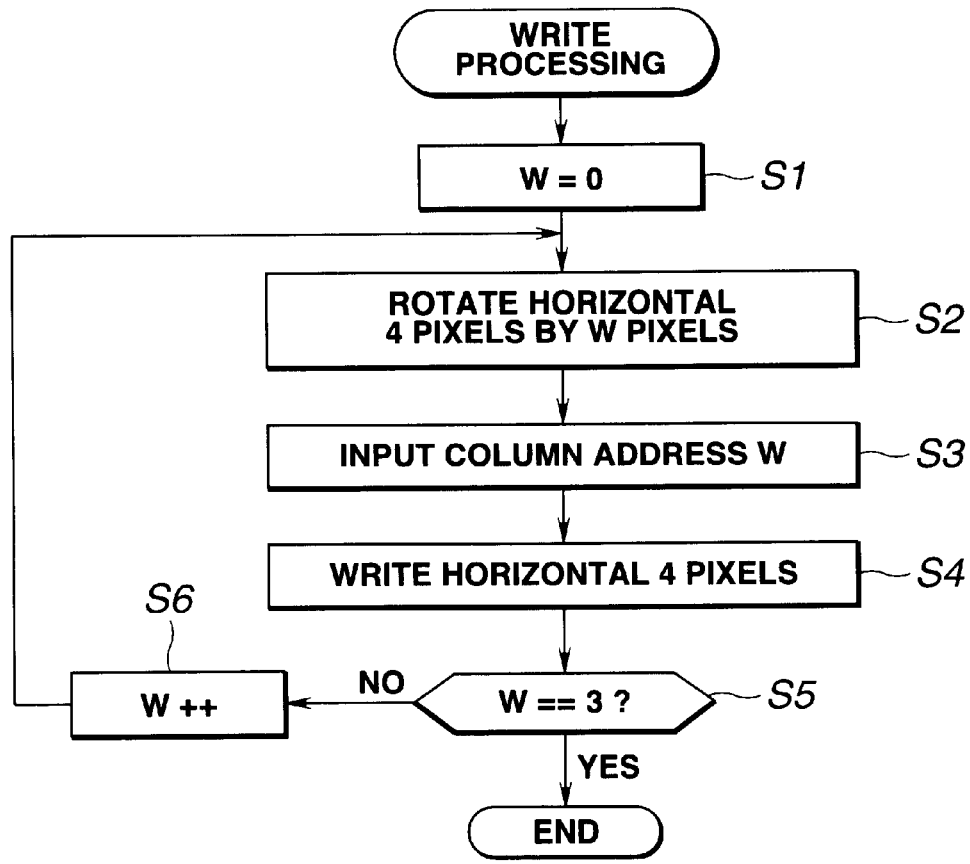
FIG. 16 is a flowchart for explaining write processing in the DRAM chip of FIG. 14.

Referring to the flowchart of FIG. 16, the image write processing will now be described.

In the DRAM chip of FIG. 14 at the time of image writing, first, at step S1, the column address W is set at 0 as an initial value. When four pixels of the (W+1)th row of the image shown in FIG. 15 are supplied to the rotation circuit 141, the processing goes to step S2.

At step S2, the rotation circuit 141 rotates the four pixels supplied thereto by W pixels. The rotated four pixels are outputted to the write buses $D_{W1}$ to $D_{W4}$, respectively.

After that, at step S3, the column decoders $3C_1$ to $3C_4$ are supplied with the column address W and decode the column address W. As the decoding results, the column decoders $3C_1$ to $3C_4$ turn on one of the column switches $7_1$ to $7_4$, one of the column switches $7_5$ to $7_8$, one of the column switches $7_9$ to $7_{12}$, and one of the column switches $7_{13}$ to $7_{16}$, respectively. Thus, the write buses $D_{W1}$ to $D_{W4}$ are connected to memory cell groups, respectively.

Next, at step S4, the respective pixels on the write buses $D_{W1}$ to $D_{W4}$ are supplied to and stored in the connected memory cell groups. That is, writing is carried out.

Then, at step S5, the DRAM chip of FIG. 14 discriminates whether or not the column address W is coincident with the number of columns–1of the image of FIG. 15, that is, 4−1=3. If it is discriminated at step S5 that the column address W is not equal to 3, the processing of the DRAM chip of FIG. 14 goes to step S6, where increment of the column address W by 1 is made. In the DRAM chip at step S6, when four pixels of the next row are supplied to the rotation circuit 141, the processing returns to step S2, and the processing of step S2 and subsequent steps is repeated.

If it is discriminated at step S5 that the column address W is equal to 3, that is, if all the pixels a to p constituting the image of one frame consisting of 4×4 pixels shown in FIG. 15 are written in the memory cell array 5, the processing in the DRAM chip of FIG. 14 ends.

Figure 17:
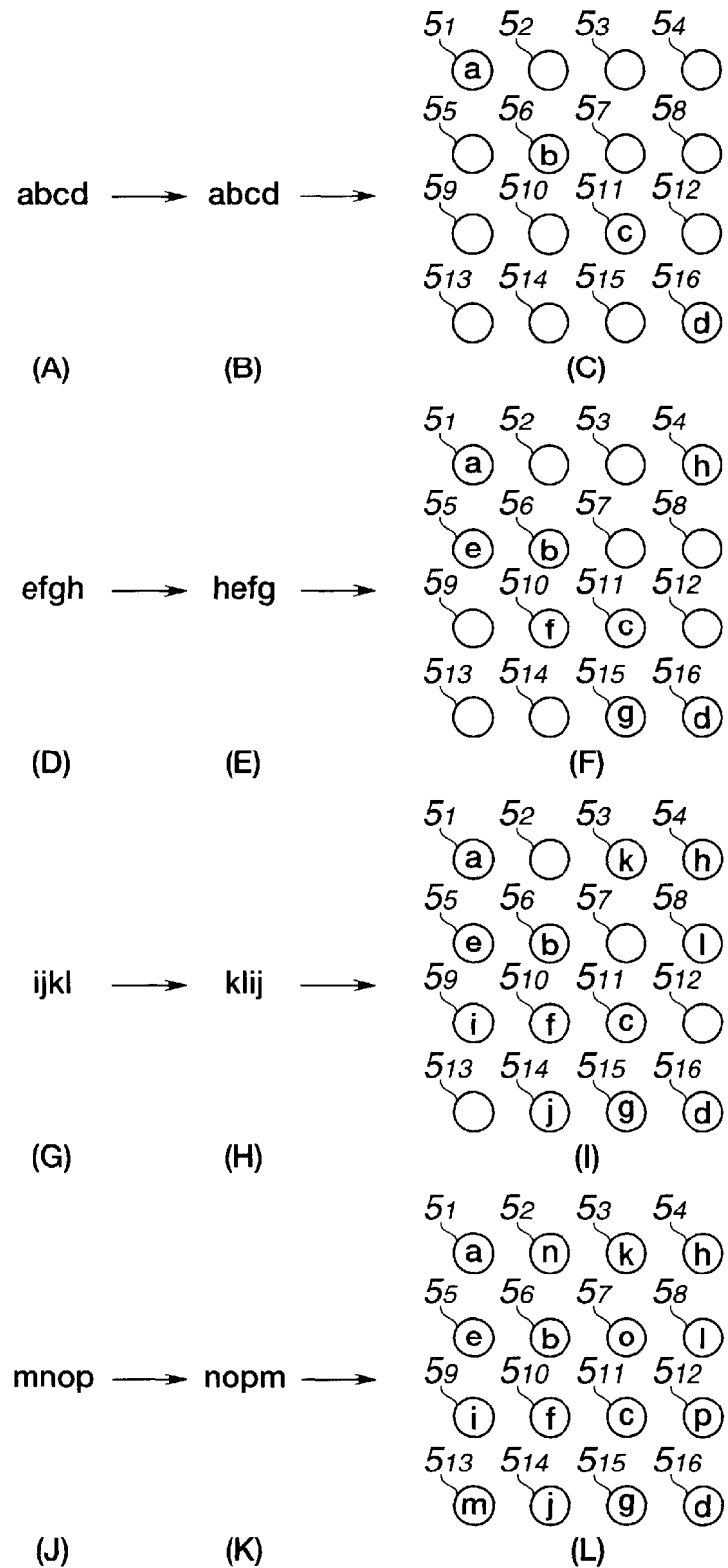
FIG. 17 is a view for explaining the write processing in the DRAM chip of FIG. 14.

According to the above-described write processing, the pixels a to p shown in FIG. 15 are written in the memory cell array 5 as shown in FIG. 17.

Specifically, in the case where the column address W is 0, the rotation circuit 141 is supplied with the pixels a, b, c, d of the first row of the image of FIG. 15, as shown in (A) of FIG. 17. In this case, the rotation circuit 141 rotates the arrangement of the pixels a, b, c, d, for example, rightward by 0 pixel. That is, in this case, the arrangement of the pixels a, b, c, d is kept as it is as shown in (B) of FIG. 17 and then outputted from the rotation circuit 141. Of the pixels a, b, c, d, the leftmost pixel a is outputted to the write bus $D_{W1}$, and the second pixel b from the left is outputted to the write bus $DW_2$. The third pixel c from the left is outputted to the write bus $D_{W3}$, and the rightmost pixel d is outputted to the write bus $D_{W4}$.

Meanwhile, in the DRAM chip of FIG. 14, where the column address is 0, the decoders $3C_1$ to $3C_4$ turn on the column switches $7_1$, $7_6$, $7_{11}$, $7_{16}$, respectively, as the decoding results of the column address W, as described above.

Therefore, the pixels a to d on the write buses $D_{W1}$ to $D_{W4}$ are supplied to and stored in the memory cells $5_1$, $5_6$, $5_{11}$, $5_{16}$ through the column switches $7_1$, $7_6$, $7_{11}$, $7_{16}$, as shown in (C) of FIG. 17.

When the column address W is 1, the rotation circuit 141 is supplied with the pixels e, f, g, h of the second row of the image of FIG. 15, as shown in (D) of FIG. 17. In this case, the rotation circuit 141 rotates the arrangement of the pixels e, f, g, h, for example, rightward by one pixel. That is, in this case, the arrangement of the pixels e, f, g, h is changed to the arrangement of the pixels h, e, f, g as shown in (E) of FIG. 17 and then outputted from the rotation circuit 141. Of the pixels h, e, f, g, the leftmost pixel h is outputted to the write bus $D_{W1}$, and the second pixel e from the left is outputted to the write bus $D_{W2}$. The third pixel f from the left is outputted to the write bus $D_{W3}$, and the rightmost pixel g is outputted to the write bus $DW_4$.

Meanwhile, in the DRAM chip of FIG. 14, where the column address W is 1, the decoders $3C_1$ to $3C_4$ turn on the column switches $7_4$, $7_5$, $7_{10}$, $7_{15}$, respectively, as the decoding results of the column address W, as described above.

Therefore, the pixels h, e, f, g on the write buses $D_{W1}$, to $D_{W4}$ are supplied to and stored in the memory cells $5_4$, $5_5$, $5_{10}$, $5_{15}$ through the column switches $7_4$, $7_5$, $7_{10}$, $7_{15}$, as shown in (F) of FIG. 17.

When the column address W is 2, the rotation circuit 141 is supplied with the pixels i, j, k, l of the third row of the image of FIG. 15, as shown in (G) of FIG. 17. In this case, the rotation circuit 141 rotates the arrangement of the pixels i, j, k, l, for example, rightward by two pixels. That is, in this case, the arrangement of the pixels i, j, k, l is changed to the arrangement of the pixels k, l, i, j as shown in (H) of FIG. 17 and then outputted from the rotation circuit 141. Of the pixels k, l, i, j, the leftmost pixel k is outputted to the write bus $D_{W1}$ and the second pixel l from the left is outputted to the write bus $D_{W2}$. The third pixel i from the left is outputted to the write bus $D_{W3}$, and the rightmost pixel j is outputted to the write bus $D_{W4}$.

Meanwhile, in the DRAM chip of FIG. 14, where the column address W is 2, the decoders $3C_1$ to $3C_4$ turn on the column switches $7_3$, $7_8$, $7_9$, $7_{14}$, respectively, as the decoding results of the column address W, as described above.

Therefore, the pixels k, l, i, j on the write buses $D_{W1}$ to $D_{W4}$ are supplied to and stored in the memory cells $5_3$, $5_8$, $5_9$, $5_{14}$ through the column switches $7_3$, $7_8$, $7_9$, $7_{14}$, as shown in (I) of FIG. 17.

When the column address W is 3, the rotation circuit 141 is supplied with the pixels m, n, o, p of the fourth row of the image of FIG. 15, as shown in (J) of FIG. 17. In this case, the rotation circuit 141 rotates the arrangement of the pixels m, n, o, p, for example, rightward by three pixels. That is, in this case, the arrangement of the pixels m, n, o, p is changed to the arrangement of the pixels n, o, p, m as shown in (K) of FIG. 17 and then outputted from the rotation circuit 141. Of the pixels n, o, p, in, the leftmost pixel n is outputted to the write bus $D_{W1}$, and the second pixel o from the left is outputted to the write bus $D_{W2}$. The third pixel p from the left is outputted to the write bus $D_{W3}$, and the rightmost pixel m is outputted to the write bus $D_{W4}$.

Meanwhile, in the DRAM chip of FIG. 14, where the column address W is 3, the decoders $3C_1$ to $3C_4$ turn on the column switches $7_2$, $7_7$, $7_{12}$, $7_{13}$, respectively, as the decoding results of the column address W, as described above.

Therefore, the pixels n, o, p, m on the write buses $D_{W1}$ to $D_{W4}$ are supplied to and stored in the memory cells $5_2$, $5_7$, $5_{12}$, $5_{13}$ through the column switches $7_2$, $7_7$, $7_{12}$, $7_{13}$ as shown in (L) of FIG. 17.

Figure 18:
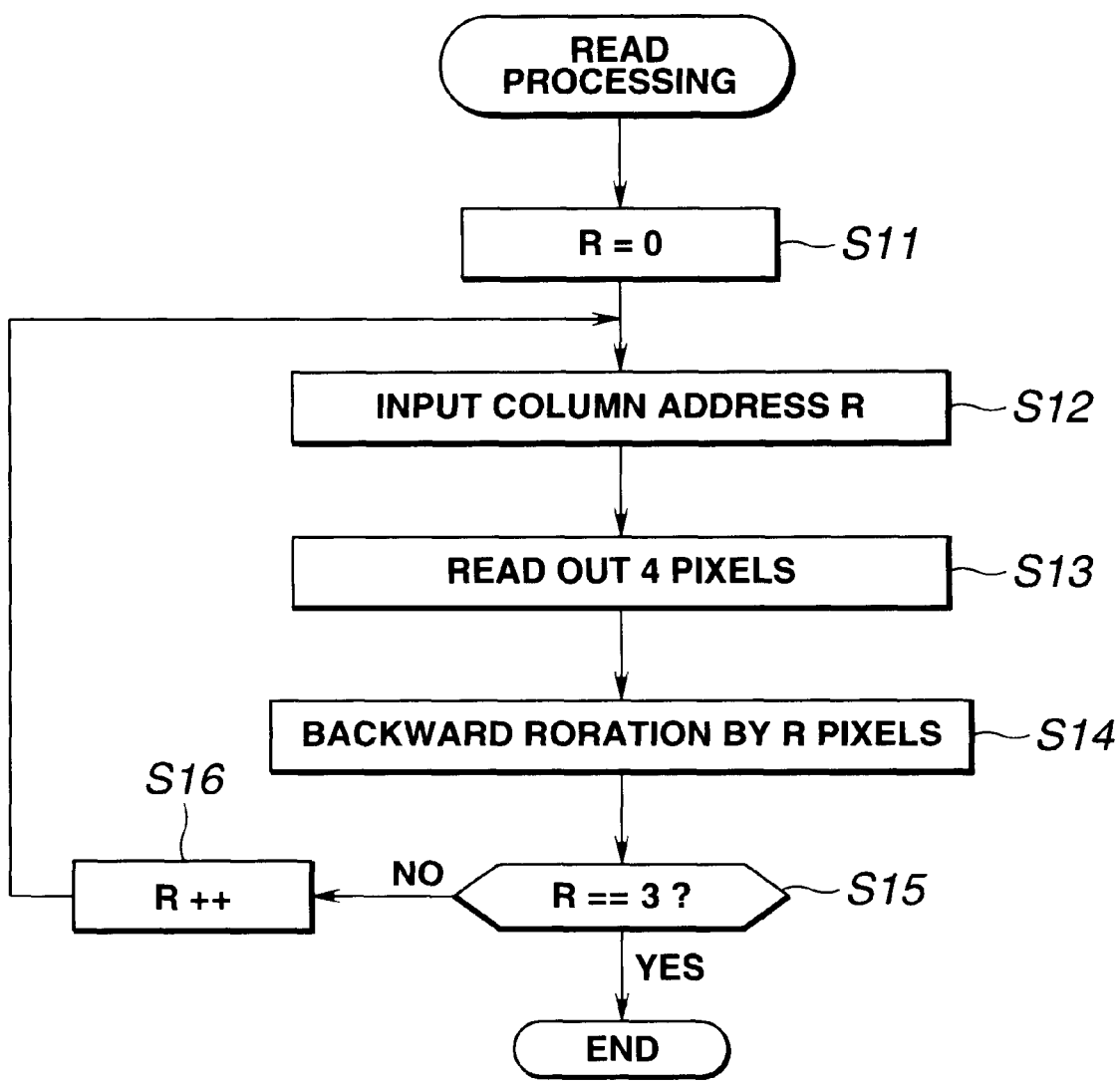
FIG. 18 is a flowchart for explaining read processing in the DRAM chip of FIG. 14.

Referring to the flowchart of FIG. 18, the read processing of the pixels a to p thus written in the memory cell array 5 will now be described.

In the DRAM chip of FIG. 14 at the time of image reading, first, at step S11, the column address R is set at 0 as an initial value and the processing goes to step S12.

In the DRAM chip of FIG. 14 at step S12, the column address R is supplied to the column decoders $103C_1$ to $103C_4$. The column decoders $103C_1$ to $103C_4$ decode the column address R and as the decoding results, turn on one of the column switches $107_1$ to $107_4$, one of the column switches $107_5$ to $107_8$, one of the column switches $107_9$ to $107_{12}$, and one of the column switches $107_{13}$ to $107_{16}$, respectively. Thus, the read buses $D_{R1}$ to $D_{R4}$ are connected to memory cell groups, respectively.

Then, at step S13, the pixels stored in the memory cell groups connected to the read buses $D_{R1}$ to $D_{R4}$ are outputted to the read buses $D_{R1}$ to $D_{R4}$. That is, reading is carried out.

A total of four pixels outputted on the read buses $D_{R1}$ to $D_{R4}$ are supplied to the rotation circuit 142. At step S14, the rotation circuit 142 rotates the four pixels from the read buses $D_{R1}$ to $D_{R4}$ by R pixels in the direction opposite to the write processing described in FIG. 16 (hereinafter suitable referred to as backward rotation), and outputs the rotated four pixels.

Then, at step S15, the DRAM chip of FIG. 14 discriminates whether or not the column address R is equal the number of columns−1 of the image of FIG. 15. If it is discriminated at step S15 that the column address R is not equal to 3, the processing of the DRAM chip goes to step S16, where increment of the column address R by 1 is made. After that, the processing returns to step S12, and the processing of step S12 and subsequent steps is repeated.

If it is discriminated at step S15 that the column address R is equal to 3, that is, if all the pixels a to p constituting the image of one frame consisting of 4×4 pixels shown in FIG. 15 are read from the memory cell array 5, the processing in the DRAM chip of FIG. 14 ends.

Figure 19:
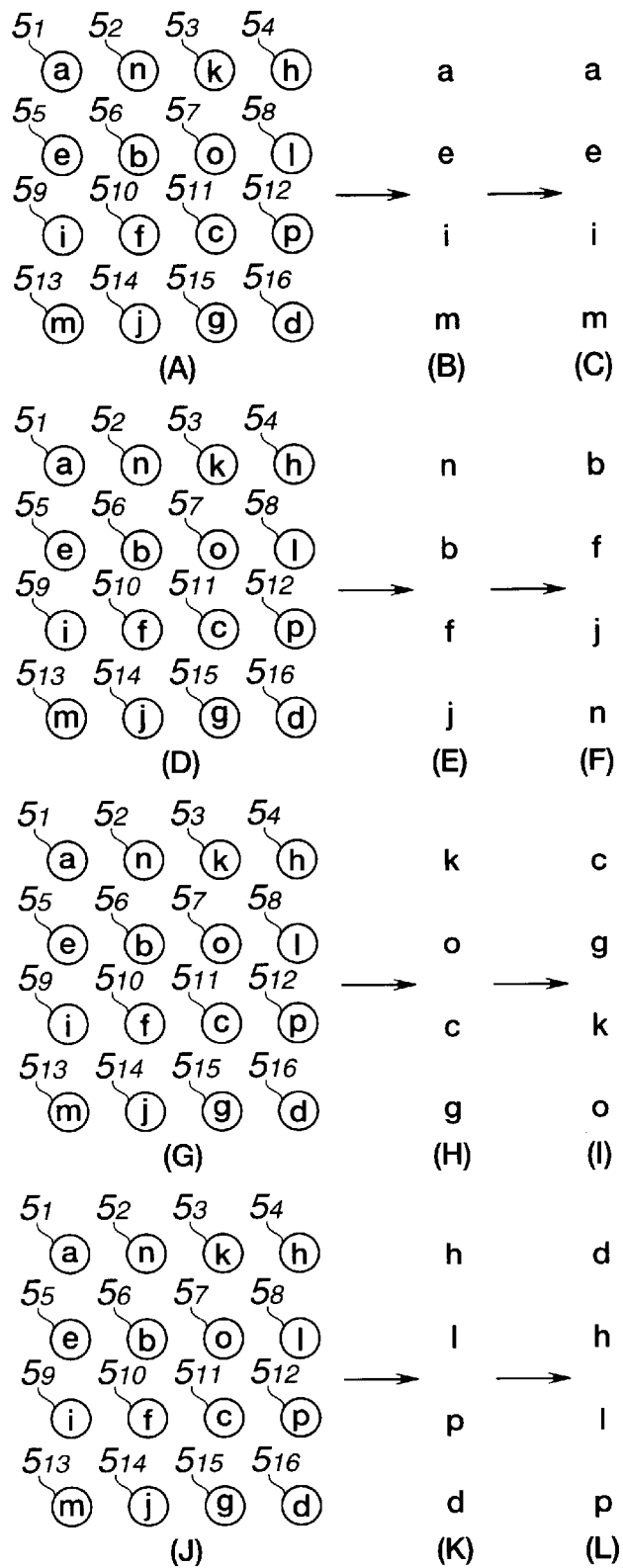
FIG. 19 is a view for explaining the read processing in the DRAM chip of FIG. 14.

According to the above-described read processing, the pixels a to p stored in the memory cell array as shown in (L) of FIG. 17 are read from the memory cell array 5 as shown in FIG. 19.

Specifically, in the DRAM chip of FIG. 14 in the case where the column address R is 0, the decoders $103C_1$ to $103C_4$ turn on the column switches $107_1$, $107_5$, $107_9$, $107_{13}$ as the decoding results of the column address R, as described above. Therefore, of the memory cells $5_1$ to $5_{16}$ shown in (A) of FIG. 19, the pixels a, e, i, m stored in the memory cells $5_1$, $5_5$, $5_9$, $5_{13}$, respectively, are outputted onto the read buses $D_{R1}$ to $D_{R4}$ through the column switches $107_1$, $107_5$, $107_9$, $107_{13}$, as shown in (B) of FIG. 19.

The pixels a, e, i, m on the read buses $D_{R1}$ to $D_{R4}$ are received by the rotation circuit 142. The rotation circuit 142 backwardly rotates the arrangement of the received pixels a, e, i, m by 0 pixel in the leftward direction, which is opposite to the direction in the rotation circuit 141. That is, in this case, the arrangement of the pixels a, e, i, m is kept as it is as shown in (C) of FIG. 19 and then outputted from the rotation circuit 142.

When the column address R is 1, the decoders $103C_1$ to $103C_4$ in the DRAM chip of FIG. 14 turn on the column switches $107_2$, $107_6$, $107_{10}$, $107_{14}$ as the decoding results of the column address R, as described above. Therefore, of the memory cells $5_1$ to $5_{16}$ shown in (D) of FIG. 19, the pixels n, b, f, j stored in the memory cells $5_2$, $5_6$, $5_{10}$, $5_{14}$, respectively, are outputted onto the read buses $D_{R1}$ to $D_{R4}$ through the column switches $107_2$, $107_6$, $107_{10}$, $107_{14}$, as shown in (E) of FIG. 19.

The pixels n, b, f, j on the read buses $D_{R1}$ to $D_{R4}$ are received by the rotation circuit 142. The rotation circuit 142 backwardly rotates the arrangement of the received pixels n, b, f, j by one pixel. That is, in this case, the arrangement of the pixels n, b, f, j is changed to the arrangement of the pixels b, f, j, n as shown in (F) of FIG. 19 and then outputted from the rotation circuit 142.

When the column address R is 2, the decoders $103C_1$ to $103C_4$ in the DRAM chip of FIG. 14 turn on the column switches $107_3$, $107_7$, $107_{11}$, $107_{15}$ as the decoding results of the column address R, as described above. Therefore, of the memory cells $5_1$ to $5_{16}$ shown in (G) of FIG. 19, the pixels k, o, c, g stored in the memory cells $5_3$, $5_7$, $5_{11}$, $5_{15}$, respectively, are outputted onto the read buses $D_{R1}$ to $D_{R4}$ through the column switches $107_3$, $107_7$, $107_{11}$, $107_{15}$, as shown in (H) of FIG. 19.

The pixels k, o, c, g on the read buses $D_{R1}$ to $D_{R4}$ are received by the rotation circuit 142. The rotation circuit 142 backwardly rotates the arrangement of the received pixels k, o, c, g by two pixels. That is, in this case, the arrangement of the pixels k, o, c, g is changed to the arrangement of the pixels c, g, k, o as shown in (I) of FIG. 19 and then outputted from the rotation circuit 142.

When the column address R is 3, the decoders $103C_1$ to $103C_4$ in the DRAM chip of FIG. 14 turn on the column switches $107_4$, $107_8$, $107_{12}$, $107_{16}$ as the decoding results of the column address R, as described above. Therefore, of the memory cells $5_1$ to $5_{16}$ shown in (J) of FIG. 19, the pixels h, l, p, d stored in the memory cells $5_4$, $5_8$, $5_{12}$, $5_{16}$, respectively, are outputted onto the read buses $D_{R1}$ to $D_{R4}$ through the column switches $107_4$, $107_8$, $107_{12}$, $107_{16}$, as shown in (K) of FIG. 19.

The pixels h, l, p, d on the read buses $D_{R1}$ to $D_{R4}$ are received by the rotation circuit 142. The rotation circuit 142 backwardly rotates the arrangement of the received pixels h, l, p, d by three pixels. That is, in this case, the arrangement of the pixels h, l, p, d is changed to the arrangement of the pixels d, h, l, p as shown in (L) of FIG. 19 and then outputted from the rotation circuit 142.

Thus, in the DRAM chip of FIG. 14, the horizontal order of the pixels a, b, c, d, e, f, g, h, i, j, k, l, m, n, o, p is rearranged to the vertical order of the pixels a, e, i, m, b, f, j, n, c, g, k, o, d, h, l, p. That is, with the DRAM chip of FIG. 14, it is possible to rearrange the pixels without using any line memory or frame memory for address conversion, and therefore to avoid any increase in the size of the device and to realize quick processing.

In the DRAM chip of FIG. 14, since image data inputted in the line scan order, that is, inputted continuously in the horizontal direction, is converted to vertically continuous image data, a two-dimensional pixel block consisting of a desired number of horizontal and vertical pixels can be obtained without using a line memory or the like. Therefore, by applying this to a circuit which extracts a two-dimensional pixel block as a processing target for prediction tap or class tap extraction at a motion detection circuit for performing motion detection in MPEG or at a classification adaptive processing circuit for performing resolution imagination, miniaturization of that circuit can be realized.

The classification adaptive processing will now be described.

In the classification adaptive processing, adaptive processing for finding a prediction value of a pixel of an HD (high-density) is carried out using linear combination of an SD (standard-density) image with a prediction coefficient, thereby enabling restoration of high-frequency components that are not included in the SD image.

Specifically, for example, a prediction value E[y] of a pixel value y of a pixel constituting the HD image (hereinafter suitably referred to as HD pixel) is found by using a linear combination model prescribed by linear combination of pixel values $x_1$, $x_2$, ... (hereinafter suitably referred to as learning data) of several SD pixels (pixels constituting the SD image) with predetermined prediction coefficients $w_1$, $w_2$, ... In this case, the prediction value E[y] can be expressed by the following equation.

$$E[y] = w_1 x_1 + w_2 x_2 + \ldots \quad (1)$$

Thus, for generalization, a matrix W consisting of a set of prediction coefficients w, a matrix X consisting of a set of learning data, and a matrix Y' consisting of a set of prediction values E[y] are defined as follows.

$$X = \begin{bmatrix} x_{11} & x_{12} & \cdots & x_{1n} \\ x_{21} & x_{22} & \cdots & x_{2n} \\ \cdots & \cdots & \cdots & \cdots \\ x_{m1} & x_{m2} & \cdots & x_{mn} \end{bmatrix}$$

$$W = \begin{bmatrix} w_1 \\ w_2 \\ \cdots \\ w_n \end{bmatrix} \quad Y' = \begin{bmatrix} E[y_1] \\ E[y_2] \\ \cdots \\ E[y_m] \end{bmatrix}$$

From these matrices X, W and Y', the following observation equation is established.

$$XW = Y' \quad (2)$$

It is now considered to find a prediction value E[y] close to a pixel value y of the HD pixel by applying a minimum square method to this observation equation. In this case, a matrix Y consisting of a set of true pixel values y of the HD pixel, which is learning data, and a matrix E consisting of a set of residuals e of the prediction value E[y] with respect to the pixel value y of the HD pixel are defined as follows.

$$E = \begin{bmatrix} e_1 \\ e_2 \\ \ldots \\ e_m \end{bmatrix} \quad Y = \begin{bmatrix} y_1 \\ y_2 \\ \ldots \\ y_m \end{bmatrix}$$

From these matrices Y and E and the equation (2), the following residual equation is established.

$$XW = Y + E \quad (3)$$

In this case, a prediction coefficient $w_i$ for finding the prediction value E[y] close to the pixel value y of the HD pixel can be found by minimizing the square error of the following equation.

$$\sum_{i=1}^{m} e_i^2$$

Thus, in the case where the above-mentioned square error differentiated by the prediction coefficient $w_i$ is 0, the prediction coefficient $w_i$ satisfying the following equation is the optimum value for finding the prediction value E[y] close to the pixel value y of the HD pixel.

$$e_1 \frac{\partial e_1}{\partial w_i} + e_2 \frac{\partial e_2}{\partial w_i} + \ldots + e_m \frac{\partial e_m}{\partial w_i} = 0 \quad (4)$$

$$(i = 1, 2, \ldots, n)$$

Thus, first, the equation (3) is differentiated by the prediction coefficient $w_i$, thereby establishing the following equation.

$$\frac{\partial e_i}{\partial w_1} = x_{i1}, \quad \frac{\partial e_i}{\partial w_2} = x_{i2}, \ldots, \frac{\partial e_i}{\partial w_n} = x_{in} \quad (5)$$

$$(i = 1, 2, \ldots, m)$$

From the equations (4) and (5), the following equation (6) is obtained.

$$\sum_{i=1}^{m} e_i x_{i1} = 0, \sum_{i=1}^{m} e_i x_{i2} = 0, \ldots, \sum_{i=1}^{m} e_i x_{in} = 0 \quad (6)$$

Moreover, in consideration of the relation of the learning data x, prediction coefficient w, teacher data y and residual e in the residual equation (3), the following normal equations can be obtained from the equation (6).

$$\begin{bmatrix} \left(\sum_{i=1}^{m} x_{i1} x_{i1}\right) w_1 + \left(\sum_{i=1}^{m} x_{i1} x_{i2}\right) w_2 + \ldots + \left(\sum_{i=1}^{m} x_{i1} x_{in}\right) w_n = \left(\sum_{i=1}^{m} x_{i1} y_i\right) \\ \left(\sum_{i=1}^{m} x_{i2} x_{i1}\right) w_1 + \left(\sum_{i=1}^{m} x_{i2} x_{i2}\right) w_2 + \ldots + \left(\sum_{i=1}^{m} x_{i2} x_{in}\right) w_n = \left(\sum_{i=1}^{m} x_{i2} y_i\right) \\ \ldots \\ \left(\sum_{i=1}^{m} x_{in} x_{i1}\right) w_1 + \left(\sum_{i=1}^{m} x_{in} x_{i2}\right) w_2 + \ldots + \left(\sum_{i=1}^{m} x_{in} x_{in}\right) w_n = \left(\sum_{i=1}^{m} x_{in} y_i\right) \end{bmatrix}$$

The normal equations (7) can be formed for the same number as the number of prediction coefficients w to be found. Therefore, by solving the equations (7), the optimum prediction coefficient w can be found. However, to solve the equations (7), a matrix consisting of coefficients according to the prediction coefficients w must be a regular matrix in the equations (7). For example, a sweep method (Gauss-Jordan erasure method) can be applied for solving the equations (7).

The adaptive processing is to find the optimum prediction coefficient w in the above-described manner and then to find the prediction value E[y] close the pixel value y of the HD pixel according to the equation (1) using the prediction coefficient The adaptive processing differs from interpolation processing in that components included in the HD image but not included in the SD image are reproduced. Specifically, as far as the equation (1) is concerned, the adaptive processing is the same as the interpolation processing using a so-called interpolation filter. However, since the prediction coefficient w corresponding to the tap coefficient of the interpolation filter is found by so-called learning using the teacher data y, components included in the HD image can be reproduced. That is, according to the adaptive processing, an image of high resolution can be easily obtained. This means that the adaptive processing has an effect of image creation (resolution imagination).

Figure 20:
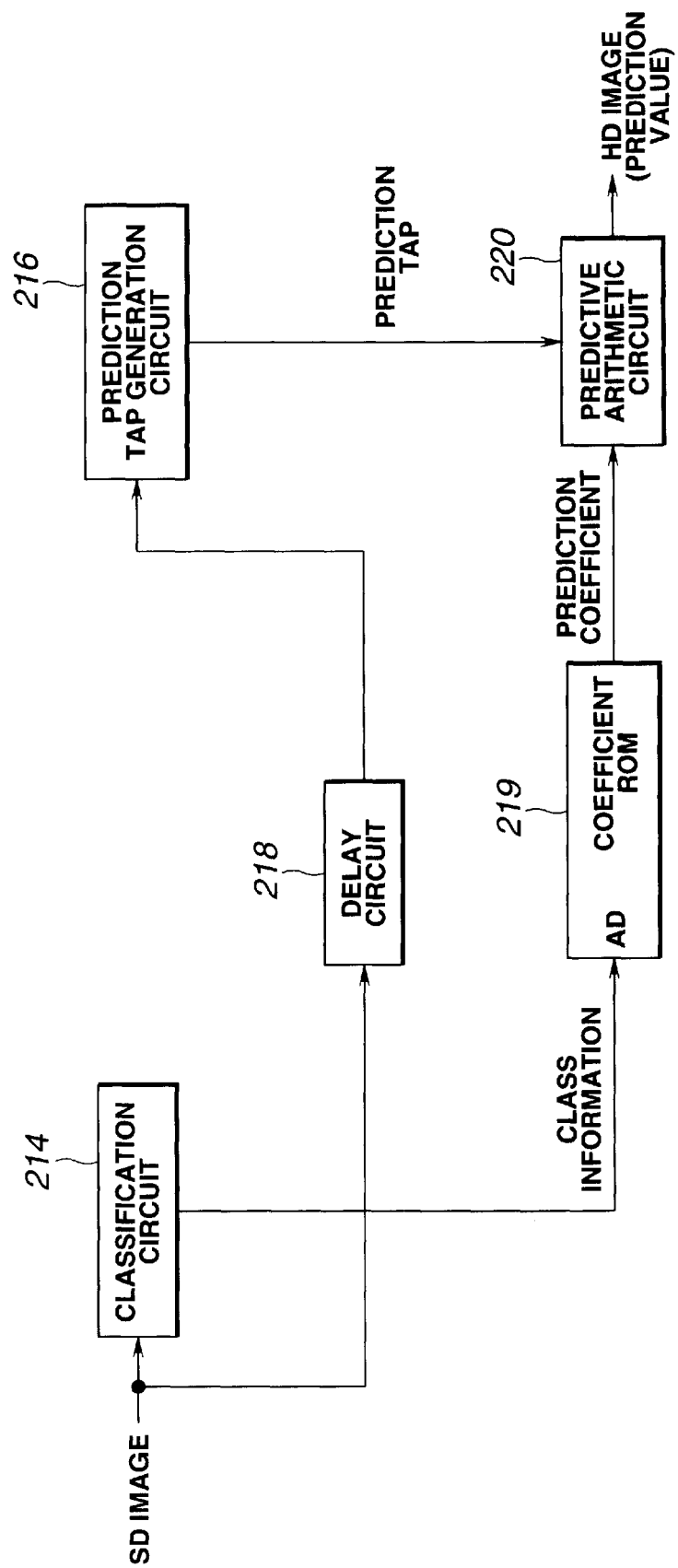
FIG. 20 is a block diagram showing an exemplary structure of a classification adaptive processing circuit.

FIG. 20 shows an exemplary structure of a classification adaptive processing circuit for converting an SD image to an HD image by the above-described adaptive processing.

The SD image is supplied to a classification circuit 214 and a delay circuit 218. The classification circuit 214 classifies an HD pixel for which a prediction value is to be found by the adaptive processing (hereinafter suitably referred to as noted pixel) into a predetermined class on the basis of the SD image.

The classification circuit 214 first extracts from the SD image a class tap consisting of SD pixels at a distance of a predetermined value or less from the noted pixel, as SD pixels on the periphery of the noted pixel, and then supplies values allocated in advance to pixel value patterns of, for example, all the SD pixels constituting the class tap, as the class of the noted pixel to an address terminal (AD) of a coefficient ROM (read-only memory) 219.

Figure 21:
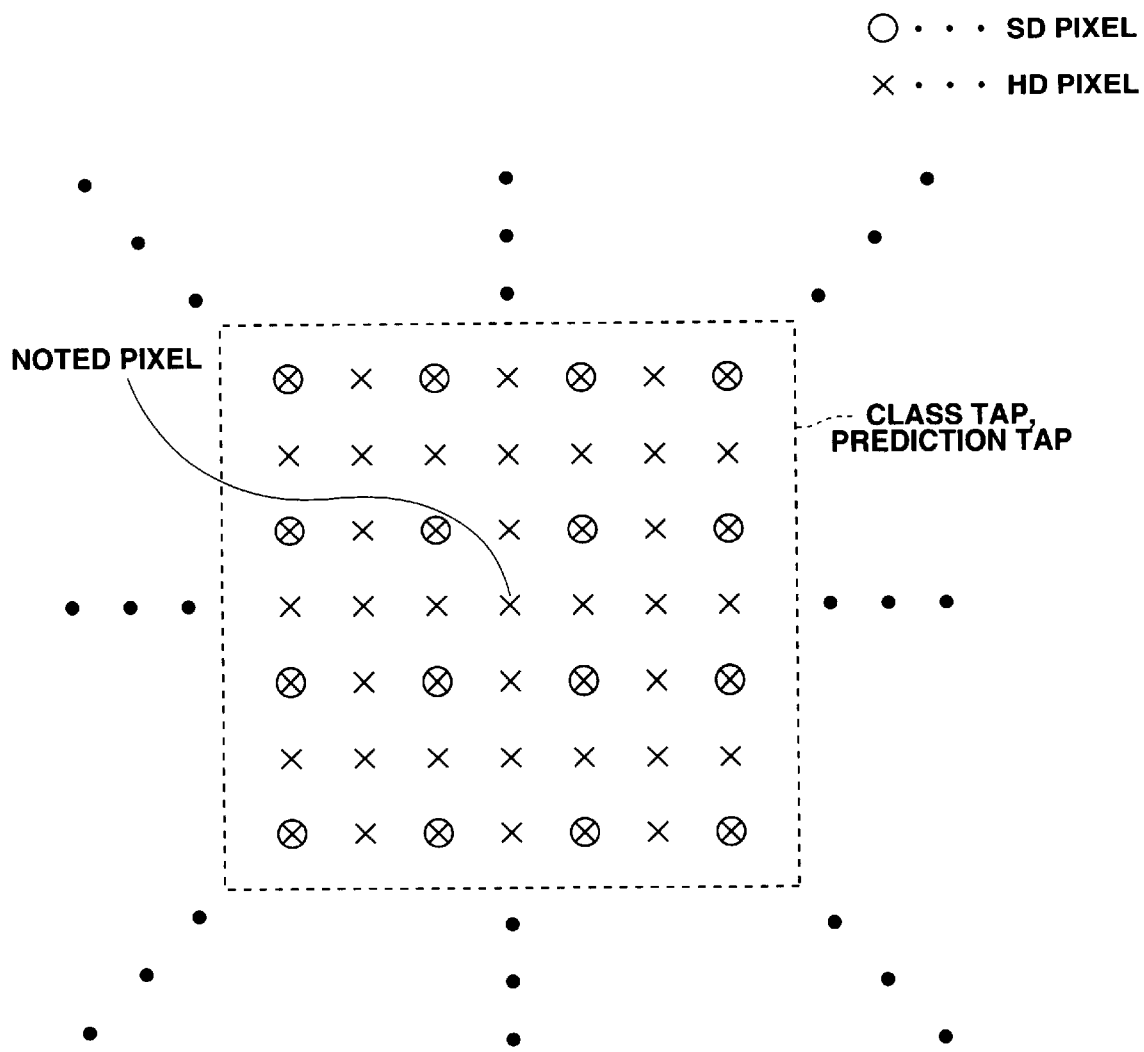
FIG. 21 is a view for explaining the processing of a classification circuit 14 of FIG. 20.

Specifically, the classification circuit 214 extracts from the SD image a class tap consisting of 4×4 SD pixels (indicated by ○ in FIG. 21) around the noted pixel, as shown in FIG. 21, and outputs values corresponding to the pixel value patterns of these 16 SD pixels as the class of the noted pixel.

In the case where a large number of bits such as 8 bits are allocated to express the pixel value of each SD pixel, the number of pixel value patterns of the 16 SD pixels is $(2^8)^{16}$, which is extremely large and makes it difficult to quicken the subsequent processing.

Thus, as preprocessing prior to the classification, for example, ADRC (adaptive dynamic range coding) processing for reducing the number of bits of the SD pixels constituting the class tap is performed on the class tap.

Specifically, in the ADRC processing, first, the SD pixel of the maximum pixel value (hereinafter referred to as maximum pixel) and the SD pixel of the minimum pixel value (hereinafter referred to as minimum pixel) are detected from the 16 SD pixels constituting the class tap. Then, the difference DR (=MAX−MIN) between the pixel value MAX of the maximum pixel and the pixel value MIN of the minimum pixel is calculated, and this difference DR is used as a local dynamic range of the class tap so as to re-quantize each pixel value constituting the class tap to K bits, which is less than the original number of allocated bits, on the basis of the dynamic range DR. In short, in the ADRC processing, the pixel value MIN of the minimum pixel is subtracted from the pixel value of each pixel constituting the class tap, and each subtraction value is divided by $D/2^K$.

As a result, the pixel value of each pixel constituting the class tap is expressed by K bits. Therefore, in the case where K is equal to 1, the number of pixel value patterns of the 16 SD pixels is $(2^1)^{16}$, which is much smaller than in the case where the ADRC processing is not carried out.

The coefficient ROM 219 stores, for each class, the prediction coefficients found by learning in advance. When a class is supplied from the classification circuit 214, the coefficient ROM 219 reads the prediction coefficient stored at the address corresponding to the class and supplies the prediction coefficient to a predictive arithmetic circuit 220.

Meanwhile, the delay circuit 218 delays the SD image by the time necessary for making coincidence between the timing for supplying the prediction coefficient from the coefficient ROM 219 to the predictive arithmetic circuit 220 and the timing for supplying a prediction tap from a prediction tap generation circuit 216, which will be later described, and supplies the delayed SD image to the prediction tap generation circuit 216.

The prediction tap generation circuit 216 extracts, from the SD image supplied thereto, SD pixels used for finding the prediction value of the noted pixel at the predictive arithmetic circuit 220, and supplies the extracted SD pixels as a prediction tap to the predictive arithmetic circuit 220. That is, the prediction tap generation circuit 216 extracts from the SD image a class tap consisting of the same pixels as the class tap extracted by the classification circuit 214, and supplies the extracted class tap to the predictive arithmetic circuit 220.

The predictive arithmetic circuit 220 performs arithmetic operation of the equation (1) using the predictive coefficients $w_1, w_2, \ldots$ from the coefficient ROM 219 and the prediction taps $x_1, x_2, \ldots$ from the prediction tap generation circuit 216, thereby finding the prediction value $E[y]$ of the noted pixel y, and outputs the prediction value $E[y]$ as the pixel value of the HD pixel.

Then, similar processing is performed on the other HD pixels as noted pixels. Thus, the SD image is converted to the HD image.

Figure 22:
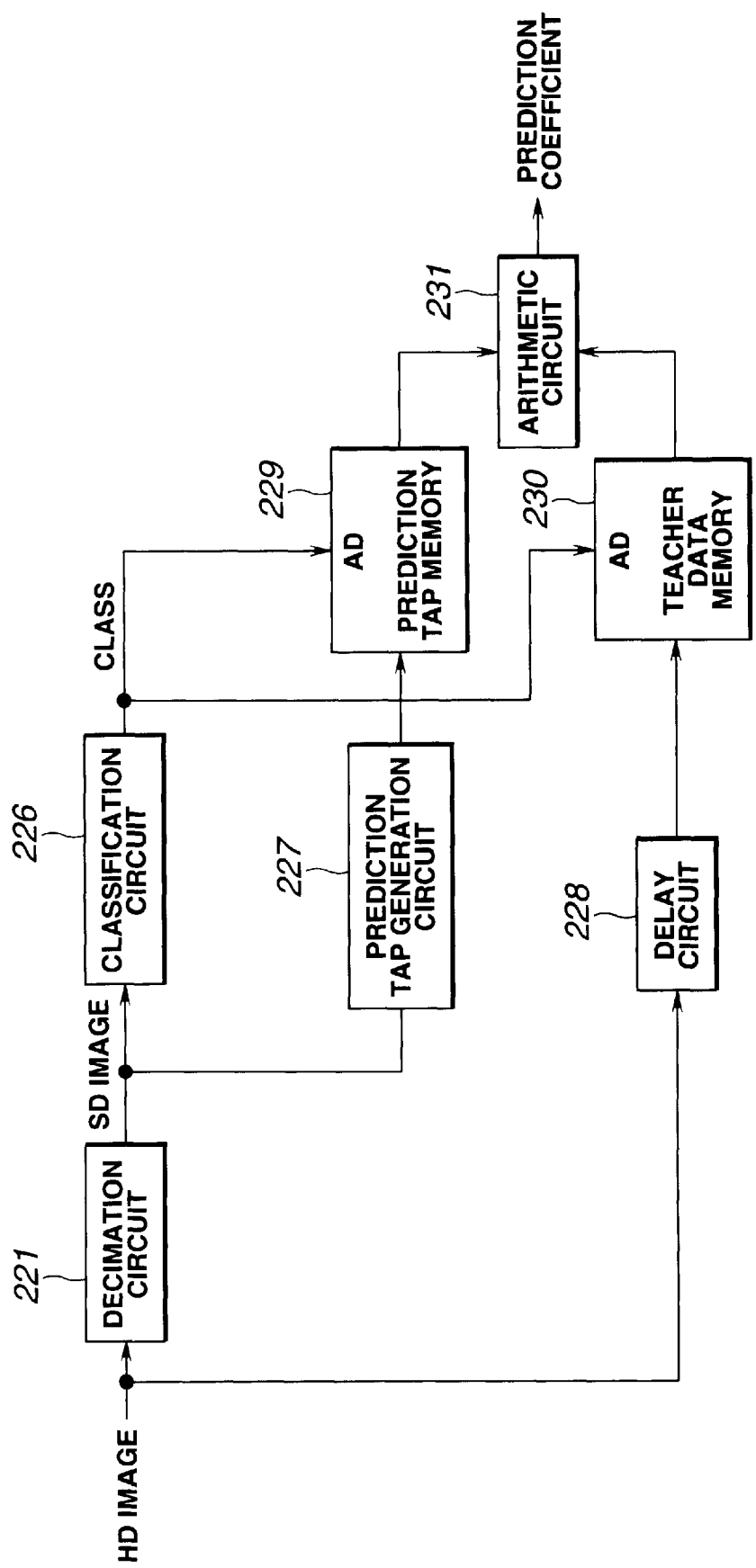
FIG. 22 is a block diagram showing an exemplary structure of a learning device.

FIG. 22 shows an exemplary structure of a learning device which carries out learning processing for calculating a prediction coefficient to be stored in the coefficient ROM 219 of FIG. 20.

In the learning device of FIG. 22, an HD image that is to be the teacher data y in learning is supplied to a decimation circuit 221 and a delay circuit 228.

The decimation circuit 221 decimates the number of pixels from the HD image so as to reduce the number of pixels, thereby generating an SD image. This SD image is supplied to a classification circuit 226 and a prediction tape generation circuit 227.

The classification circuit 226 performs processing similar to that of the classification circuit 214 of FIG. 20, and outputs the class of the noted pixel obtained by such processing. The prediction tap generation circuit 227 performs processing similar to that of the prediction tap generation circuit 216 of FIG. 20, and outputs the prediction tap of the noted pixel obtained by such processing.

The class outputted from the classification circuit 226 is supplied to address terminals (AD) of a prediction tap memory 229 and of a teacher data memory 230. The prediction tap outputted from the prediction tap generation circuit 227 is supplied to the prediction tap memory 229.

The prediction tap memory 229 stores the prediction tap supplied from the prediction tap generation circuit 227 at the address corresponding to the class supplied from the classification circuit 226.

Meanwhile, the delay circuit 228 delays the HD image by the time required for supplying the class corresponding to the noted pixel from the classification circuit 226 to the teacher data memory 230, and supplies only the pixel value of the HD pixel, which is the noted pixel, as the teacher data to the teacher data memory 230.

Then, the teacher data memory 230 stores the teacher data supplied from the delay circuit 228 at the address corresponding to the class supplied from the classification circuit 226.

Then, similar processing is repeated until all the HD pixels constituting all the HD images prepared for learning are used as noted pixels.

In the above-described manner, an SD pixel and an HD pixel in the same positional relation as the SD pixel indicated by ○ in FIG. 21 and the HD pixel indicated by × in FIG. 21, respectively, are stored as the learning data x and as the teacher data, at the same address in the prediction tap memory 229 and in the teacher data memory 230.

In the prediction tap memory 229 and the teacher data memory 230, a plurality of kinds of information can be stored at the same address. Thus, a plurality of learning data x and teacher data y classified into the same class can be stored at the same address.

After that, the arithmetic circuit 231 reads the prediction tap as the learning data and the pixel value of the HD pixel as the teacher data stored at the same address in the prediction tap memory 229 and in the teacher data memory 230, and uses these data to calculate the prediction coefficient which minimizes the error between the prediction value an the teacher data by the minimum square method. That is, the arithmetic circuit 231 forms the normal equation (7) for each class and solves it to find the prediction coefficient.

In the coefficient ROM 219 of FIG. 20, the prediction coefficient for each class thus found by the arithmetic circuit 231 is stored at the address corresponding to the class.

In the above-described learning processing, a required number of normal equations for finding the prediction coefficient cannot be obtained for some classes. With respect to such classes, a prediction coefficient obtained by forming and solving normal equations while ignoring the class is used as a default prediction coefficient.

The DRAM chip of FIG. 14 can be applied to the classification adaptive processing circuit of FIG. 20 for detecting the class tap and prediction tap from the image so as to carry out processing, or to the learning device of FIG. 21.

In the case where a rearrangement device for rearranging the order of pixels constituting an image is constituted by using the DRAM chip of FIG. 14, its structure is similar to that of the shuffling device of FIG. 10 and therefore will not be described further in detail.

In the DRAM chip of FIG. 14, the arrangement of pixels continuously inputted in the horizontal direction is changed to the arrangement of vertically continuous pixels, by rotating each row rightward by pixels corresponding to the number of rows minus one, then writing to the memory cell array 5 in accordance with the decoding result of the column decoder 3C, then reading the pixels from the memory cell array 5 in accordance with the decoding result of the column decoder 103C, and backwardly rotating the arrangement of the pixels in the direction opposite to that for writing. However, the arrangement of pixels continuously inputted in the horizontal direction can also be changed to the arrangement of vertically continuous pixels by using methods other than the rotation method described with reference to FIG. 14 and the column address decoding method. Also, the arrangement of pixels continuously inputted in the horizontal direction can be changed to the arrangement of vertically continuous pixels by modifying the rotation method or the column address decoding method.

Figure 23:
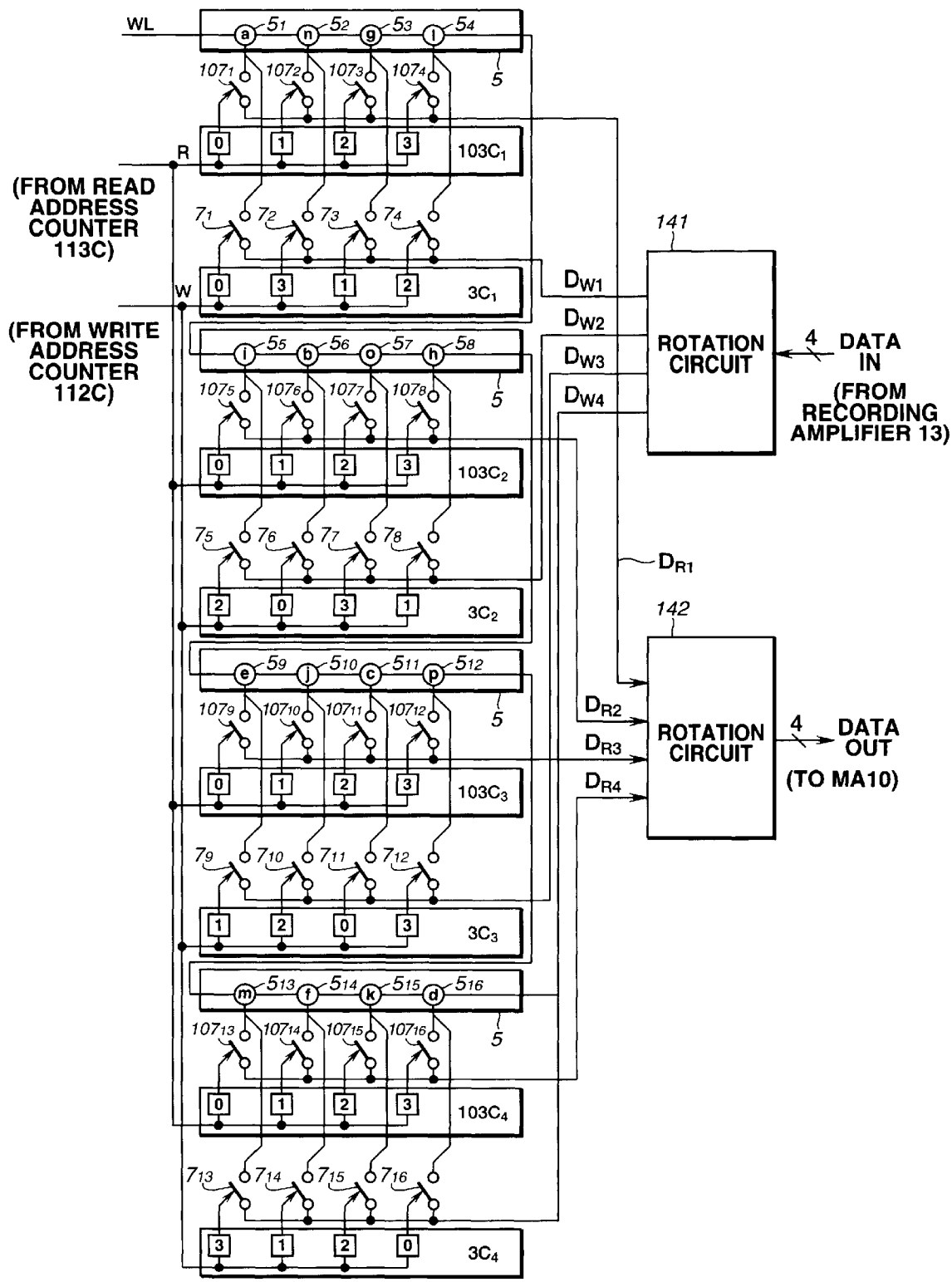
FIG. 23 is a block diagram showing an exemplary structure of a second embodiment of a DRAM chip to which the present invention is applied.

Specifically, for example, as shown in FIG. 23, the column decoder $3C_1$ turns on the column switches $7_1$ to $7_4$ to connect the write bus $D_{W1}$ and memory cells $5_1$ to $5_4$ of the memory cell array 5, only when 0, 3, 1, 2 is supplied as the column address W to the column decoder $3C_1$. The column decoder $3C_2$ turns on the column switches $7_5$ to $7_8$ to connect the write bus $D_{W2}$ and memory cells $5_5$ to $5_8$ of the memory cell array 5, only when 2, 0, 3, 1 is supplied as the column address W to the column decoder $3C_2$. The column decoder $3C_3$ turns on the column switches $7_9$ to $7_{12}$ to connect the write bus $D_{W3}$ and memory cells $5_9$ to $5_{12}$ of the memory cell array 5, only when 1, 2, 0, 3 is supplied as the column address W to the column decoder $3C_3$. The column decoder $3C_4$ turns on the column switches $7_{13}$ to $7_{16}$ to connect the write bus $D_{W4}$ and memory cells $5_{13}$ to $5_{16}$ of the memory cell array 5, only when 3, 1, 2, 0 is supplied as the column address W to the column decoder $3C_4$. In this case, the decoding results of the column decoders $103C_1$ to $103C_4$ are not changed.

Figure 24:
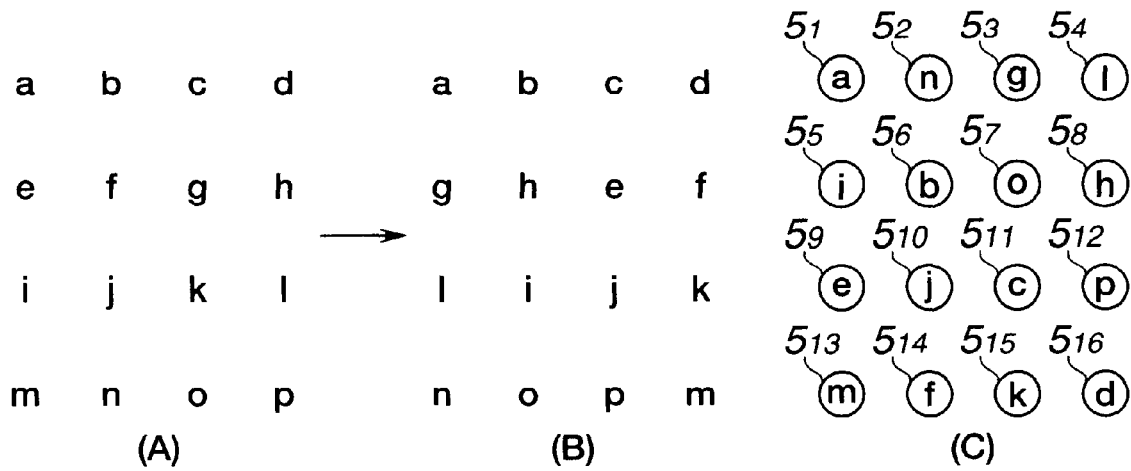
FIG. 24 is a view for explaining the processing of the DRAM chip of FIG. 23.

When an image consisting of 4×4 pixels, that is, pixels a, b, c, d in the first row, pixels e, f, g, h in the second row, pixels i, j, k, l in the third row and pixels m, n, o, p in the fourth row as shown in (A) of FIG. 24 similar to FIG. 15, is inputted to the rotation circuit 141 in the line scan order, the rotation circuit 141 rotates, for example, only the 0-th, 2nd, 1st and 3rd pixels in the first to fourth rows rightward and leftward. Therefore, as shown in (B) of FIG. 24, the arrangement of the pixels a, b, c, d in the first row is kept as it is. The arrangement of the pixels e, f, g, h in the second row is converted to the arrangement of the pixels g, h, e, f. The arrangement of the pixels i, j, k, l in the third row is converted to the arrangement of the pixels l, i, j, k. The arrangement of the pixels m, n, o, p in the fourth row is converted to the arrangement of the pixels n, o, p, m. Of the arrangement of the four pixels as the rotation result of each row, the leftmost pixel is outputted from the rotation circuit 141 to the write bus $D_{W1}$. The second pixel from the left is outputted to the write bus $D_{W2}$. The third pixel from the left is outputted to the write bus $D_{W3}$. The rightmost pixel is outputted to the write bus $D_{W4}$.

Meanwhile, the column switches $7_1$ to $7_4$ connected to the write bus $D_{W1}$, the column switches $7_5$ to $7_8$ connected to the write bus $D_{W2}$, the column switches $7_9$ to $7_{12}$ connected to the write bus $D_{W3}$, and the column switches $7_{13}$ to $7_{16}$ connected to the write bus $D_{W4}$ are controlled as described in FIG. 23, when 0, 1, 2, 3 is provided as the column address W. Therefore, the pixels a, n, g, l, i, b, o, h, e, j, c, p, m, f, k, d are stored in the memory cells $5_1$ to $5_{16}$ connected to the column switches $7_1$ to $7_{16}$, as shown in (C) of FIG. 24.

When 0 is provided as the column address R, the decoders $103C_1$ to $103C_4$ turn on the column switches $107_1$, $107_5$, $107_9$, $107_{13}$, respectively, similarly to the case of FIG. 14. Therefore, the pixels a, i, e, m stored in the memory cells $5_1$, $5_5$, $5_9$, $5_{13}$, of the memory cells $5_1$ to $5_{16}$ shown in (C) of FIG. 24, are outputted onto the read buses $D_{R1}$ to $D_{R4}$ through the column switches $107_1$, $107_5$, $107_9$, $107_{13}$, as shown in (D) of FIG. 24.

The pixels a, i, e, m on the read buses $D_{R1}$ to $D_{R4}$ are received by the rotation circuit 142, where the pixels are backwardly rotated leftward by 0 pixel and then outputted. That is, in this case, the arrangement of the pixels a, i, e, m is left as it is and outputted from the rotation circuit 142 as shown in (E) of FIG. 24. Therefore, by replacing the second pixel i from the left and the third pixel e from the left, of the pixels a, i, e, m, the arrangement of the pixels a, e, i, m in the first column of the image shown in (A) of FIG. 24 is obtained as shown in (F) of FIG. 24.

When 1 is provided as the column address R, the decoders $103C_1$ to $103C_4$ turn on the column switches $107_2$, $107_6$, $107_{10}$, $107_{14}$, respectively, similarly to the case of FIG. 14. Therefore, the pixels n, b, j, f stored in the memory cells $5_2$, $5_6$, $5_{10}$, $5_{14}$, of the memory cells $5_1$ to $5_{16}$ shown in (C) of FIG. 24, are outputted onto the read buses $D_{R1}$ to $D_{R4}$ through the column switches $107_2$, $107_6$, $107_{10}$, $107_{14}$, as shown in (G) of FIG. 24.

The pixels n, b, j, f on the read buses $D_{R1}$ to $D_{R4}$ are received by the rotation circuit 142, where the pixels are backwardly rotated leftward by one pixel and then outputted. That is, in this case, the arrangement of the pixels n, b, j, f is changed to the arrangement of the pixels b, j, f, n as shown in (H) of FIG. 24 and then outputted from the rotation circuit 142. Therefore, by replacing the second pixel j from the left and the third pixel f from the left, of the pixels b, j, f, n, the arrangement of the pixels b, f, j, n in the second column of the image shown in (A) of FIG. 24 is obtained as shown in (I) of FIG. 24.

When 2 is provided as the column address R, the decoders $103C_1$ to $103C_4$ turn on the column switches $107_3$, $107_7$, $107_{11}$, $107_{15}$, respectively, similarly to the case of FIG. 14. Therefore, the pixels g, o, c, k stored in the memory cells $5_3$, $5_7$, $5_{11}$, $5_{13}$, of the memory cells $5_1$ to $5_{16}$ shown in (C) of FIG. 24, are outputted onto the read buses $D_{R1}$ to $D_{R4}$ through the column switches $107_3$, $107_7$, $107_{11}$, $107_{15}$, as shown in (J) of FIG. 24.

The pixels g, o, c, k on the read buses $D_{R1}$ to $D_{R4}$ are received by the rotation circuit 142, where the pixels are backwardly rotated leftward by two pixels and then outputted. That is, in this case, the arrangement of the pixels g, o, c, k is changed to the arrangement of the pixels c, k, g, o as shown in (K) of FIG. 24 and then outputted from the rotation circuit 142. Therefore, by replacing the second pixel k from the left and the third pixel g from the left, of the pixels c, k, g, o, the arrangement of the pixels c, g, k, o in the third column of the image shown in (A) of FIG. 24 is obtained as shown in (L) of FIG. 24.

When 3 is provided as the column address R, the decoders $103C_1$ to $103C_4$ turn on the column switches $107_4$, $107_8$, $107_{12}$, $107_{16}$, respectively, similarly to the case of FIG. 14. Therefore, the pixels l, h, p, d stored in the memory cells $5_4$, $5_8$, $5_{12}$, $5_{16}$, of the memory cells $5_1$ to $5_{16}$ shown in (C) of FIG. 24, are outputted onto the read buses $D_{R1}$ to $D_{R4}$ through the column switches $107_4$, $107_9$, $107_{12}$, $107_{16}$, as shown in (M) of FIG. 24.

The pixels l, h, p, d on the read buses $D_{R1}$ to $D_{R4}$ are received by the rotation circuit 142, where the pixels are backwardly rotated leftward by three pixels and then outputted. That is, in this case, the arrangement of the pixels l, h, p, d is changed to the arrangement of the pixels d, l, h, p as shown in (N) of FIG. 24 and then outputted from the rotation circuit 142. Therefore, by replacing the second pixel l from the left and the third pixel h from the left, of the pixels d, l, h, p, the arrangement of the pixels d, h, l, p in the fourth column of the image shown in (A) of FIG. 24 is obtained as shown in (O) of FIG. 24.

As described above, in the DRAM chip of FIG. 23, similarly to the DRAM chip of FIG. 14, the arrangement of the pixels a, b, c, d, e, f, g, h, i, j, k, l, m, n, o, p in the horizontal order can be changed to the arrangement of the pixels a, e, i, m, b, f, j, n, c, g, k, o, d, h, l, p in the vertical order.

Figure 25:
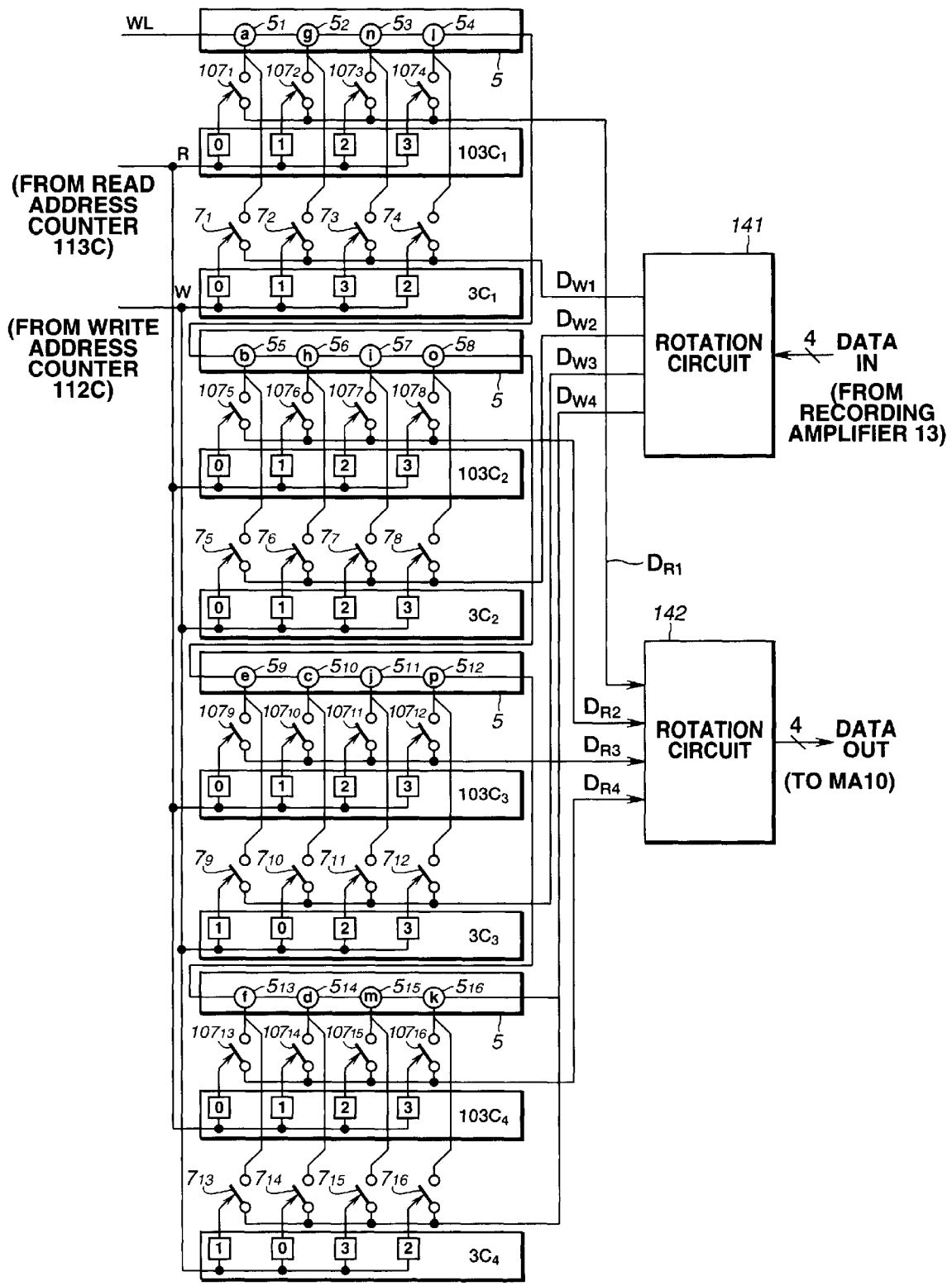
FIG. 25 is a block diagram showing an exemplary structure of a third embodiment of a DRAM chip to which the present invention is applied.

Next, as shown in FIG. 25, the column decoder $3C_1$ turns on the column switches $7_1$ to $7_4$ to connect the write bus $D_{W1}$, and memory cells $5_1$ to $5_4$ of the memory cell array 5, only when 0, 1, 3, 2 is supplied as the column address W to the column decoder $3C_1$. The column decoder $3C_2$ turns on the column switches $7_5$ to $7_8$ to connect the write bus $D_{W2}$ and memory cells $5_5$ to $5_8$ of the memory cell array 5, only when 0, 1, 2, 3 is supplied as the column address W to the column decoder $3C_2$. The column decoder $3C_3$ turns on the column switches $7_9$ to $7_{12}$ to connect the write bus $D_{W3}$ and memory cells $5_9$ to $5_{12}$ of the memory cell array 5, only when 1, 0, 2, 3 is supplied as the column address W to the column decoder $3C_3$. The column decoder $3C_4$ turns on the column switches $7_{13}$ to $7_{16}$ to connect the write bus $D_{W4}$ and memory cells $5_{13}$ to $5_{16}$ of the memory cell array 5, only when 1, 0, 3, 2 is supplied as the column address W to the column decoder $3C_4$. Also in this case, the decoding results of the column decoders $103C_1$ to $103C_4$ are not changed.

Figure 26:
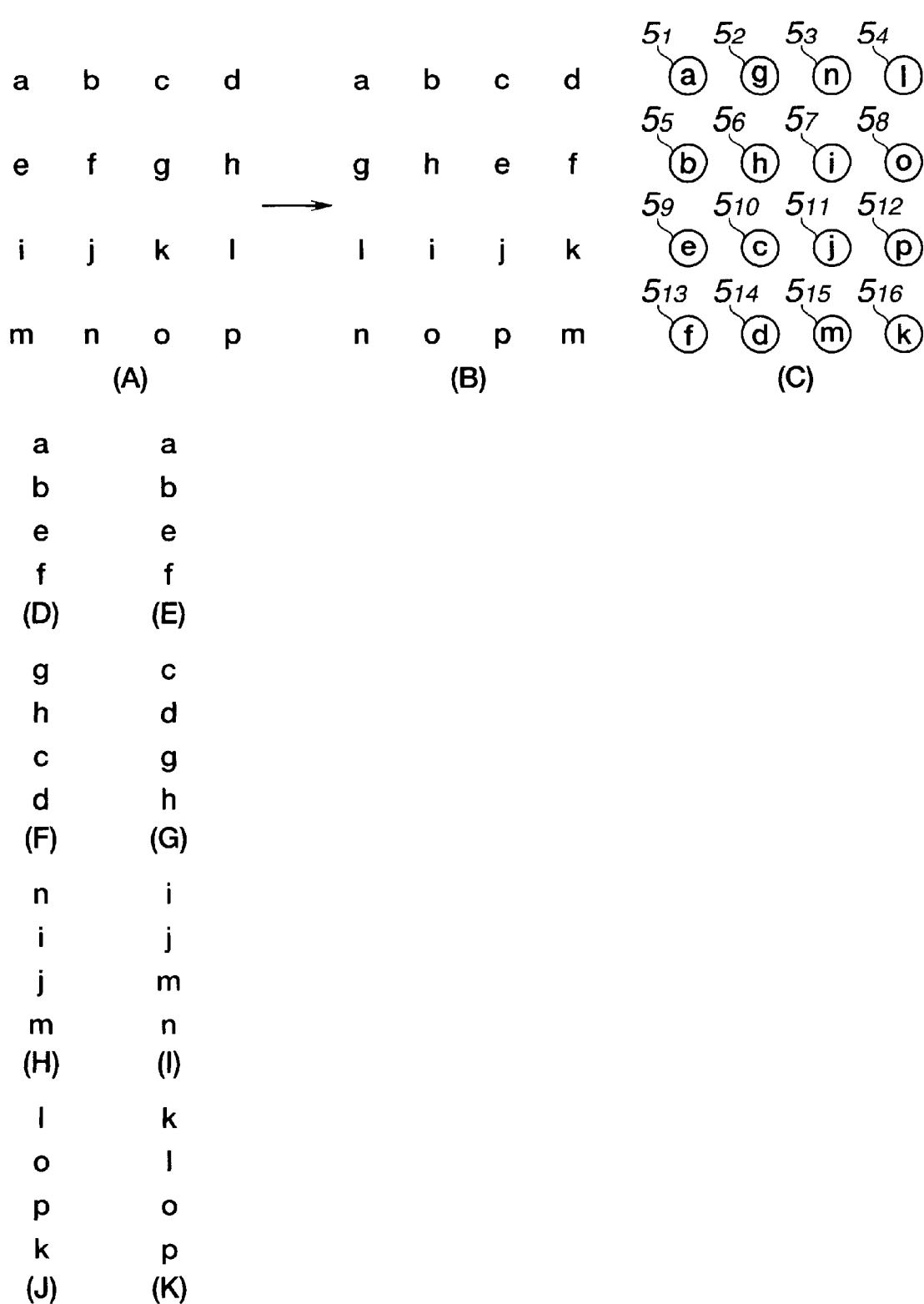
FIG. 26 is a view for explaining the processing of the DRAM chip of FIG. 25.

When an image consisting of 4×4 pixels, that is, pixels a, b, c, d in the first row, pixels e, f, g, h in the second row, pixels i, j, k, l in the third row and pixels in, n, o, p in the fourth row as shown in (A) of FIG. 26 similar to FIG. 15, is inputted to the rotation circuit 141 in the line scan order, the rotation circuit 141 rotates, for example, only the 0-th, 2nd, 1st and 3rd pixels in the first to fourth rows rightward and leftward. Therefore, as shown in (B) of FIG. 26 similar to (B) of FIG. 24, the arrangement of the pixels a, b, c, d in the first row is kept as it is. The arrangement of the pixels e, f, g, h in the second row is converted to the arrangement of the pixels g, h, e, f. The arrangement of the pixels i, j, k, l in the third row is converted to the arrangement of the pixels l, i, j, k. The arrangement of the pixels m, n, o, p in the fourth row is converted to the arrangement of the pixels n, o, p, m. Of the arrangement of the four pixels as the rotation result of each row, the leftmost pixel is outputted from the rotation circuit 141 to the write bus $D_{W1}$. The second pixel from the left is outputted to the write bus $D_{W2}$. The third pixel from the left is outputted to the write bus $D_{W3}$. The rightmost pixel is outputted to the write bus $D_{W4}$.

Meanwhile, the column switches $7_1$ to $7_4$ connected to the write bus $D_{W1}$ the column switches $7_5$ to $7_8$ connected to the write bus $D_{W2}$, the column switches $7_9$ to $7_{12}$ connected to the write bus $D_{W3}$, and the column switches $7_{13}$ to $7_{16}$ connected to the write bus $D_{W4}$ are controlled as described in FIG. 25, when 0, 1, 2, 3 is provided as the column address W. Therefore, the pixels a, g, n, l, b, h, i, o, e, c, j, p, f, d, m, k are stored in the memory cells $5_1$ to $5_{16}$ connected to the column switches $7_1$ to $7_{16}$, as shown in (C) of FIG. 26.

When 0 is provided as the column address R, the decoders $103C_1$ to $103C_4$ turn on the column switches $107_1$, $107_5$, $107_9$, $107_{13}$, respectively, similarly to the case of FIG. 14. Therefore, the pixels a, b, e, f stored in the memory cells $5_1$, $5_5$, $5_9$, $5_{13}$, of the memory cells $5_1$ to $5_{16}$ shown in (C) of FIG. 26, are outputted onto the read buses $D_{R1}$ to $D_{R4}$ through the column switches $107_1$, $107_5$, $107_9$, $107_{13}$, as shown in (D) of FIG. 26.

The pixels a, b, e, f on the read buses $D_{R1}$ to $D_{R4}$ are received by the rotation circuit 142, where the pixels are backwardly rotated leftward by 0 pixel and then outputted. That is, in this case, the arrangement of the pixels a, b, e, f is left as it is and outputted from the rotation circuit 142 as shown in (E) of FIG. 26.

When 1 is provided as the column address R, the decoders $103C_1$ to $103C_4$ turn on the column switches $107_2$, $107_6$, $107_{10}$, $107_{14}$, respectively, similarly to the case of FIG. 14. Therefore, the pixels g, h, c, d stored in the memory cells $5_2$, $5_6$, $5_{10}$, $5_{14}$, of the memory cells $5_1$ to $5_{16}$ shown in (C) of FIG. 26, are outputted onto the read buses $D_{R1}$ to $D_{R4}$ through the column switches $107_2$, $107_6$, $107_{10}$, $107_{14}$, as shown in (F) of FIG. 26.

The pixels g, h, c, d on the read buses $D_{R1}$ to $D_{R4}$ are received by the rotation circuit 142, where the pixels are backwardly rotated leftward by two pixels and then outputted. That is, in this case, the arrangement of the pixels g, h, c, d is changed to the arrangement of the pixels c, d, g, h as shown in (G) of FIG. 26 and then outputted from the rotation circuit 142.

When 2 is provided as the column address R, the decoders $103C_1$ to $103C_4$ turn on the column switches $107_3$, $107_7$, $107_{11}$, $107_{15}$, respectively, similarly to the case of FIG. 14. Therefore, the pixels n, i, j, m stored in the memory cells $5_3$, $5_7$, $5_{11}$, $5_{15}$, of the memory cells $5_1$ to $5_{16}$ shown in (C) of FIG. 26, are outputted onto the read buses $D_{R1}$ to $D_{R4}$ through the column switches $107_3$, $107_7$, $107_{11}$, $107_{15}$, as shown in (H) of FIG. 26.

The pixels n, i, j, m on the read buses $D_{R1}$ to $D_{R4}$ are received by the rotation circuit 142, where the pixels are backwardly rotated leftward by one pixel and then outputted. That is, in this case, the arrangement of the pixels n, i, j, m is changed to the arrangement of the pixels i, j, m, n as shown in (I) of FIG. 26 and then outputted from the rotation circuit 142.

When 3 is provided as the column address R, the decoders $103C_1$ to $103C_4$ turn on the column switches $107_4$, $107_8$, $107_{12}$, $107_{16}$, respectively, similarly to the case of FIG. 14. Therefore, the pixels l, o, p, k stored in the memory cells $5_4$, $5_8$, $5_{12}$, $5_{16}$, of the memory cells $5_1$ to $5_{16}$ shown in (C) of FIG. 26, are outputted onto the read buses $D_{R1}$ to $D_{R4}$ through the column switches $107_4$, $107_8$, $107_{12}$, $107_{16}$, as shown in (J) of FIG. 26.

The pixels l, o, p, k on the read buses $D_{R1}$ to $D_{R4}$ are received by the rotation circuit 142, where the pixels are backwardly rotated leftward by three pixels and then outputted. That is, in this case, the arrangement of the pixels l, o, p, k is changed to the arrangement of the pixels k, l, o, p as shown in (K) of FIG. 26 and then outputted from the rotation circuit 142.

Therefore, in the DRAM chip of FIG. 25, the arrangement of the pixels a, b, c, d, e, f, g, h, i, j, k, l, m, n, o, p is changed to the arrangement of the pixels obtained by scanning upper-left, upper-right, lower-left and lower-right blocks each consisting of 2×2 pixels, of the image shown in (A) of FIG. 26, in the line scan order. That is, the arrangement of the pixels a, b, e, f constituting the upper-left block of 2×2 pixels, the arrangement of the pixels c, d, g, h constituting the upper-right block of 2×2 pixels, the arrangement of the pixels i, j, m, n constituting the lower-left block of 2×2 pixels, and the arrangement of the pixels k, l, h, p constituting the lower-right block of 2×2 pixels are obtained.

Figure 27:
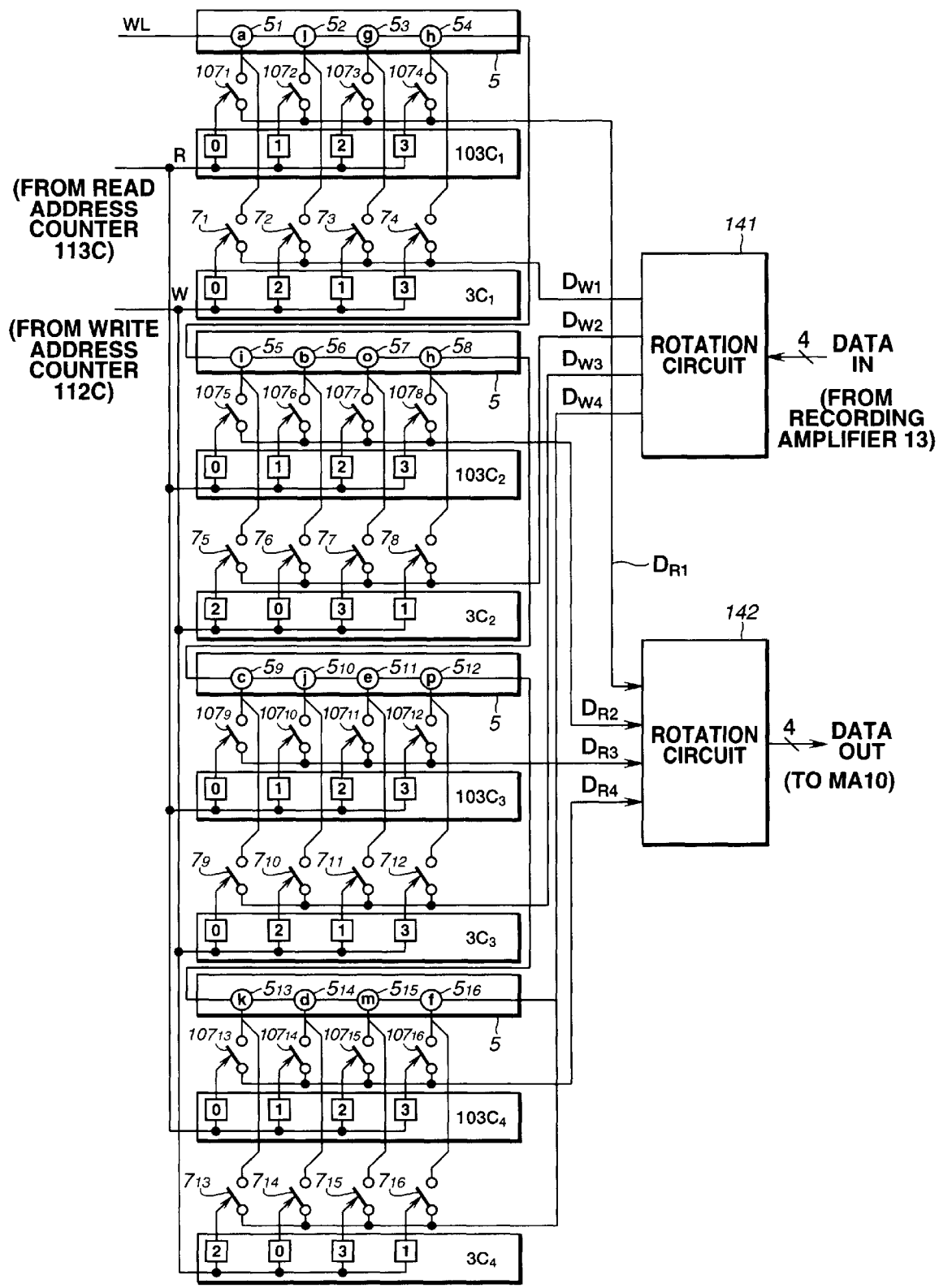
FIG. 27 is a block diagram showing an exemplary structure of a fourth embodiment of a DRAM chip to which the present invention is applied.

Next, for example, as shown in FIG. 27, the column decoder $3C_1$ turns on the column switches $7_1$ to $7_4$ to connect the write bus $D_{W1}$ and memory cells $5_1$ to $5_4$ of the memory cell array 5, only when 0, 2, 1, 3 is supplied as the column address W to the column decoder $3C_1$. The column decoder $3C_2$ turns on the column switches $7_5$ to $7_8$ to connect the write bus $D_{W2}$ and memory cells $5_5$ to $5_8$ of the memory cell array 5, only when 2, 0, 3, 1 is supplied as the column address W to the column decoder $3C_2$. The column decoder $3C_3$ turns on the column switches $7_9$ to $7_{12}$ to connect the write bus $D_{W3}$ and memory cells $5_9$ to $5_{12}$ of the memory cell array 5, only when 0, 2, 1, 3 is supplied as the column address W to the column decoder $3C_3$. The column decoder $3C_4$ turns on the column switches $7_{13}$ to $7_{16}$ to connect the write bus $D_{W4}$ and memory cells $5_{13}$ to $5_{16}$ of the memory cell array 5, only when 2, 0, 3, 1 is supplied as the column address W to the column decoder 3C₄. Also in this case, the decoding results of the column decoders 103C₁ to 103C₄ are not changed.

Figure 28:
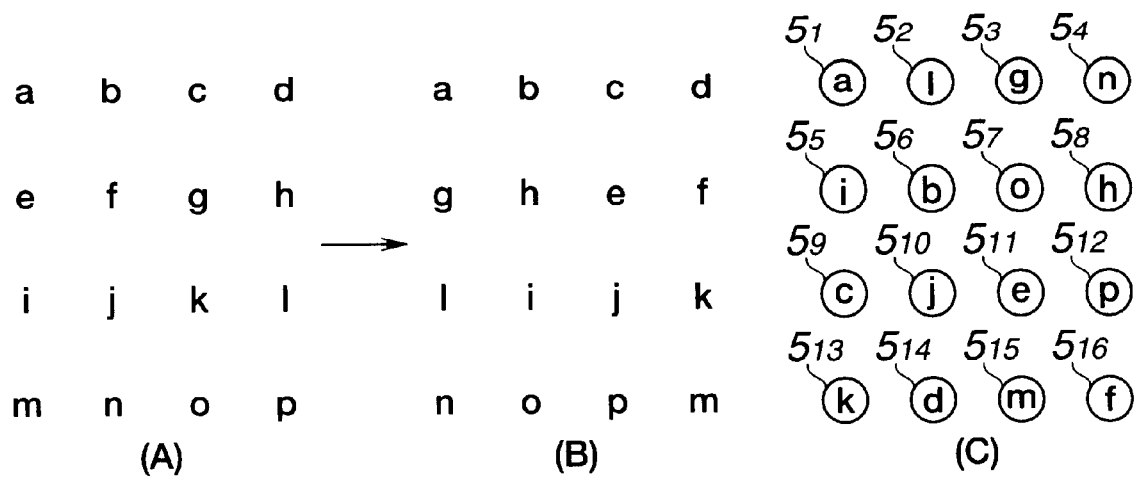
FIG. 28 is a view for explaining the processing of the DRAM chip of FIG. 27.

When an image consisting of 4×4 pixels, that is, pixels a, b, c, d in the first row, pixels e, f, g, h in the second row, pixels i, j, k, l in the third row and pixels m, n, o, p the fourth row as shown in (A) of FIG. 28 similar to FIG. 15, is inputted to the rotation circuit 141 in the line scan order, the rotation circuit 141 rotates, for example, only the 0-th, 2nd, 1st and 3rd pixels in the first to fourth rows rightward and leftward. Therefore, as shown in (B) of FIG. 28 similar to (B) of FIG. 24, the arrangement of the pixels a, b, c, d in the first row is kept as it is. The arrangement of the pixels e, f, g, h in the second row is converted to the arrangement of the pixels g, h, e, f. The arrangement of the pixels i, j, k, l in the third row is converted to the arrangement of the pixels l, i, j, k. The arrangement of the pixels m, n, o, p in the fourth row is converted to the arrangement of the pixels n, o, p, m. Of the arrangement of the four pixels as the rotation result of each row, the leftmost pixel is outputted from the rotation circuit 141 to the write bus $D_{W1}$. The second pixel from the left is outputted to the write bus $D_{W2}$. The third pixel from the left is outputted to the write bus $D_{W3}$. The rightmost pixel is outputted to the write bus $D_{W4}$.

Meanwhile, the column switches $7_1$ to $7_4$ connected to the write bus $D_{W1}$, the column switches $7_5$ to $7_8$ connected to the write bus $D_{W2}$, the column switches $7_9$ to $7_{12}$ connected to the write bus $D_{W3}$, and the column switches $7_{13}$ to $7_{16}$ connected to the write bus $D_{W4}$ are controlled as described in FIG. 27, when 0, 1, 2, 3 is provided as the column address W. Therefore, the pixels a, l, g, n, i, b, o, h, c, j, e, p, k, d, m, f are stored in the memory cells $5_1$ to $5_{16}$ connected to the column switches $7_1$ to $7_{16}$, as shown in (C) of FIG. 28.

When 0 is provided as the column address R, the decoders 103C₁ to 103C₄ turn on the column switches $107_1$, $107_5$, $107_9$, $107_{13}$, respectively, similarly to the case of FIG. 14. Therefore, the pixels a, i, c, k stored in the memory cells $5_1$, $5_5$, $5_9$, $5_{13}$, of the memory cells $5_1$ to $5_{16}$ shown in (C) of FIG. 28, are outputted onto the read buses $D_{R1}$ to $D_{R4}$ through the column switches $107_1$, $107_5$, $107_9$, $107_{13}$, as shown in (D) of FIG. 28.

The pixels a, i, c, k on the read buses $D_{R1}$ to $D_{R4}$ are received by the rotation circuit 142, where the pixels are backwardly rotated leftward by 0 pixel and then outputted. That is, in this case, the arrangement of the pixels a, i, c, k is left as it is and outputted from the rotation circuit 142 as shown in (E) of FIG. 28. Therefore, by replacing the second pixel i from the left and the third pixel c from the left, of the pixels a, i, c, k, the arrangement of the pixels a, c, i, k as a result of decimation for every other pixel both horizontally and vertically with reference to the upper-left pixel a of the image shown in (A) of FIG. 28 is obtained as shown in (F) of FIG. 28.

When 1 is provided as the column address R, the decoders 103C₁ to 103C₄ turn on the column switches $107_2$, $107_6$, $107_{10}$, $107_{14}$, respectively, similarly to the case of FIG. 14. Therefore, the pixels l, b, j, d stored in the memory cells $5_2$, $5_6$, $5_{10}$, $5_{14}$, of the memory cells $5_1$ to $5_{16}$ shown in (C) of FIG. 28, are outputted onto the read buses $D_{R1}$ to $D_{R4}$ through the column switches $107_2$, $107_6$, $107_{10}$, $107_{14}$, as shown in (G) of FIG. 28.

The pixels l, b, j, d on the read buses $D_{R1}$ to $D_{R4}$ are received by the rotation circuit 142, where the pixels are backwardly rotated leftward by one pixel and then outputted. That is, in this case, the arrangement of the pixels l, b, j, d is changed to the arrangement of the pixels b, j, d, l as shown in (H) of FIG. 28 and then outputted from the rotation circuit 142. Therefore, by replacing the second pixel j from the left and the third pixel d from the left, of the pixels b, j, d, l, the arrangement of the pixels b, d, j, l as a result of decimation for every other pixel both horizontally and vertically with reference to the pixel b in the first row and the second column of the image shown in (A) of FIG. 28 is obtained as shown in (I) of FIG. 28.

When 2 is provided as the column address R, the decoders 103C₁ to 103C₄ turn on the column switches $107_3$, $107_7$, $107_{11}$, $107_{15}$, respectively, similarly to the case of FIG. 14. Therefore, the pixels g, o, e, m stored in the memory cells $5_3$, $5_7$, $5_{11}$, $5_{15}$, of the memory cells $5_1$ to $5_{16}$ shown in (C) of FIG. 28, are outputted onto the read buses $D_{R1}$ to $D_{R4}$ through the column switches $107_3$, $107_7$, $107_{11}$, $107_{15}$, as shown in (J) of FIG. 28.

The pixels g, o, e, m on the read buses $D_{R1}$ to $D_{R4}$ are received by the rotation circuit 142, where the pixels are backwardly rotated leftward by two pixels and then outputted. That is, in this case, the arrangement of the pixels g, o, e, m is changed to the arrangement of the pixels e, m, g, o as shown in (K) of FIG. 28 and then outputted from the rotation circuit 142. Therefore, by replacing the second pixel m from the left and the third pixel g from the left, of the pixels e, in, g, o, the arrangement of the pixels e, g, m, o as a result of decimation for every other pixel both horizontally and vertically with reference to the pixel e in the second row and the first column of the image shown in (A) of FIG. 28 is obtained as shown in (L) of FIG. 28.

When 3 is provided as the column address R, the decoders 103C₁ to 103C₄ turn on the column switches $107_4$, $107_8$, $107_{12}$, $107_{16}$, respectively, similarly to the case of FIG. 14. Therefore, the pixels n, h, p, f stored in the memory cells $5_4$, $5_8$, $5_{12}$, $5_{16}$, of the memory cells $5_1$ to $5_{16}$ shown in (C) of FIG. 28, are outputted onto the read buses $D_{R1}$ to $D_{R4}$ through the column switches $107_4$, $107_8$, $107_{12}$, $107_{16}$, as shown in (M) of FIG. 28.

The pixels n, h, p, f on the read buses $D_{R1}$ to $D_{R4}$ are received by the rotation circuit 142, where the pixels are backwardly rotated leftward by three pixels and then outputted. That is, in this case, the arrangement of the pixels n, h, p, f is changed to the arrangement of the pixels f, n, h, p as shown in (N) of FIG. 28 and then outputted from the rotation circuit 142. Therefore, by replacing the second pixel n from the left and the third pixel h from the left, of the pixels f, n, h, p, the arrangement of the pixels f, h, n, p as a result of decimation for every other pixel both horizontally and vertically with reference to the pixel f in the second row and the second column of the image shown in (A) of FIG. 28 is obtained as shown in (O) of FIG. 28.

As described above, in the DRAM chip of FIG. 27, the arrangement of the pixels a, b, c, d, e, f, g, h, i, j, k, l, m, n, o, p in the horizontal order can be changed to the arrangement of the pixels obtained by decimation for every other pixel.

Changing of decoding results of the column decoders 3C (3C₁ to 3C₄) can be easily realized by employing the same structure as the column decoder 131C of FIG. 11 for the column decoders 3C.

Figures 29A, 29B, 29C:
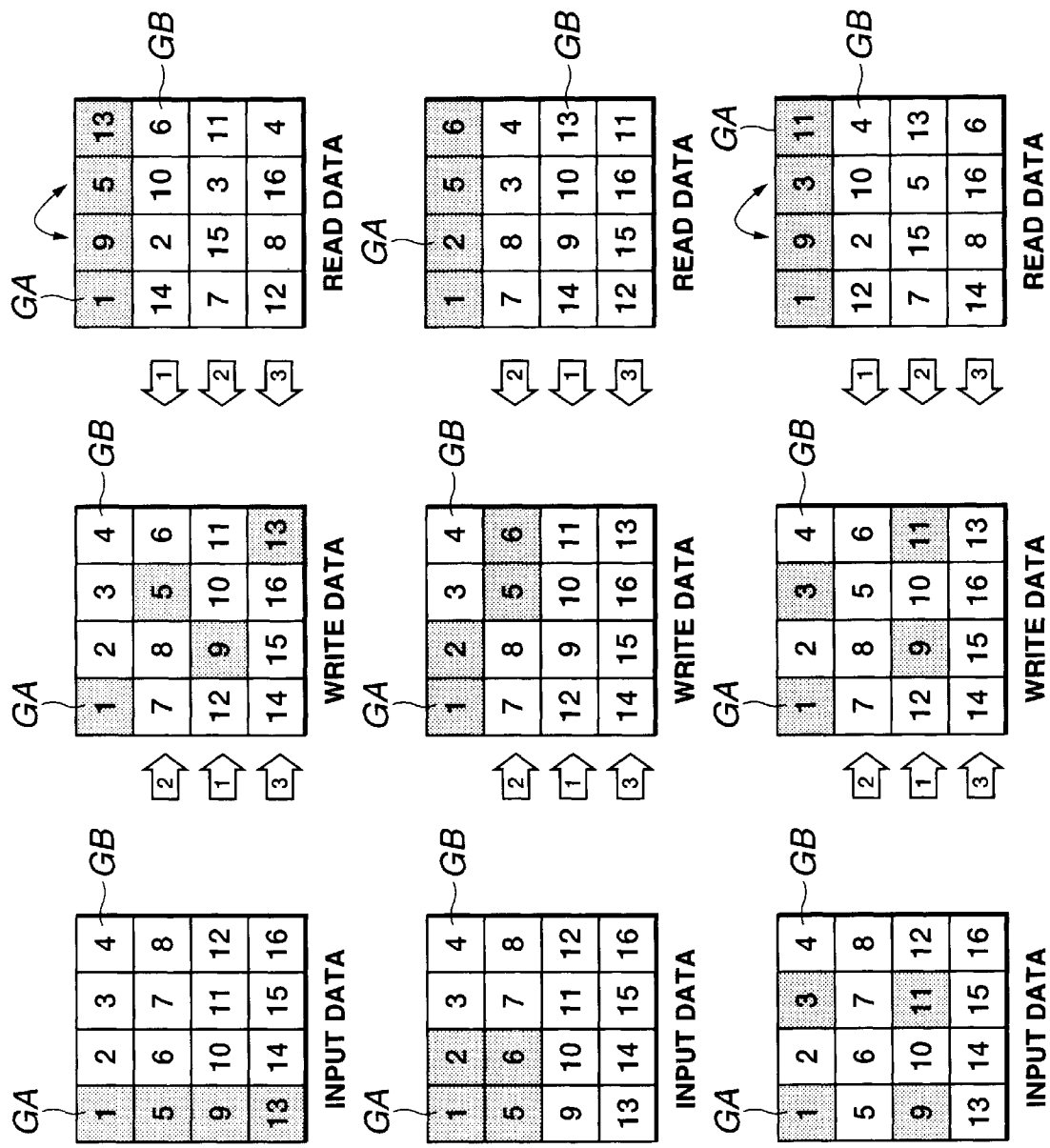
FIGS. 29A to 29C are views used for explaining applied examples of pixel rearrangement by a CAM and a DRAM.

FIGS. 29A to 29C show applied examples of rearrangement of pixels using the CAM and DRAM. In the examples of FIGs. 29A to 29C, how individual pixels indicated by GA in FIGS. 29A to 29C are rearranged by the pixel rearrangement in writing input data consisting of 4×4 pixels and then reading the data is explained. Pixels indicated by GB in FIGS. 29A to 29C will not be described in detail.

FIG. 29A shows an example of rearranging vertically arrayed pixels to horizontally arrayed pixels. In this example, of input data consisting of 4×4 pixels, the first, fifth, ninth and thirteenth pixels vertically arrayed in the first column at the left end are rearranged to the order of the first, ninth, fifth and thirteenth pixels horizontally arrayed in the first row. In the example of FIG. 29A, at the time of input data writing, these pixels are written in such a manner that the first pixel is kept as it is, the fifth pixel is shifted rightward by two pixels, the ninth pixel is shifted rightward by one pixel, and the thirteenth pixel is shifted rightward by three pixels. On the other hand, at the time of reading, these pixels are read in such a manner that the first pixel is kept as it is, the ninth pixel is shifted upward by two pixels, the fifth pixel is shifted upward by one pixel, and the thirteenth pixel is shifted upward by three pixels. Thus, of the input data consisting of 4×4 pixels, the first, fifth, ninth and thirteenth pixels vertically arrayed in the first column at the left end are rearranged to the order of the first, ninth, fifth and thirteenth pixels horizontally arrayed in the first row and then outputted.

FIG. 29B shows an example of rearranging individual pixels of a block unit consisting of 2×2 pixels to pixels horizontally arrayed in one row. In this example, of input data consisting of 4×4 pixels, the first, second, fifth and sixth pixels constituting a block of 2×2 pixels at the left end are rearranged to the order of the first, second, fifth and sixth pixels horizontally arrayed in the first row. In the example of FIG. 29B, at the time of input data writing, these pixels are written in such a manner that the first and second pixels are left unchanged and the fifth and sixth pixels are shifted rightward by two pixels. On the other hand, at the time of reading, these pixels are read in such a manner that the first and second pixels are left unchanged and the fifth and sixth pixels are shifted upward by one pixel. Thus, of the input data consisting of 4×4 pixels, the first, second, fifth and sixth pixels of the block of 2×2 pixels at the left end are rearranged to the order of the first, second, fifth and sixth pixels horizontally arrayed in the first row and then outputted.

FIG. 29C shows an example of rearranging pixels which are vertically and horizontally arrayed every other pixel to pixels horizontally arrayed in one row. In this example, of input data consisting of 4×4 pixels, the first, ninth, third and eleventh pixels which are vertically and horizontally arrayed every other pixel are rearranged to the order of the first, ninth, third and eleventh pixels horizontally arrayed in the first row. In the example of FIG. 29C, at the time of input data writing, these pixels are written in such a manner that the first and third pixels are left unchanged and the ninth and eleventh pixels are shifted rightward by two pixels. On the other hand, at the time of reading, these pixels are read in such a manner that the first and third pixels are left unchanged and the ninth and eleventh pixels are shifted upward by two pixels. Thus, of the input data consisting of 4×4 pixels, the first, third, ninth and eleventh pixels vertically and horizontally arrayed every other pixel are rearranged to the order of the first, third, ninth and eleventh pixels horizontally arrayed in the first row and then outputted.

Although the two column decoders 3C and 103C (or 131C) are provided in the present embodiment, it is also possible to provide three or more column decoders.

In addition, while, in the present embodiment, a memory cell is specified by two addresses, that is, the row address and the column address, it is also possible to specify a memory cell by three or more addresses (for example, addresses designating the row direction, column direction and time direction of pixels constituting an image).

Moreover, while pixels constituting an image are rearranged in the present embodiment, it is also possible to rearrange sample values obtained by sampling from sounds other than the image.

Also, while an image consisting of 4×4 pixels is used as a target of pixel rearrangement processing in the present embodiment, it is also possible to use an image other than the image consisting of 4×4 pixels, as a processing target. However, since all the memory cells for storing pixels constituting the image of the processing target basically need to be arranged on one word line, it is necessary to divide an image of a large number of pixels into blocks consisting of a number of pixels that can be stored in the memory cells on one word line and then to process the individual blocks in parallel.

Furthermore, though real-time property of the processing is not mentioned in the present embodiment, real-time processing is made possible by providing the memory cell array 5 with a storage capacity somewhat greater than one frame. Since the memory cell array 5 is constituted by DRAM memory cells as described above, the increase in the chip size due to the storage capacity of the memory cell array 5 which is somewhat greater than one frame is much less than the increase in the chip size due to the provision of a line memory constituted by an SRAM.

The pixel rearrangement as described above is possible even in the case where the decoding results of the column decoders 3C and 103C are switched, for example, in FIG. 14.

Industrial Applicability

As described above, according to the present invention, a first address is decoded and supplied to a storage section, and a second address is decoded and supplied to the storage section. Data to be written to the storage section are rotated and the rotation result is written to the storage section in accordance with the decoding results of the first and second addresses. Then, the second address is decoded to a decoding result that is different from the decoding result at the time of writing and then supplied to the storage section. The data stored in the storage section is read in accordance with the decoding results of the first and second addresses. The read data is rotated and outputted. Thus, it is possible to carry out quick rearrangement of pixels or the like constituting an image, while avoiding any increase in the size of the device.

Also, according to the present invention, since different results are generated by one of a plurality of second decoding sections for decoding the second address of the first and second addresses for designating a storage unit of the storage section and by another one, it is possible to carry out, for example, data shuffling at a high speed.

Moreover, according to the present invention, since the decoding result of one or more of a plurality of second decoding sections for decoding the second address of the first and second addresses for designating a storage unit of the storage section can be programmably changed, the decoding result can be easily changed. In addition, by generating different decoding results from one of the plurality of second decoding sections and from another one, it is possible to carry out data shuffling at a high speed.

What is claimed is:

1. A data processing device comprising:
   a first decoding section for decoding a first address;
   a plurality of second decoding sections for decoding a second address and
   a storage section having a plurality of storage units, one of which is specified by a pair comprising a decoding result of the first decoding section and a decoding result of one of the plurality of second decoding sections;

wherein a first decoding result, which is a decoding result of one of the plurality of decoding sections with respect to the second address, and a second decoding result, which is a decoding result of another one of the second decoding sections with respect to the same address as the second address, are different from each other in advance, and the first decoding result and the second decoding result are respectively used in different processes for the specified storage unit, and the different processes are performed simultaneously.

2. The data processing device as claimed in claim 1, wherein at least one of the plurality of second decoding sections is operable to change the decoding result with respect to the second address.

3. The data processing device as claimed in claim 1, wherein at least one of the plurality of second decoding sections is a content-addressable memory.

4. The data processing device as claimed in claim 1, further comprising:

a write control section for writing data to a storage unit of the storage section specified in accordance with the first decoding result; and a read control section for reading data from a storage unit of the storage section specified in accordance with the second decoding result.

5. The data processing device as claimed in claim 4, further comprising:

a first switching section for switching the order of the data of the first unit; and a second switching section for switching the order of the data of the second unit; and wherein the write control section writes the data outputted from the first switching section to the storage section on the basis of the first decoding result;

the read control section reads the data stored in the storage section on the basis of the second decoding result and supplying the data to the second switching section.

6. The data processing device as claimed in claim 5, wherein the first switching section switches the order of the data of the first unit by rotating the data of the first unit, and the second switching section switches the order of the second unit by rotating the data of the second unit.

7. The data processing device as claimed in claim 6, wherein the first unit and the second unit are equal to each other.

8. The data processing device as claimed in claim 6, wherein the first switching section and the second switching section have opposite rotating directions.

9. The data processing device as claimed in claim 6, wherein the data of the first unit is supplied to the first switching section as parallel data, and the data of the second unit is supplied from the second switching section as parallel data.

10. The data processing device as claimed in claim 1, wherein the data is image data.

11. The data processing device as claimed in claim 10, wherein the first address is a vertical address and the second address is a horizontal address.

12. The data processing device as claimed in claim 1, wherein the first decoding section, the plurality of second decoding sections and the storage section are provided within one semiconductor chip.

13. The data processing device as claimed in claim 1, wherein the plurality of second decoding sections are operable at the same time.

14. The data processing device as claimed in claim 1, wherein each of the plurality of the second decoding sections includes a plurality of decoders, and the plurality of decoders output the decoding result when a preset address and the second address coincide with each other.

15. A data order converting method comprising:

a first change step of sequentially changing the order of a plurality of data supplied every first unit;

a first decoding step of decoding a first address which is changed every time the order of the plurality of data of every first unit is changed;

a write step of writing the data to a storage position in a storage section determined on the basis of a decoding result of the first address;

a second decoding step of decoding a second address;

a read step of reading the data every second unit from a storage position in the storage section determined on the basis of a decoding result of the second address; and a second change step of changing the order of the data of every second unit read from the storage section every time the second address is decoded.

16. The data order converting method as claimed in claim 15, wherein the first change step includes switching of the order of the data of the first unit by rotating the data of the first unit, and the second change step includes switching of the data of the second unit by rotating the data of the second unit.

17. The data order converting method as claimed in claim 16, wherein the first unit and the second unit are equal to each other.

18. The data order converting method as claimed in claim 16, wherein the first change step and the second change step have opposite rotating directions.

19. The data order converting method as claimed in claim 16, wherein at the first change step, the data of the first unit is supplied as parallel data, and at the second change step, the data of the second unit is outputted as parallel data.

20. The data order converting method as claimed in claim 16, wherein the data is image data.

21. The data order converting method as claimed in claim 20, wherein the first address is a vertical address and the second address is a horizontal address.

* * * * *